(12) United States Patent
Park et al.

(10) Patent No.: US 10,998,694 B2
(45) Date of Patent: May 4, 2021

(54) LASER DIODE

(71) Applicant: LG INNOTEK CO., LTD., Seoul (KR)

(72) Inventors: Su Ik Park, Seoul (KR); Keon Hwa Lee, Seoul (KR); Yong Gyeong Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/608,051

(22) PCT Filed: May 18, 2018

(86) PCT No.: PCT/KR2018/005755
§ 371 (c)(1),
(2) Date: Oct. 24, 2019

(87) PCT Pub. No.: WO2018/212630
PCT Pub. Date: Nov. 22, 2018

(65) Prior Publication Data
US 2020/0194970 A1    Jun. 18, 2020

(30) Foreign Application Priority Data

May 19, 2017  (KR) ........................ 10-2017-0062132
May 19, 2017  (KR) ........................ 10-2017-0062140

(51) Int. Cl.
*H01S 5/042*  (2006.01)
*H01S 5/40*  (2006.01)
(Continued)

(52) U.S. Cl.
CPC ............ *H01S 5/0425* (2013.01); *H01L 33/02* (2013.01); *H01L 33/10* (2013.01); *H01S 5/4025* (2013.01); *H01L 25/167* (2013.01)

(58) Field of Classification Search
CPC ........ H01S 5/0425; H01S 5/4025; H01S 5/24; H01S 5/42; H01S 5/423; H01S 5/125;
(Continued)

(56) References Cited

U.S. PATENT DOCUMENTS 6,658,041 B2   12/2003  Uebbing
2015/0333230 A1   11/2015  Moon et al.
(Continued)

FOREIGN PATENT DOCUMENTS

CN    105098041 A    11/2015
CN    105637658 A    6/2016
(Continued)

*Primary Examiner* — Armando Rodriguez
(74) *Attorney, Agent, or Firm* — Birch, Stewart, Kolasch & Birch, LLP

(57) ABSTRACT

A laser diode according to an embodiment may include a substrate, a plurality of light emitting structures disposed on the substrate and including a first reflective layer and a second reflective layer, a first electrode electrically connected with the first reflective layer of the light emitting structure, a second electrode electrically connected with the second reflective layer of the light emitting structure, a first insulating layer disposed on the first electrode, a first bonding pad electrically connected with the first electrode and disposed on the substrate, and a second bonding pad electrically connected with the second electrode and disposed on the substrate.

20 Claims, 55 Drawing Sheets

(51) Int. Cl.
*H01L 33/02* (2010.01)
*H01L 33/10* (2010.01)
*H01L 25/16* (2006.01)

(58) Field of Classification Search
CPC ..... H01L 25/167; H01L 27/153; H01L 33/02; H01L 33/10; H01L 33/30; H01L 33/36; H01L 33/387
See application file for complete search history.

(56) References Cited

U.S. PATENT DOCUMENTS

| | | |
|---|---|---|
| 2016/0260869 A1 | 9/2016 | Jeon et al. |
| 2017/0070027 A1 | 3/2017 | Kondo et al. |
| 2017/0108173 A1 | 4/2017 | Kim et al. |
| 2017/0108937 A1 | 4/2017 | Kim et al. |
| 2018/0026163 A1 | 1/2018 | Seo et al. |
| 2018/0151778 A1 | 5/2018 | Park et al. |

FOREIGN PATENT DOCUMENTS

| | | |
|---|---|---|
| KR | 10-2012-0079327 A | 7/2012 |
| KR | 10-2015-0078296 A | 7/2015 |
| KR | 10-2016-0115301 A | 10/2016 |
| KR | 10-2016-0115868 A | 10/2016 |
| KR | 10-2017-0045067 A | 4/2017 |
| WO | WO 2014/087301 A1 | 6/2014 |
| WO | WO 2016/190664 A1 | 12/2016 |

[FIG. 1]
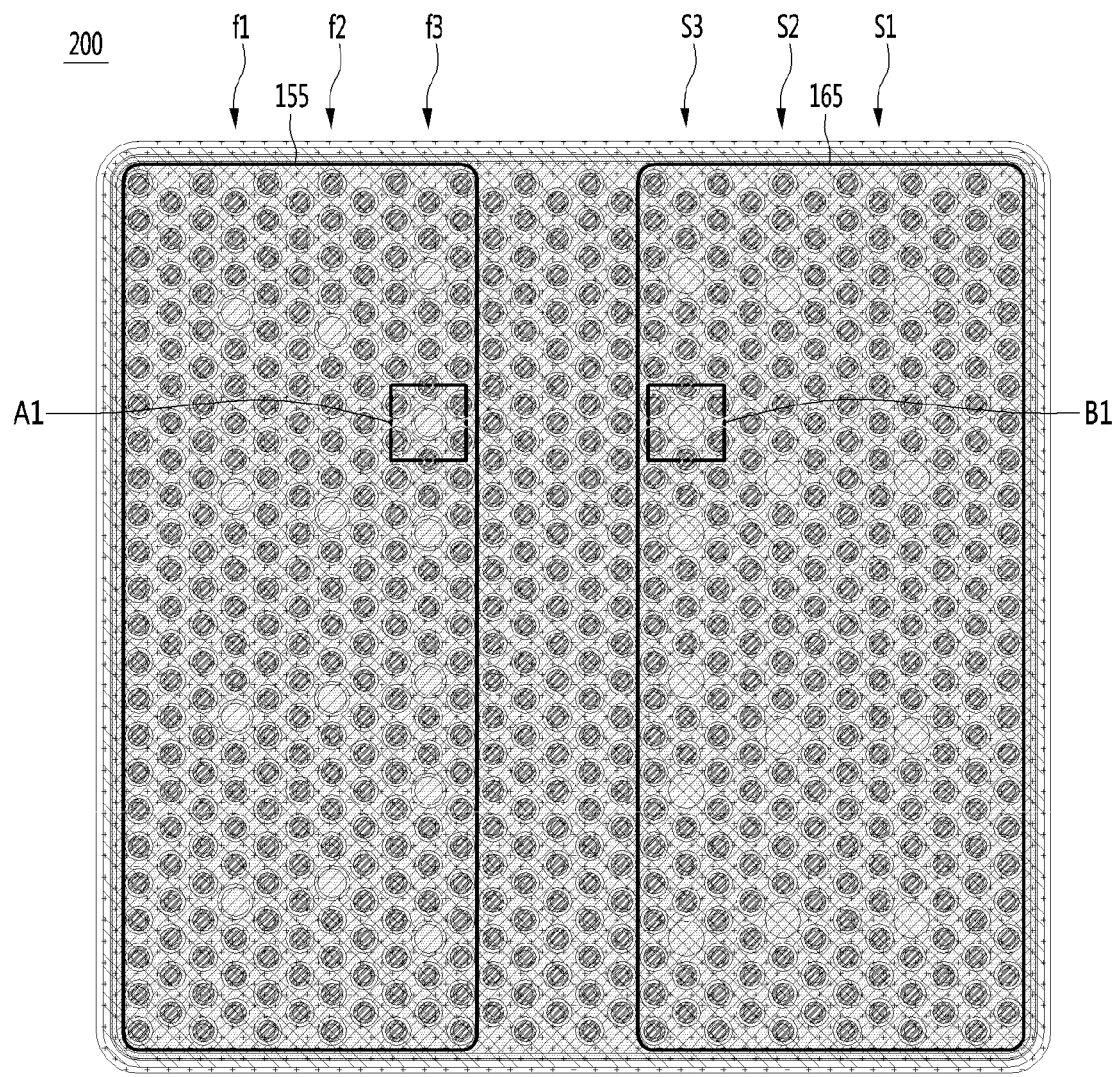

[FIG. 2]
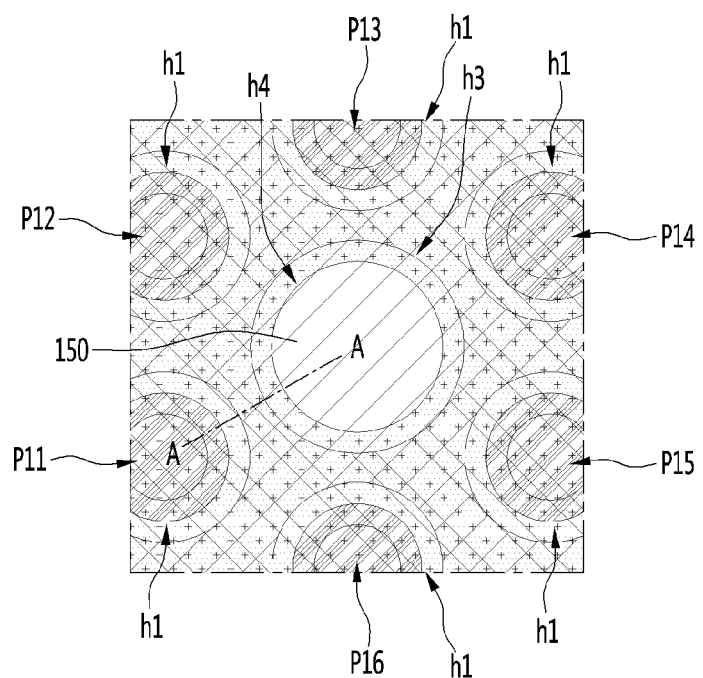

[FIG. 3]
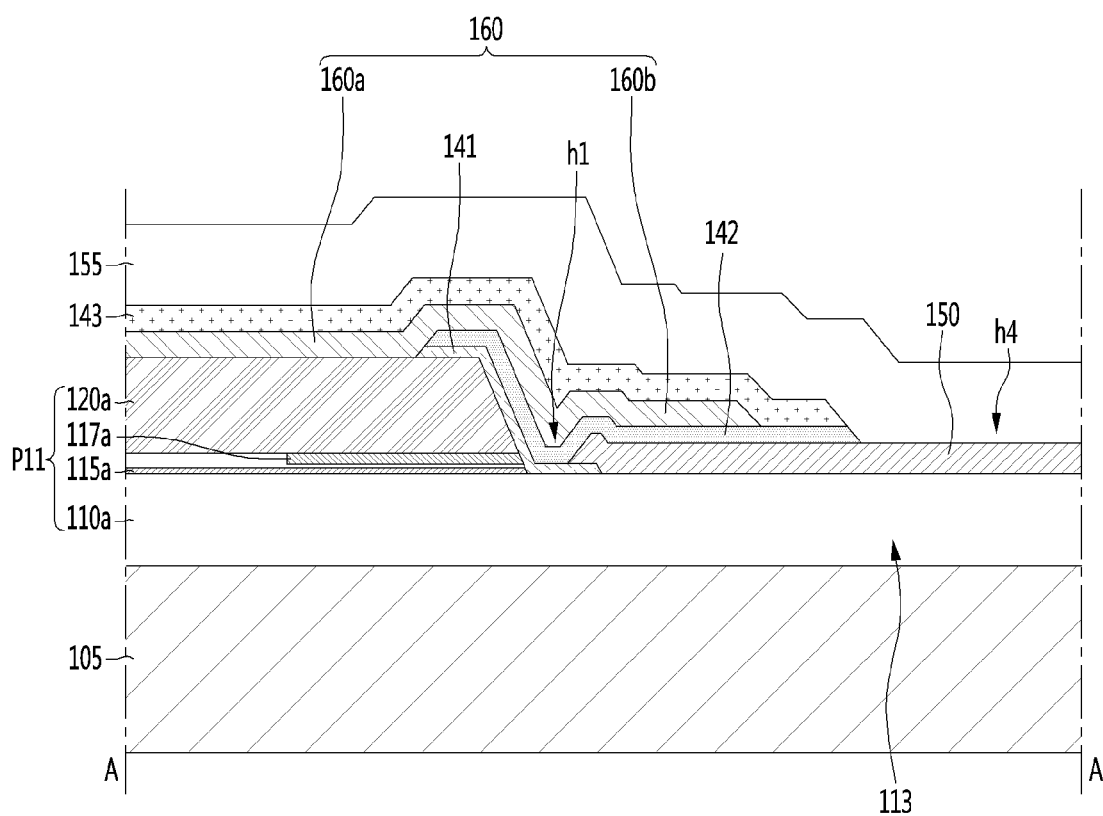

[FIG. 4]
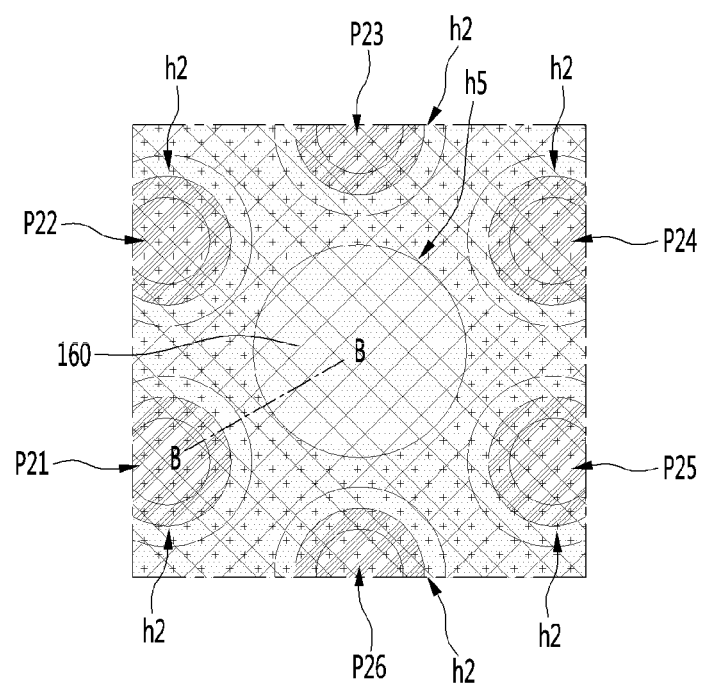

[FIG. 5]
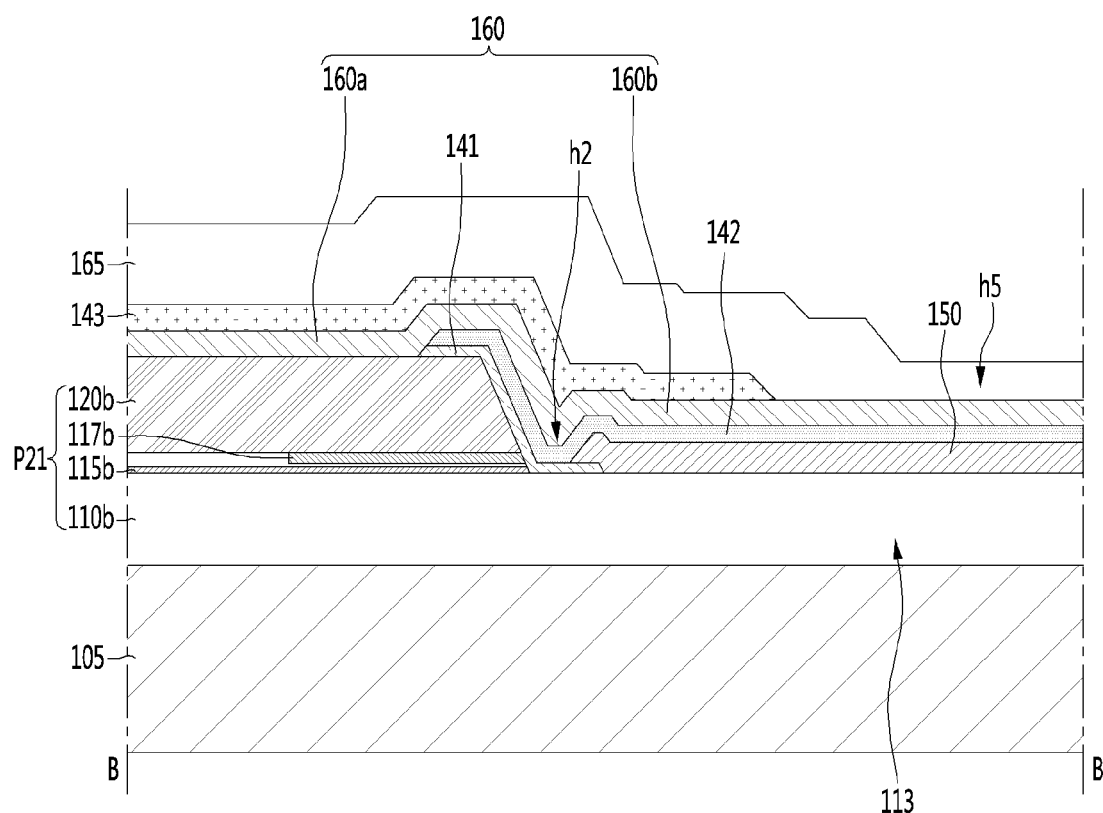

[FIG. 6]
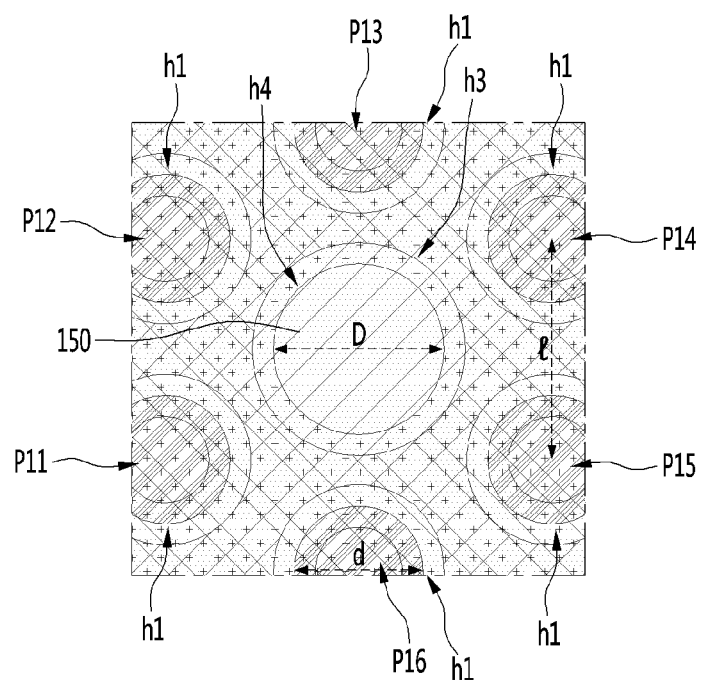

[FIG. 7]
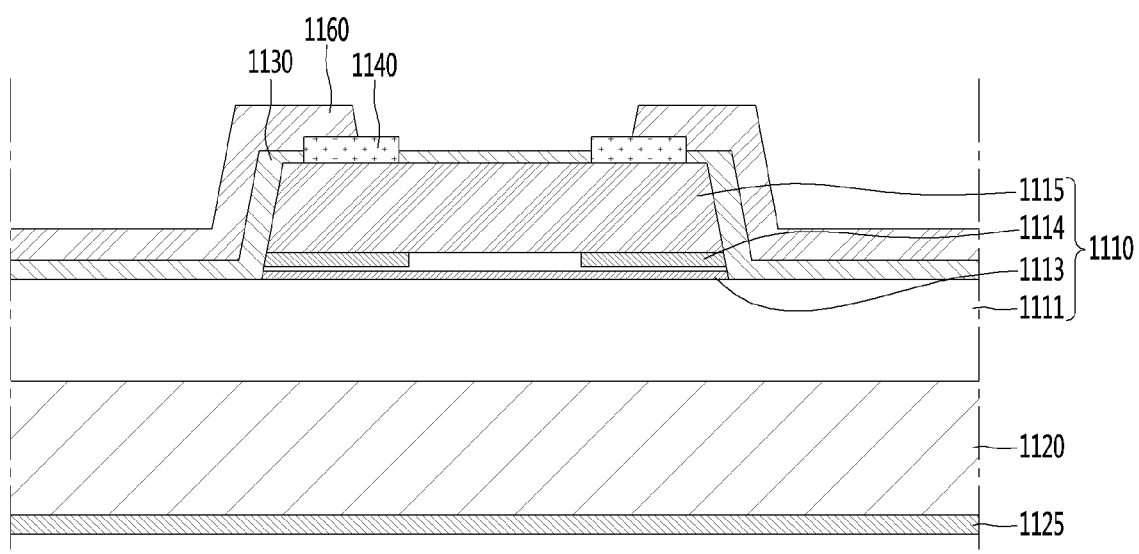

[FIG. 8a]
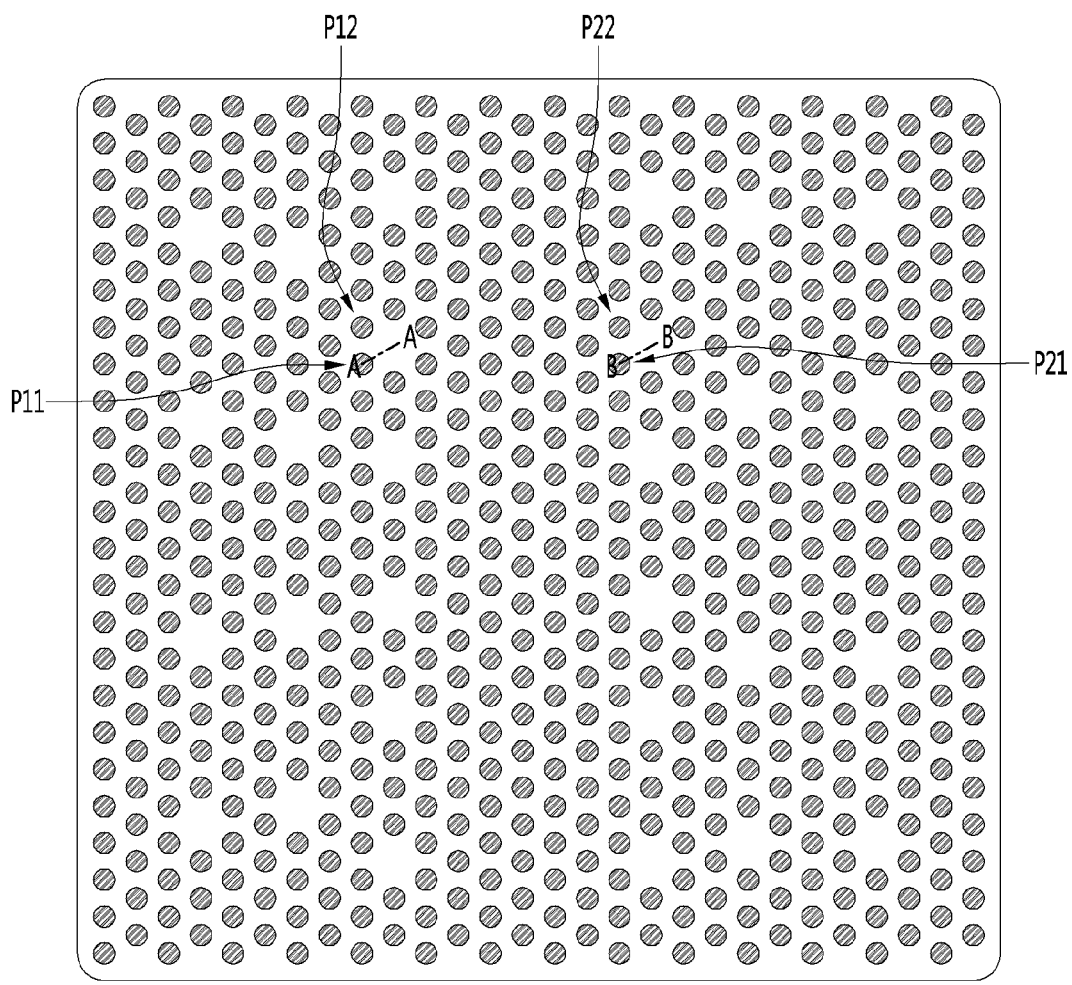

【FIG. 8b】
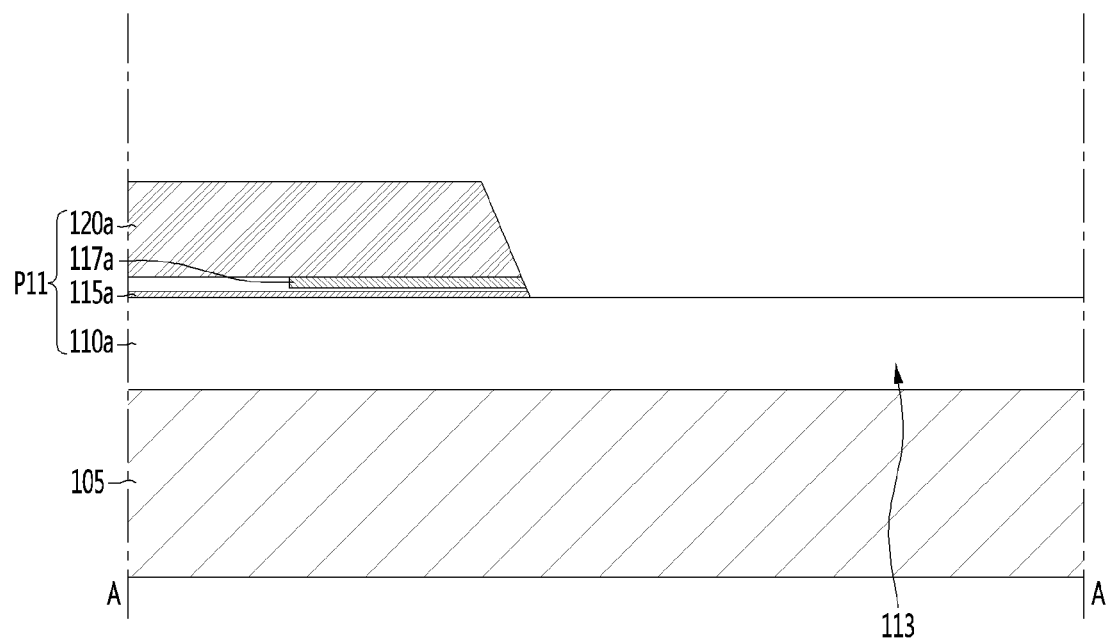

[FIG. 8c]
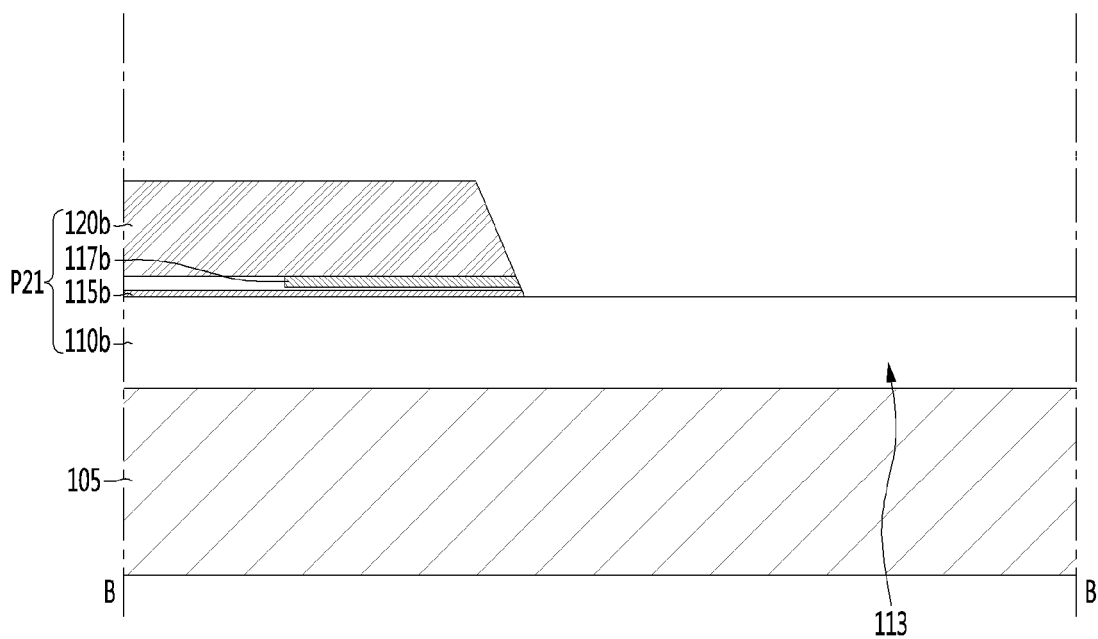

[FIG. 9a]
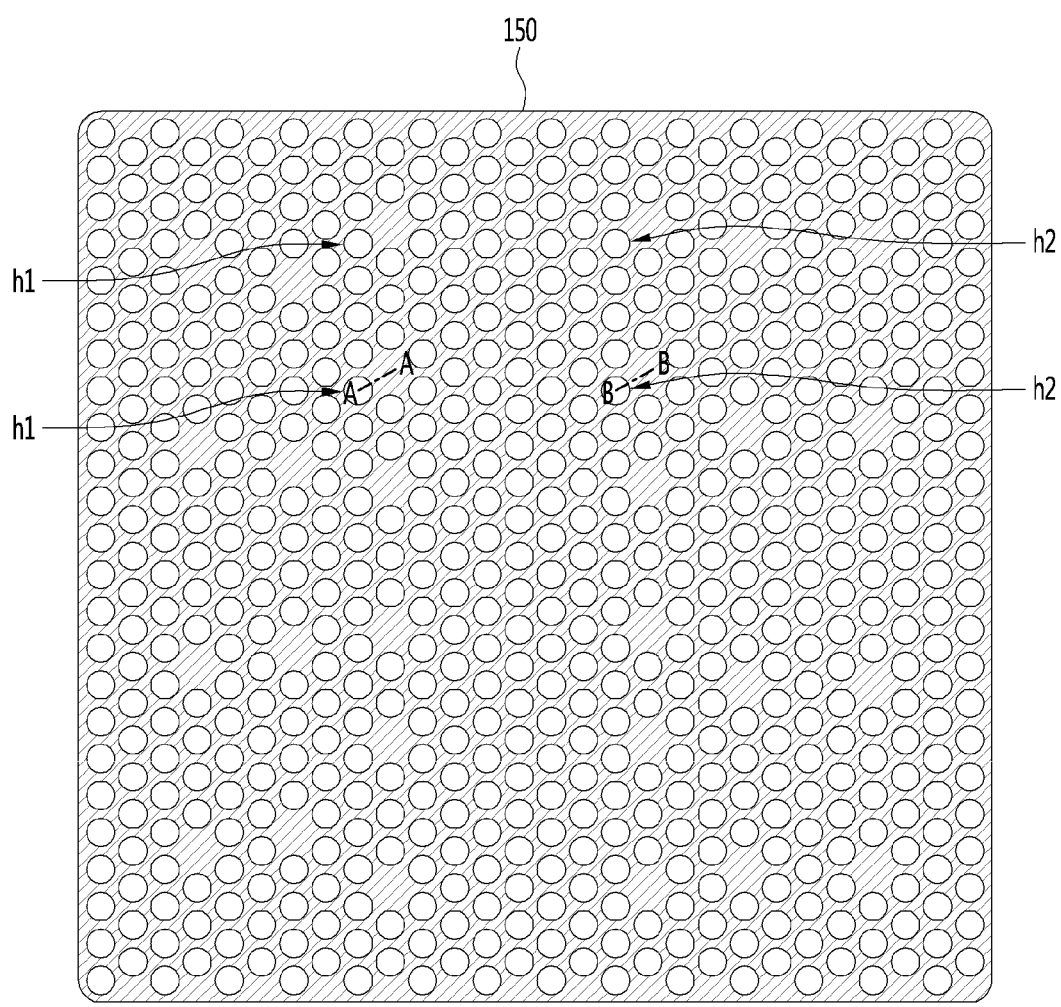

【FIG. 9b】
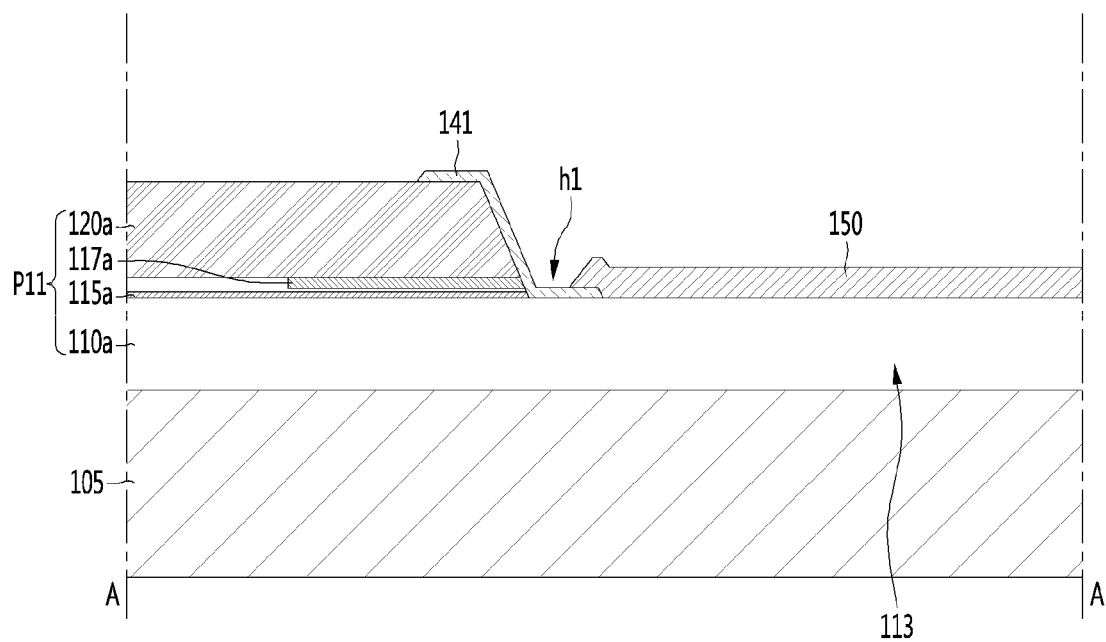

[FIG. 9c]
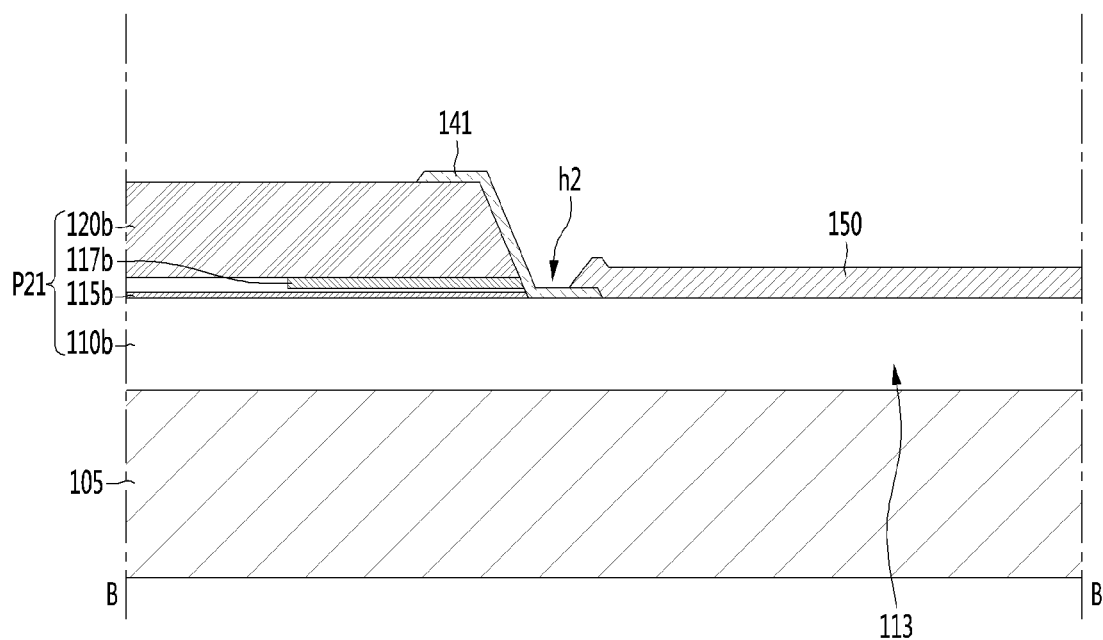

【FIG. 10a】
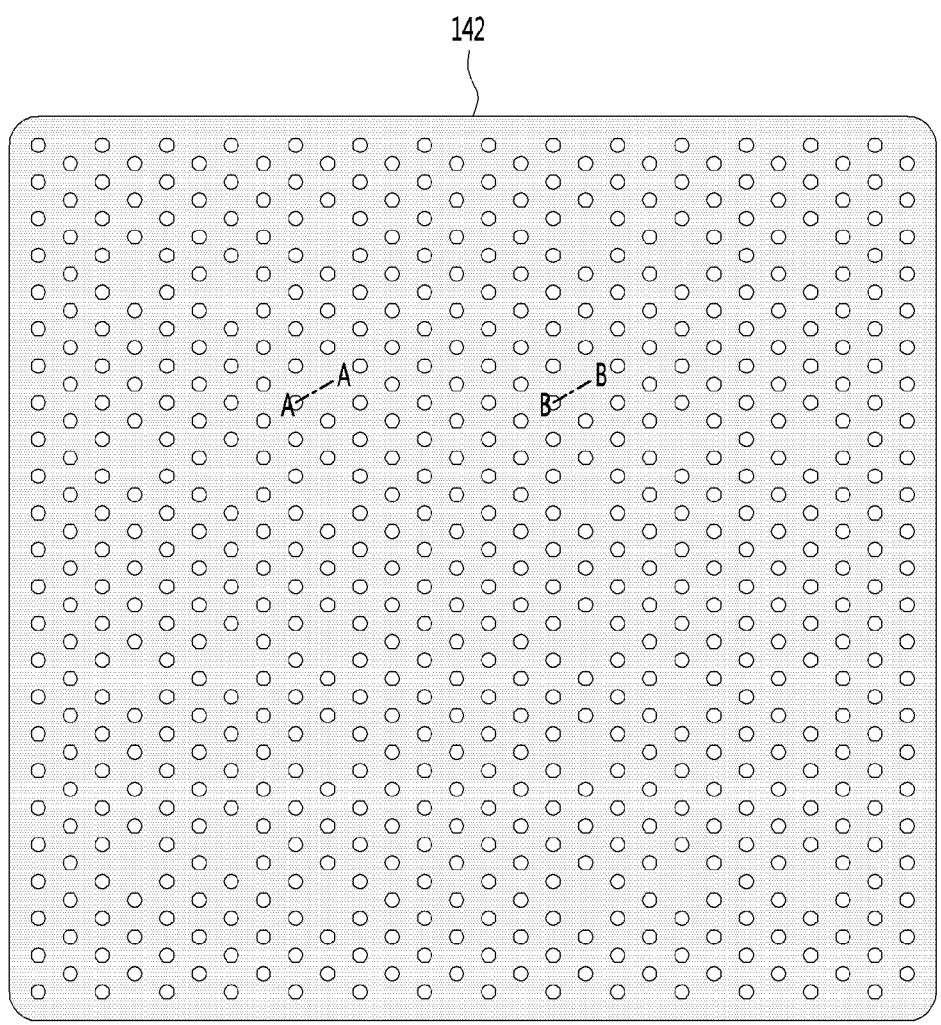

[FIG. 10b]
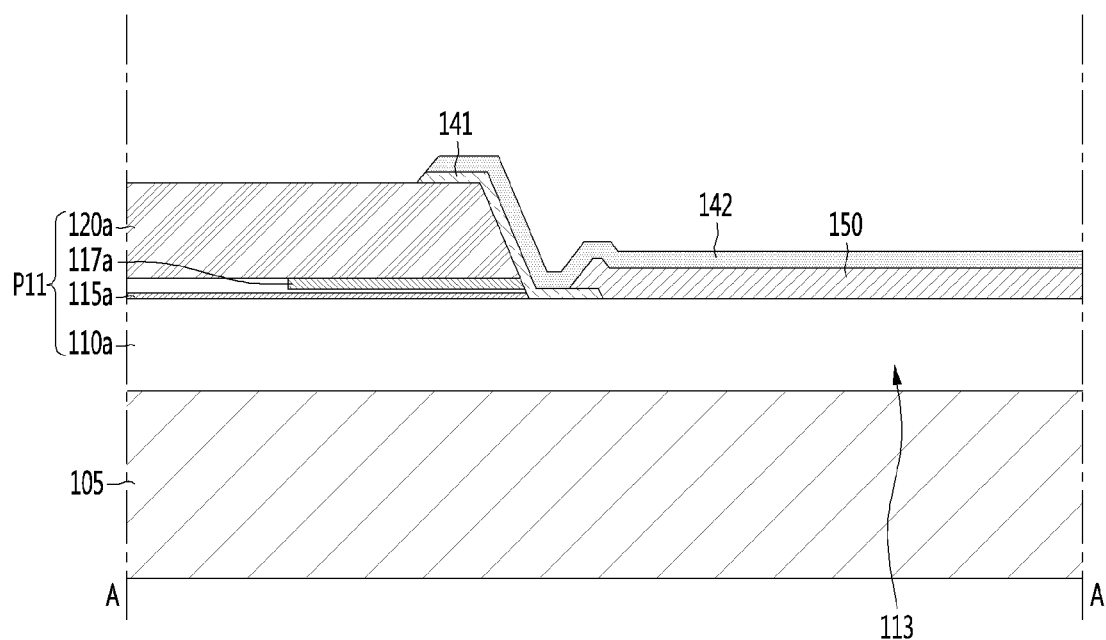

[FIG. 10c]
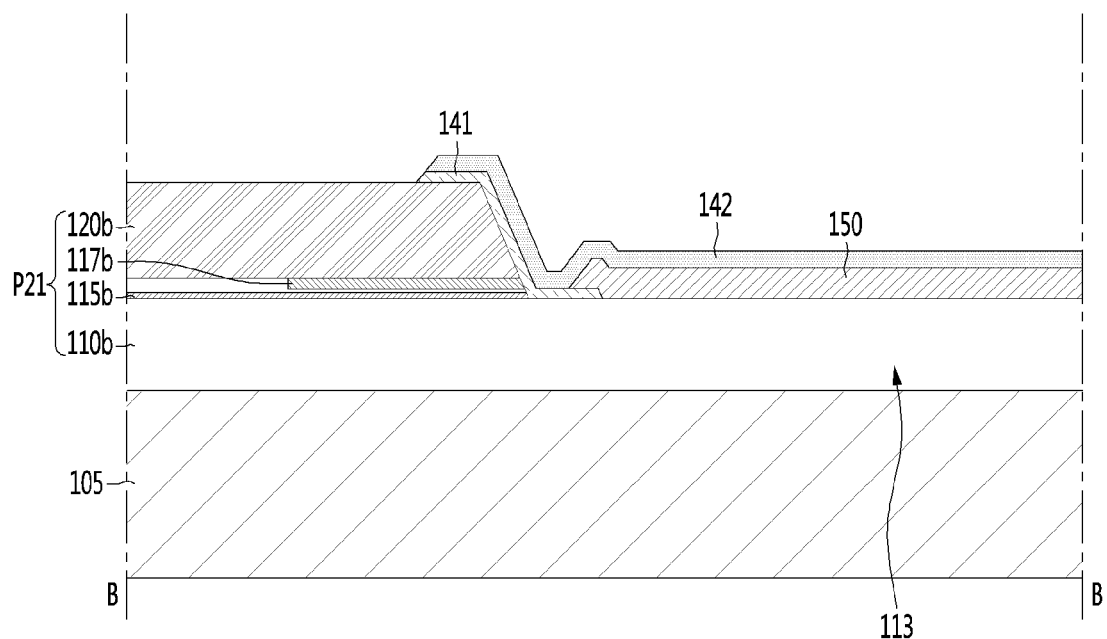

[FIG. 11a]
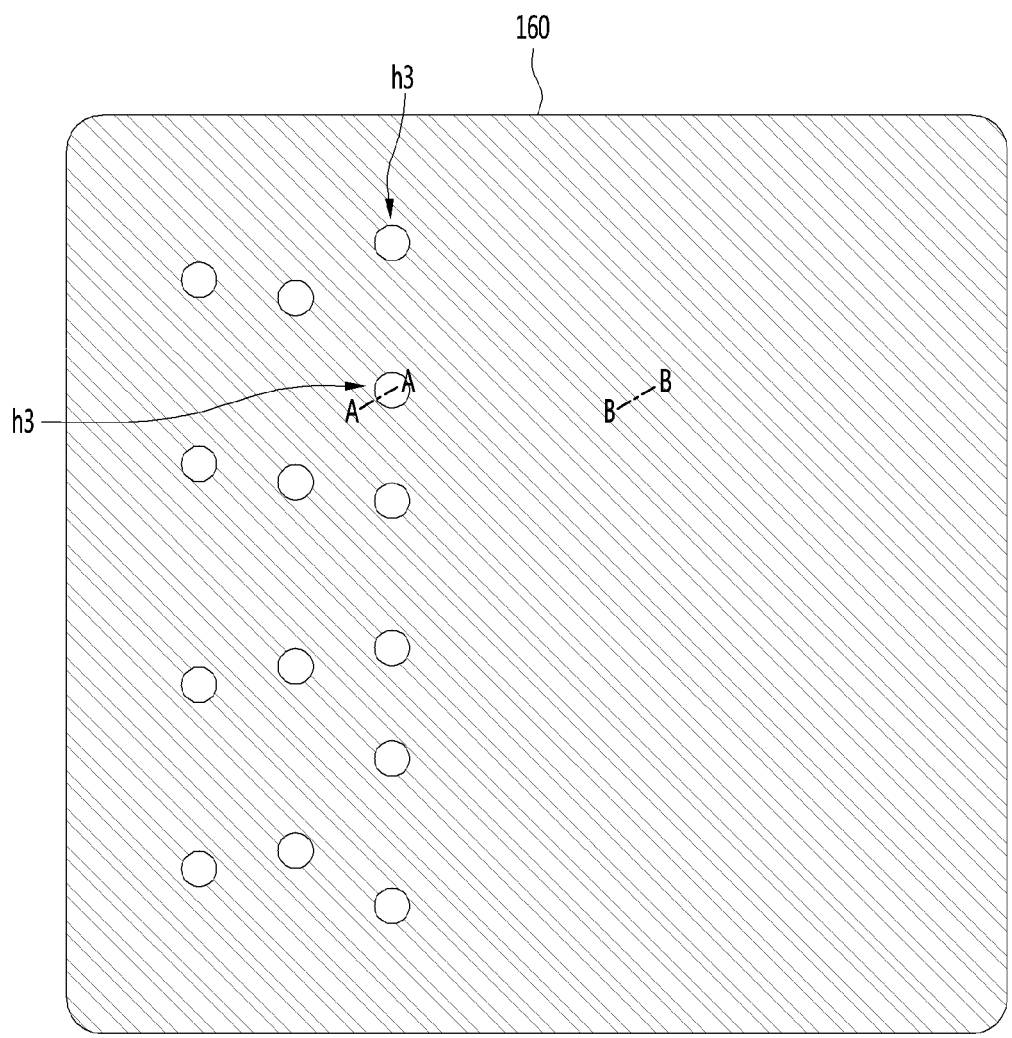

[FIG. 11b]
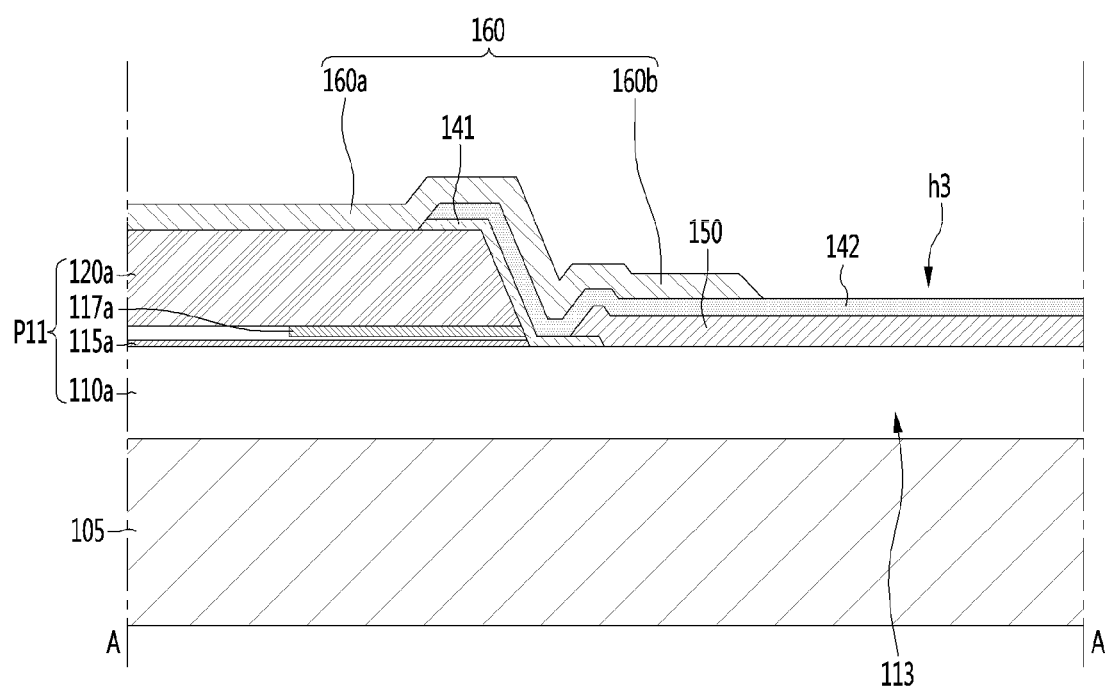

[FIG. 11c]
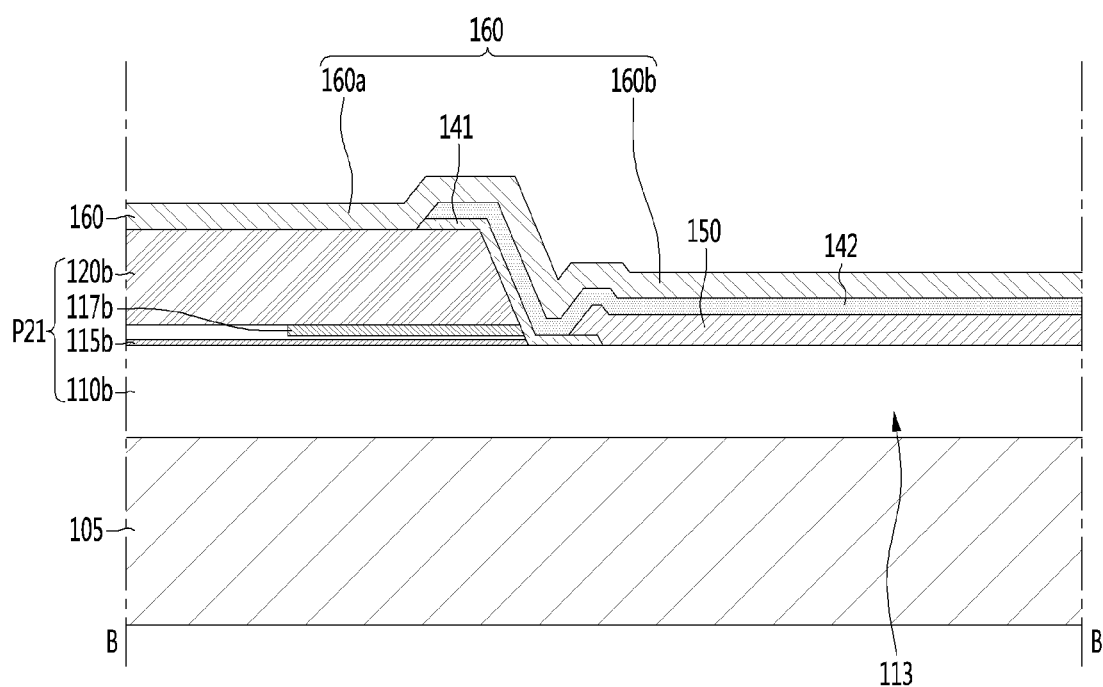

[FIG. 12a]
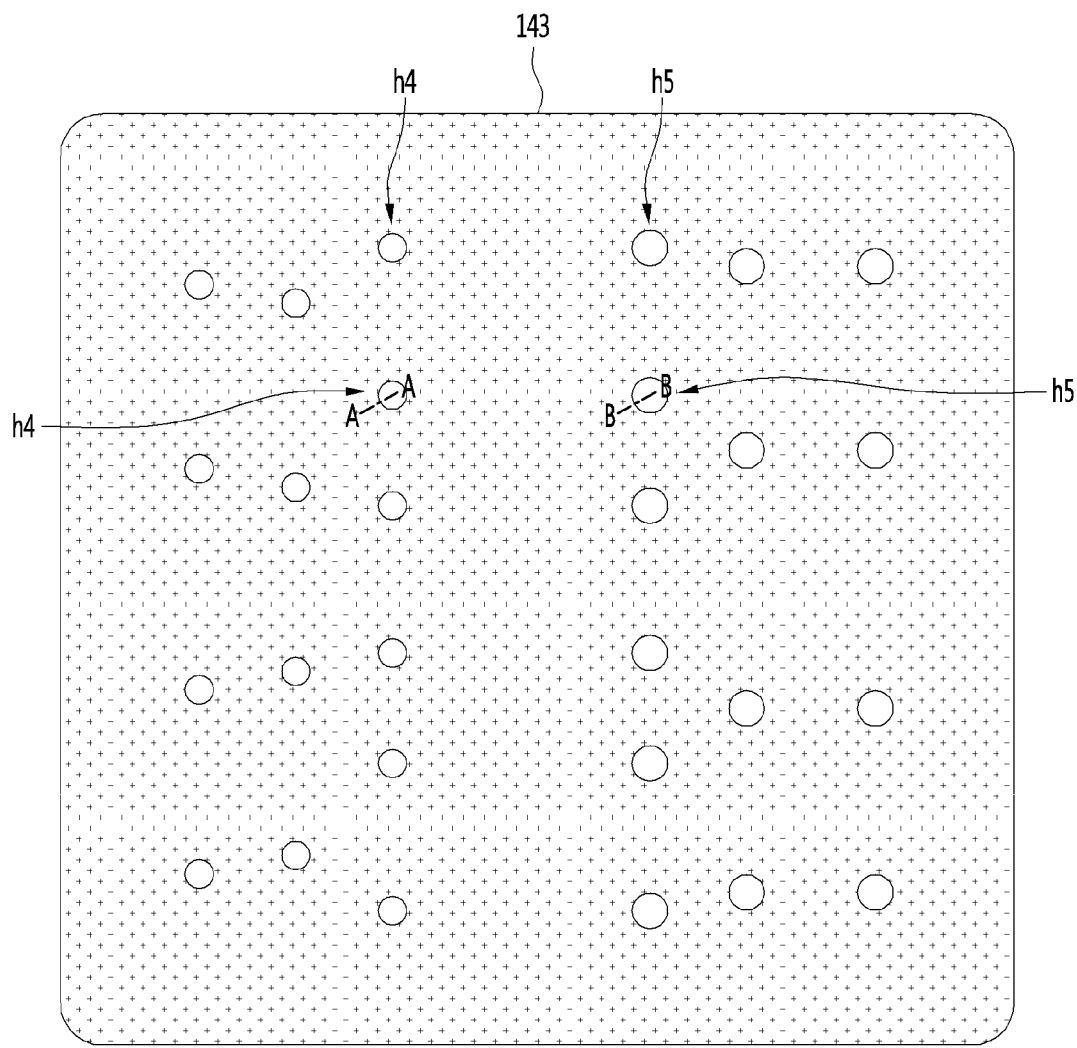

[FIG. 12b]
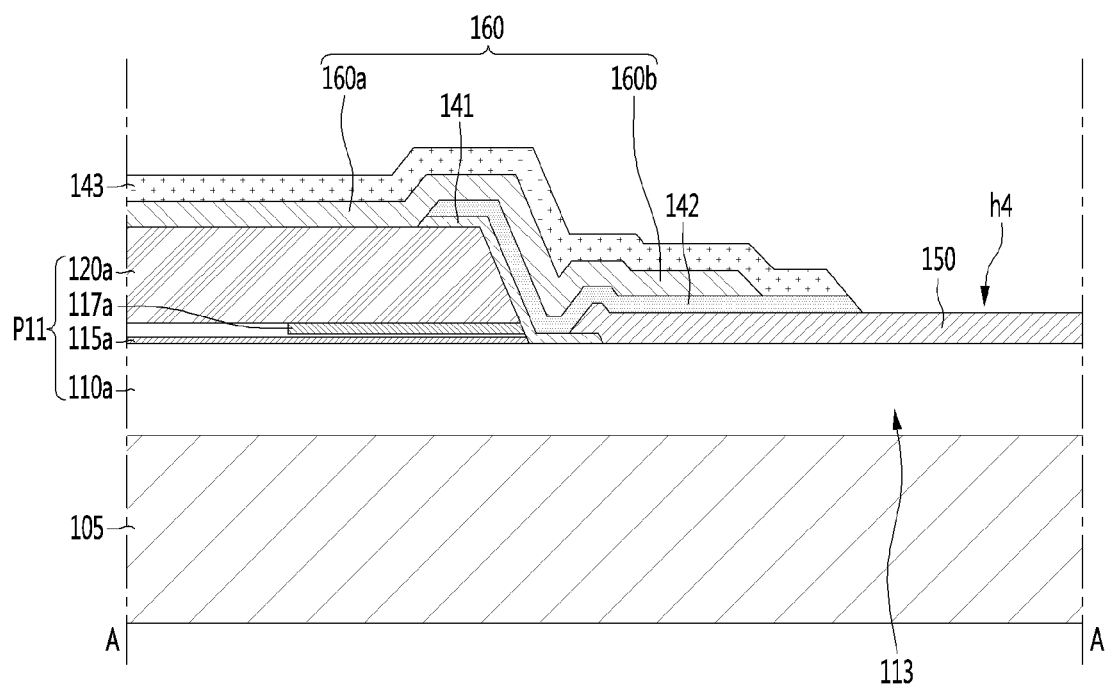

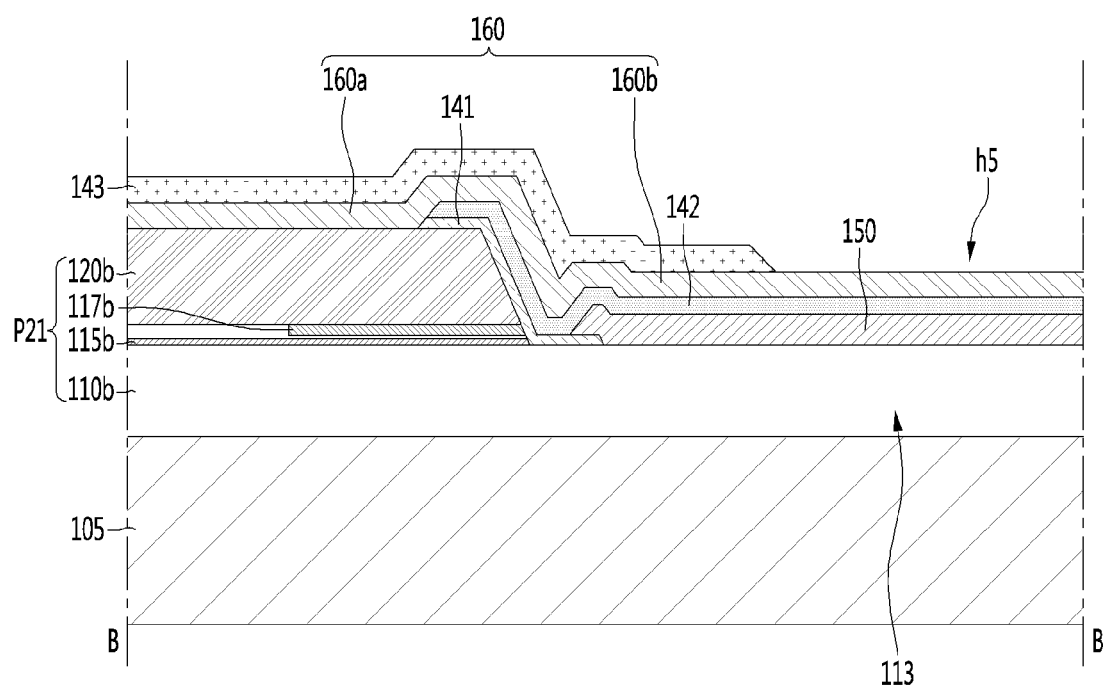
[FIG. 12c]

[FIG. 13a]
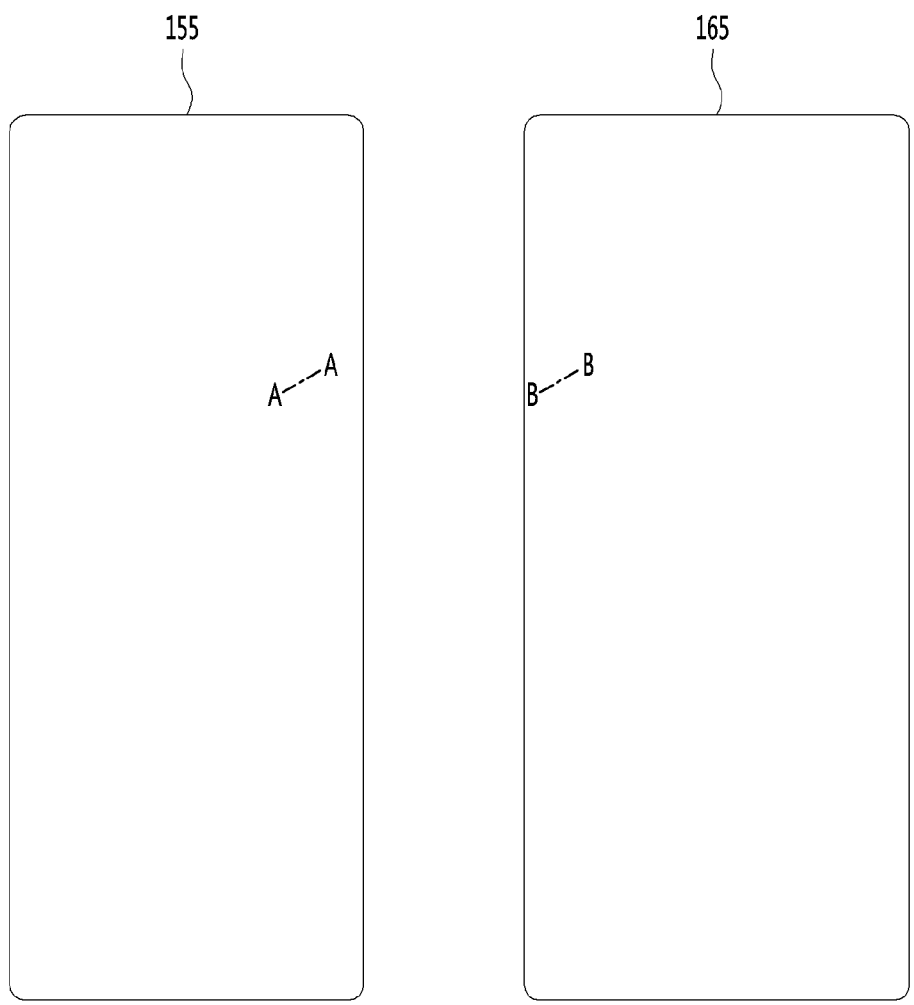

[FIG. 13b]
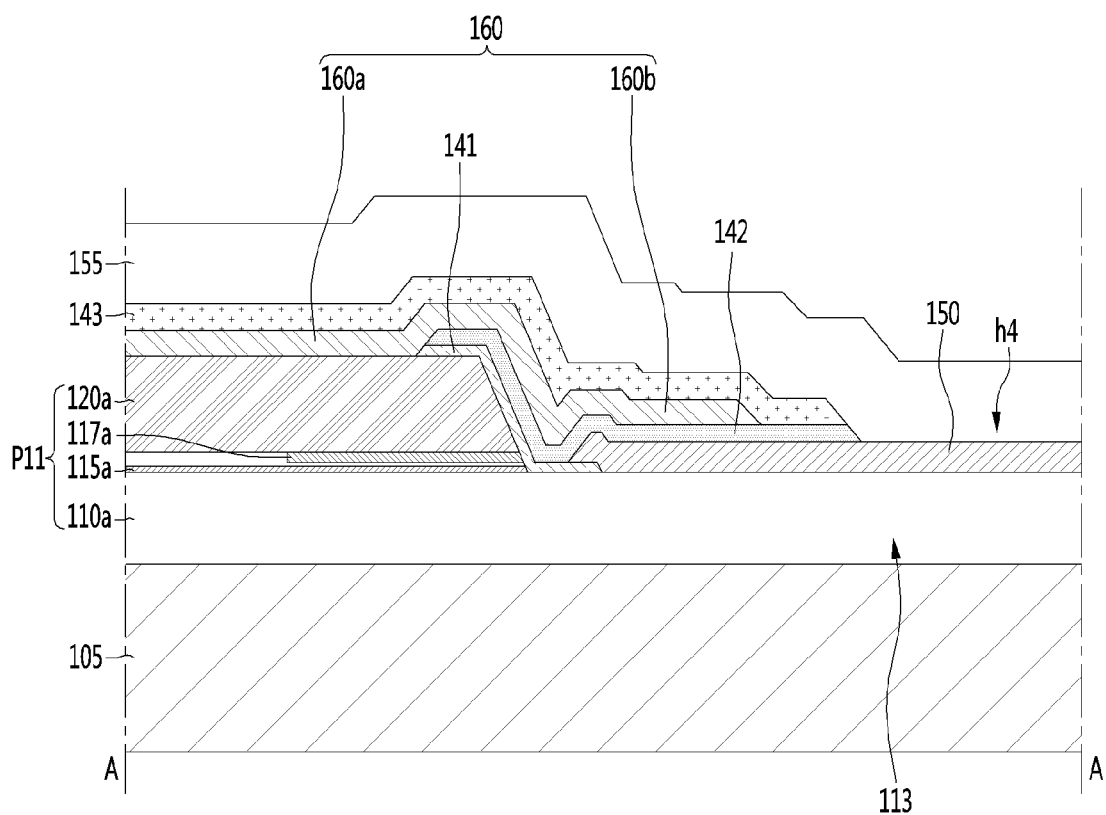

[FIG. 13c]
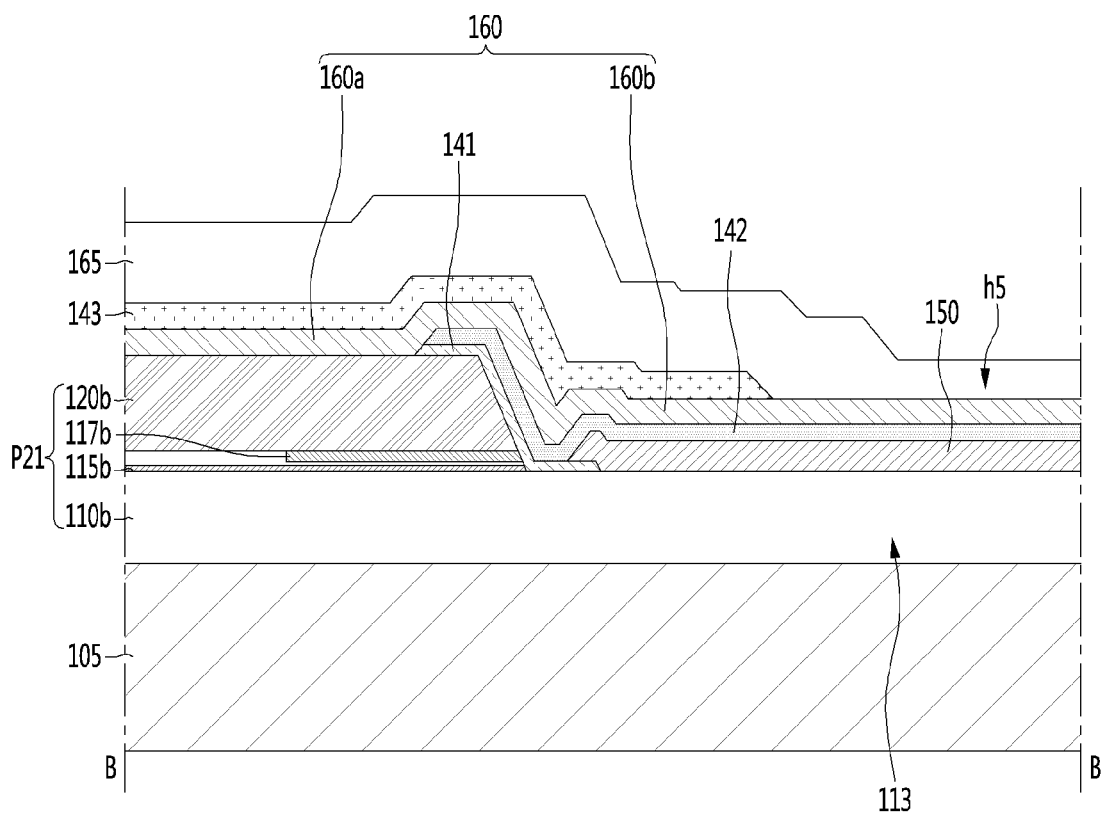

[FIG. 14]
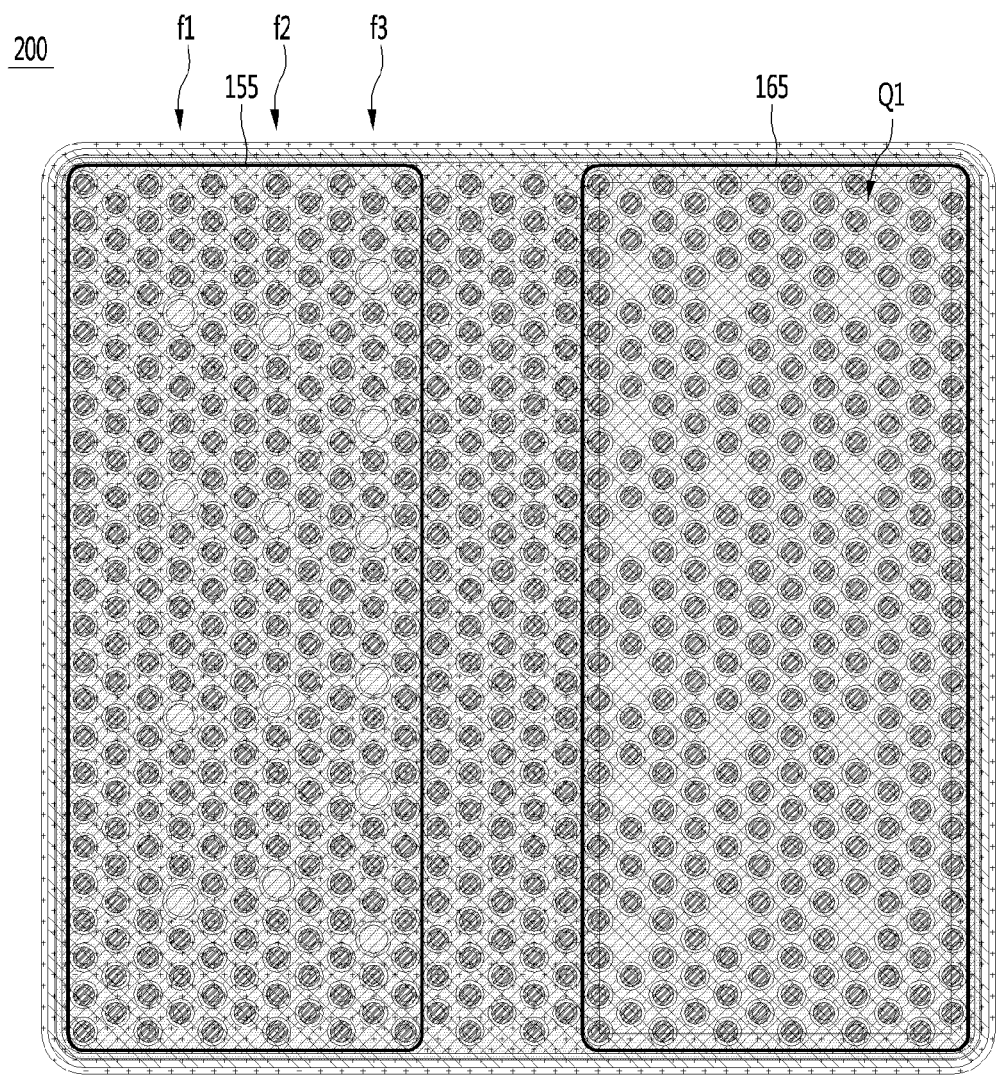

【FIG. 15】
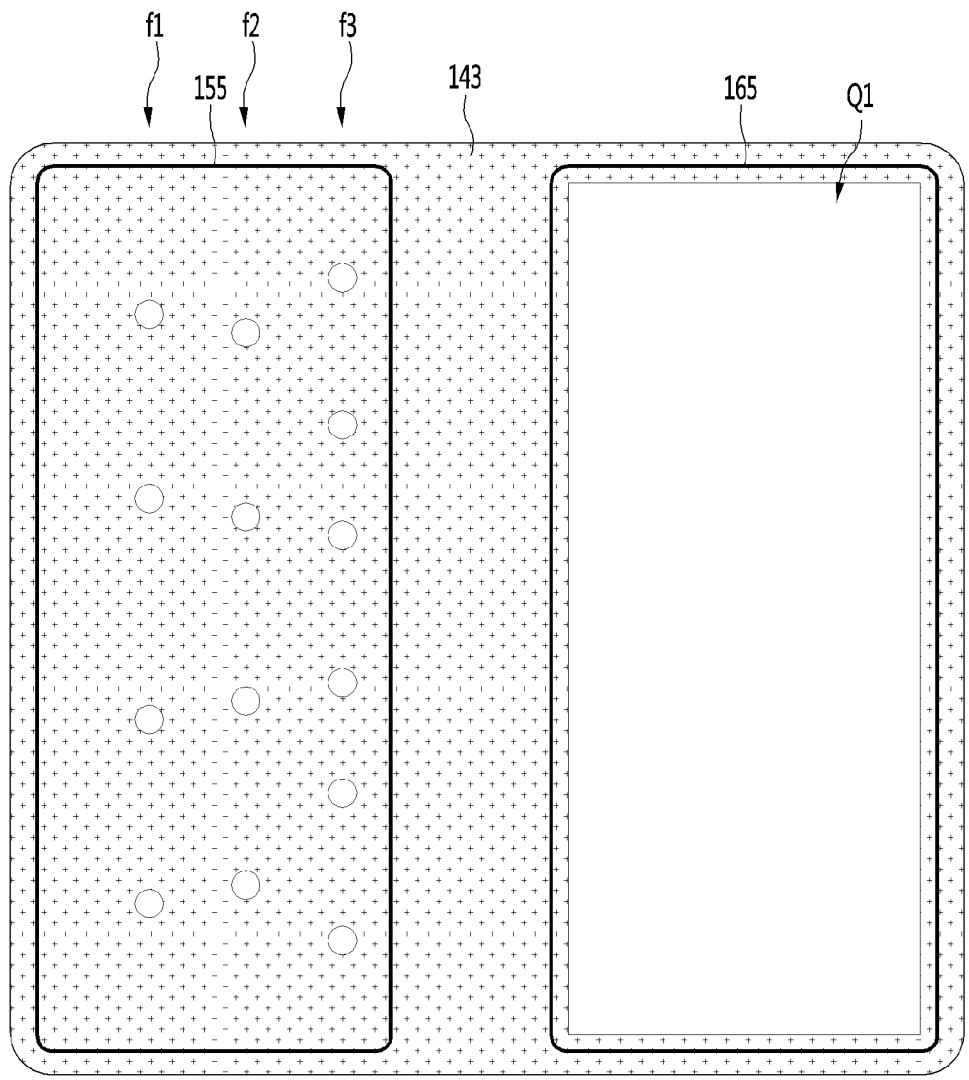

[FIG. 16]
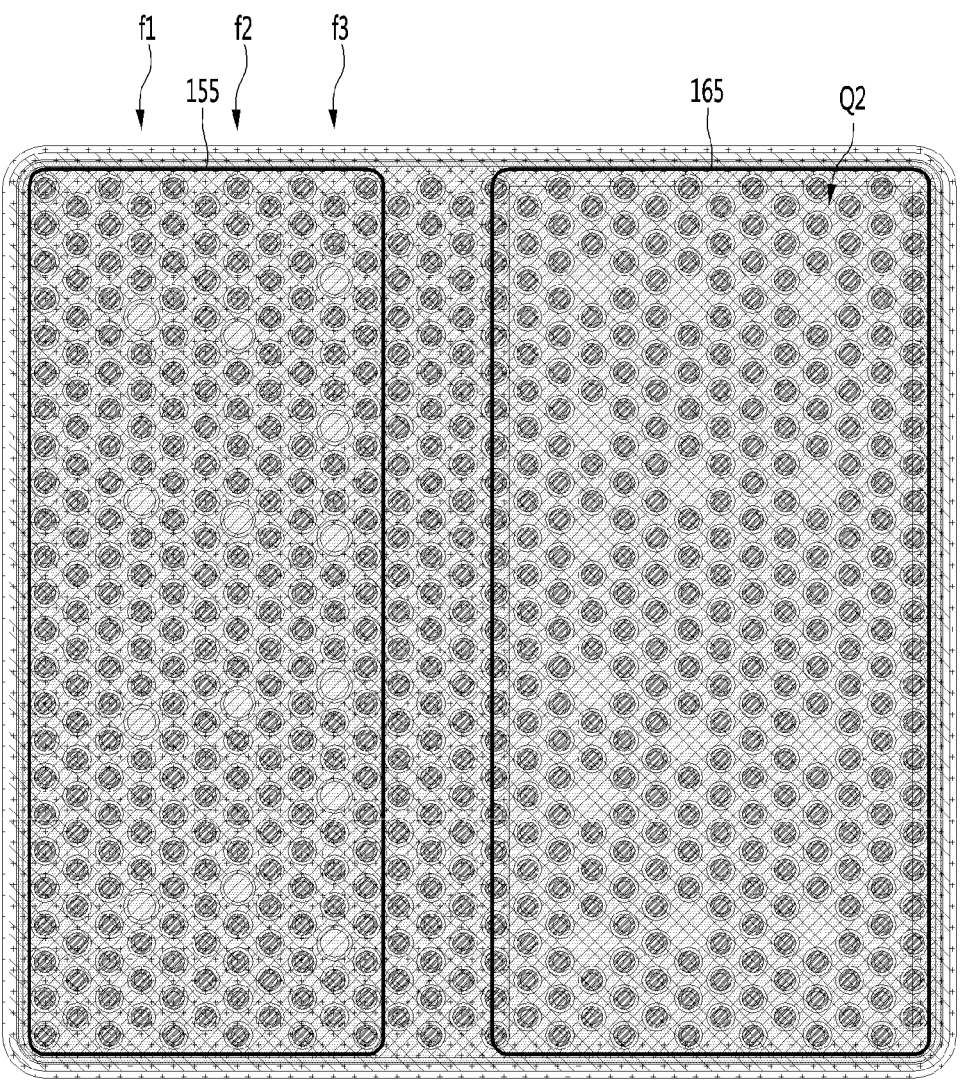

[FIG. 17]
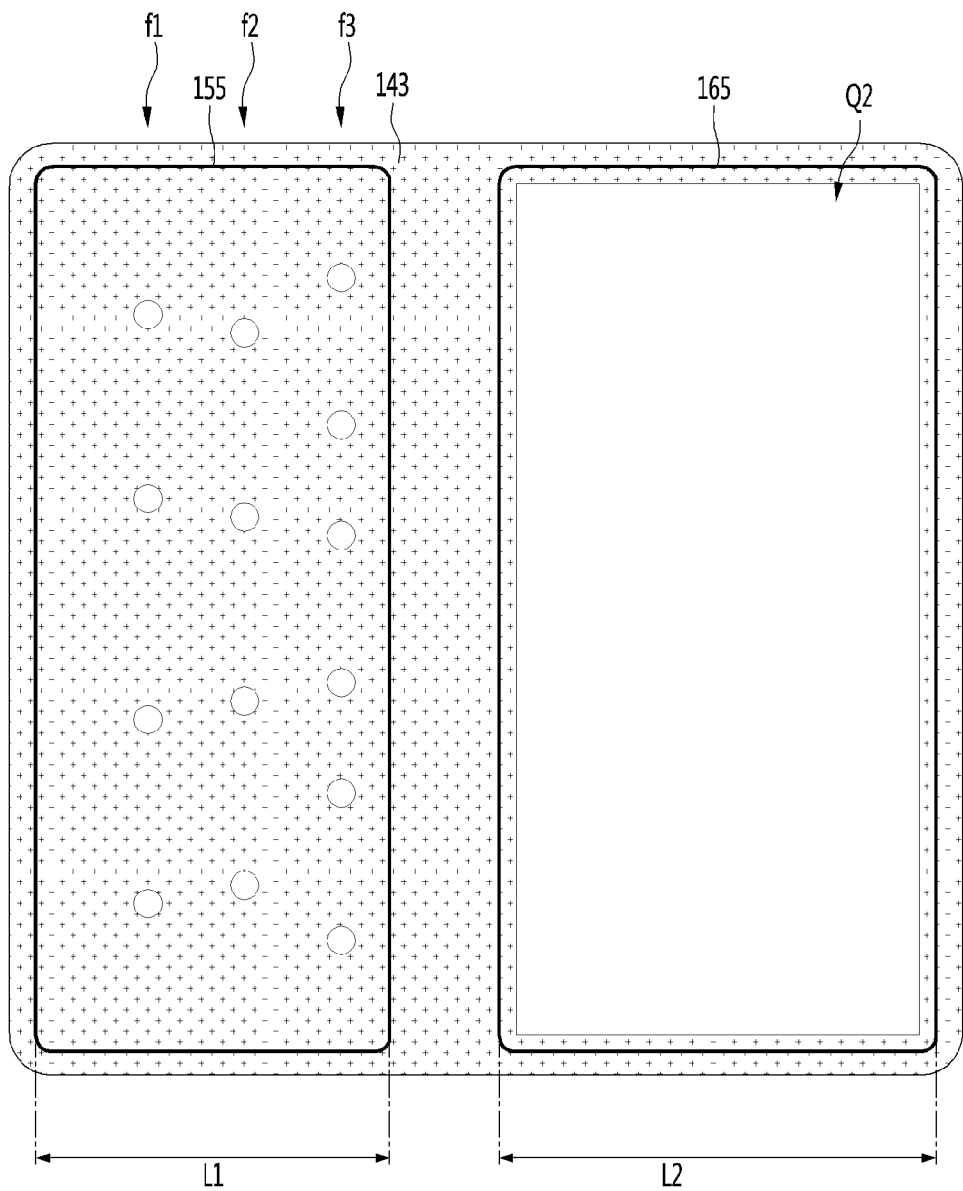

[FIG. 18]
2200
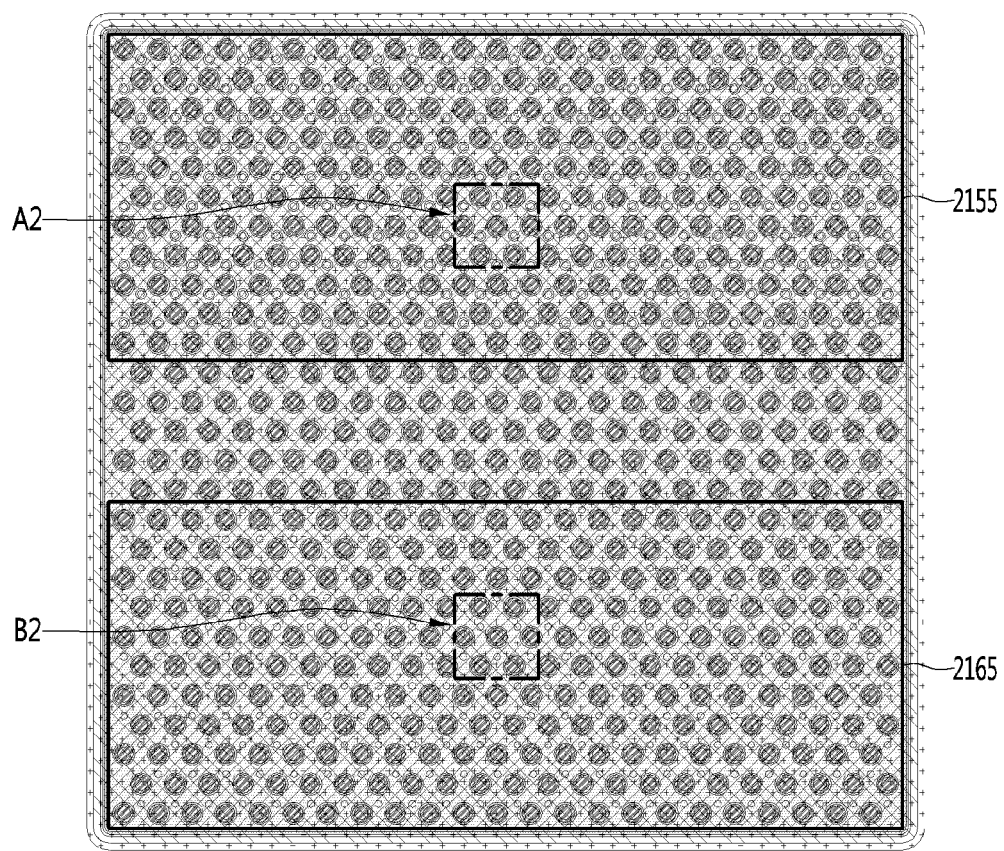

[FIG. 19]
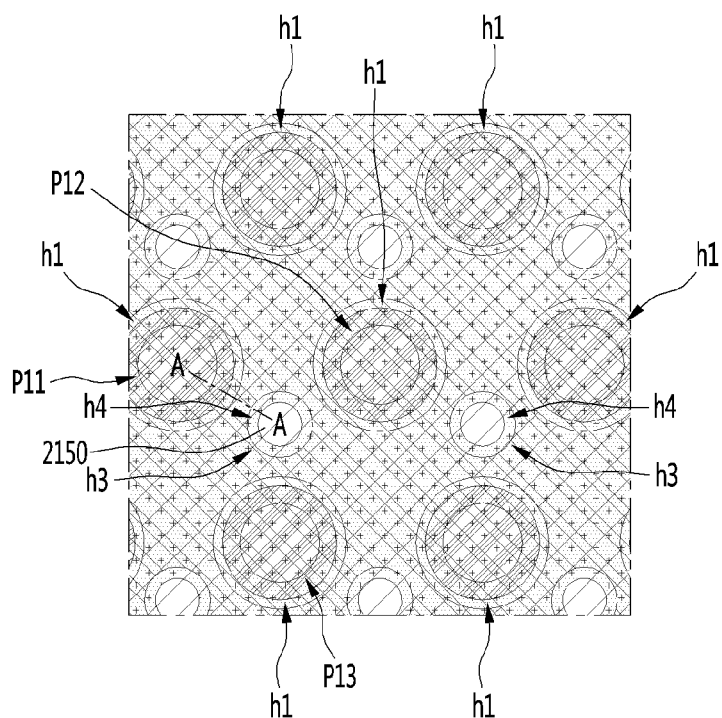

[FIG. 20]
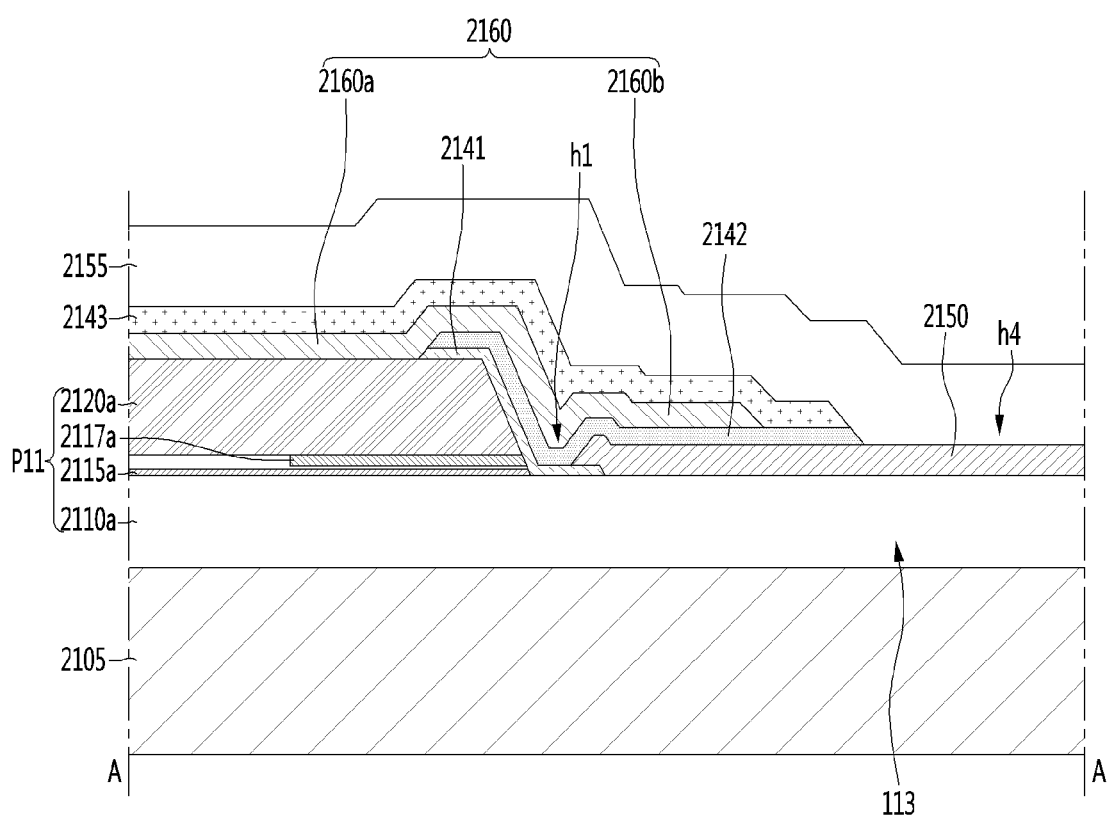

[FIG. 21]
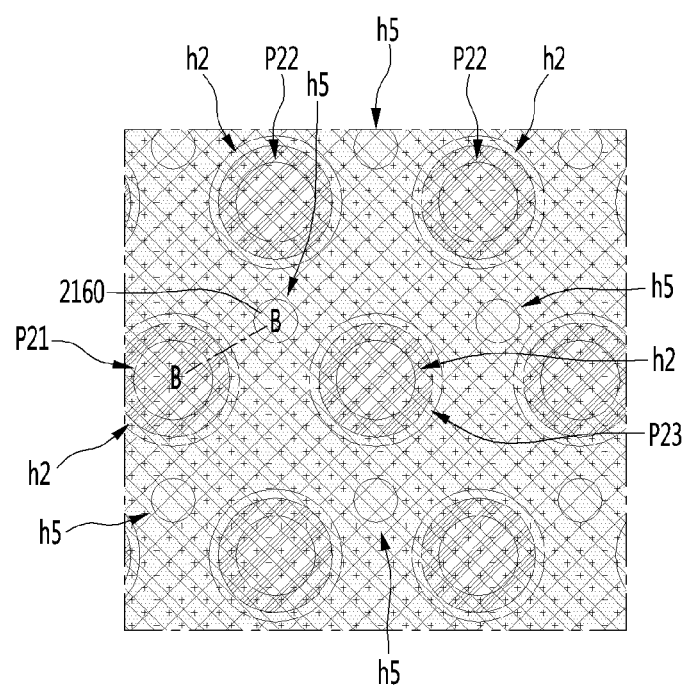

[FIG. 22]
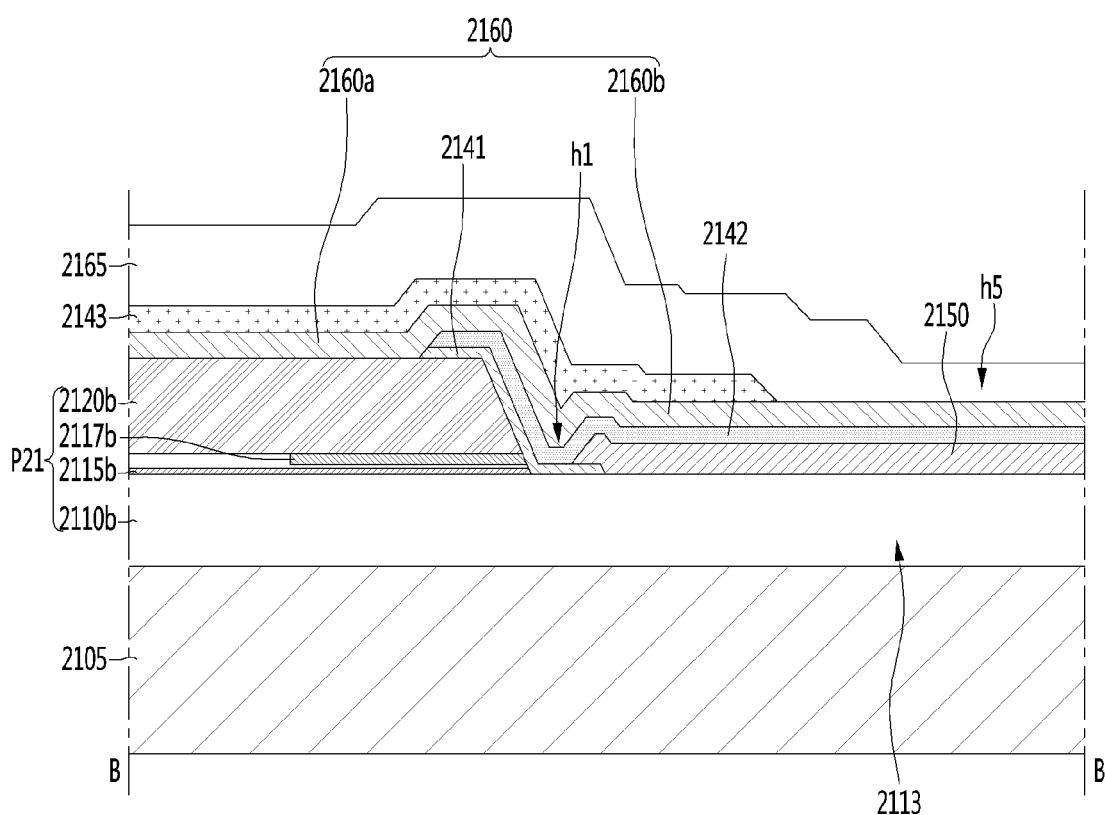

[FIG. 23]
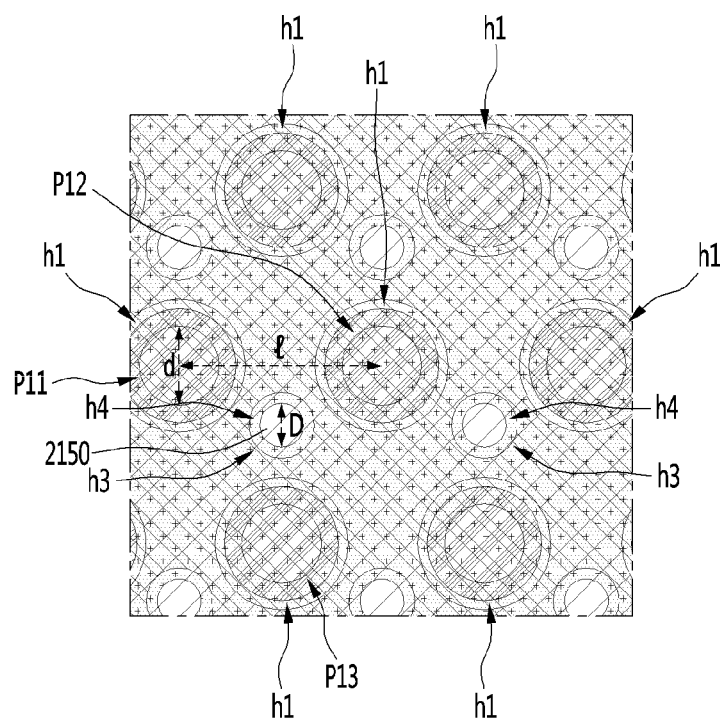

[FIG. 24a]
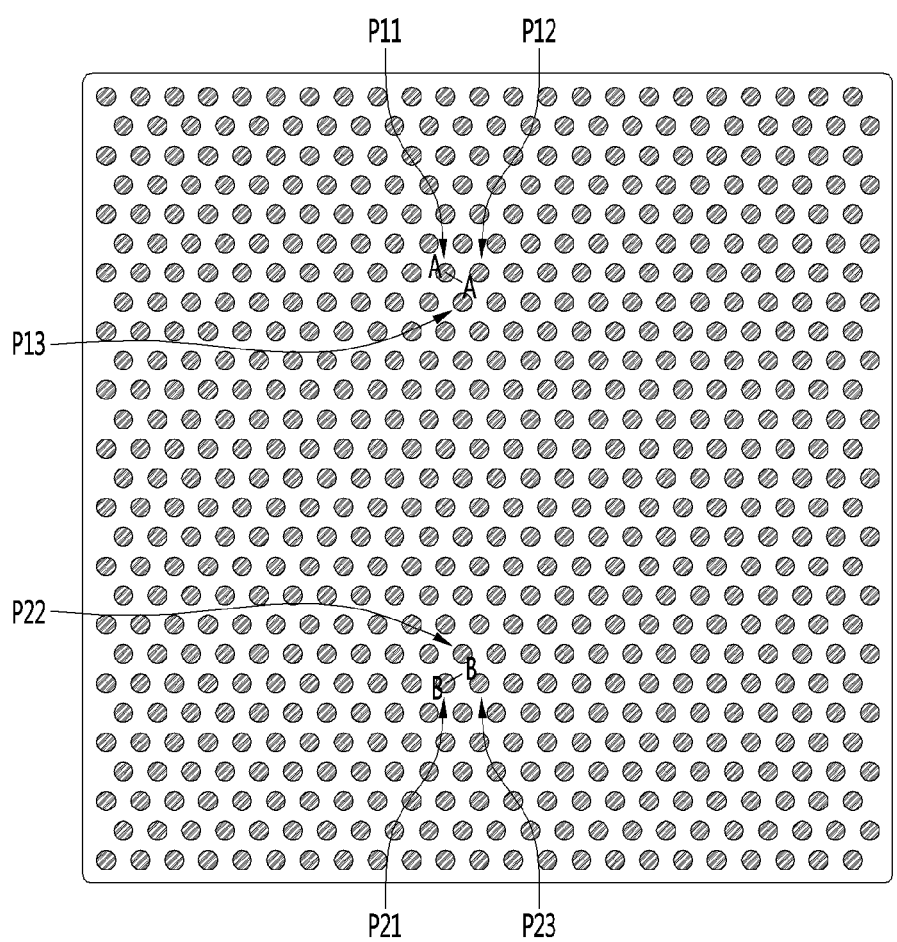

[FIG. 24b]
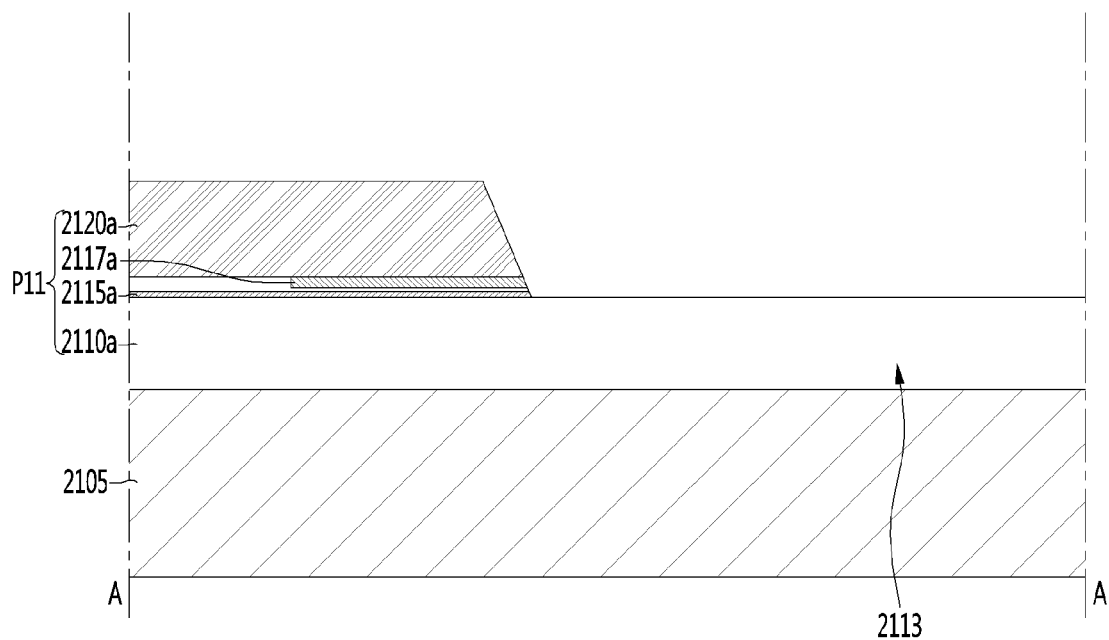

[FIG. 24c]
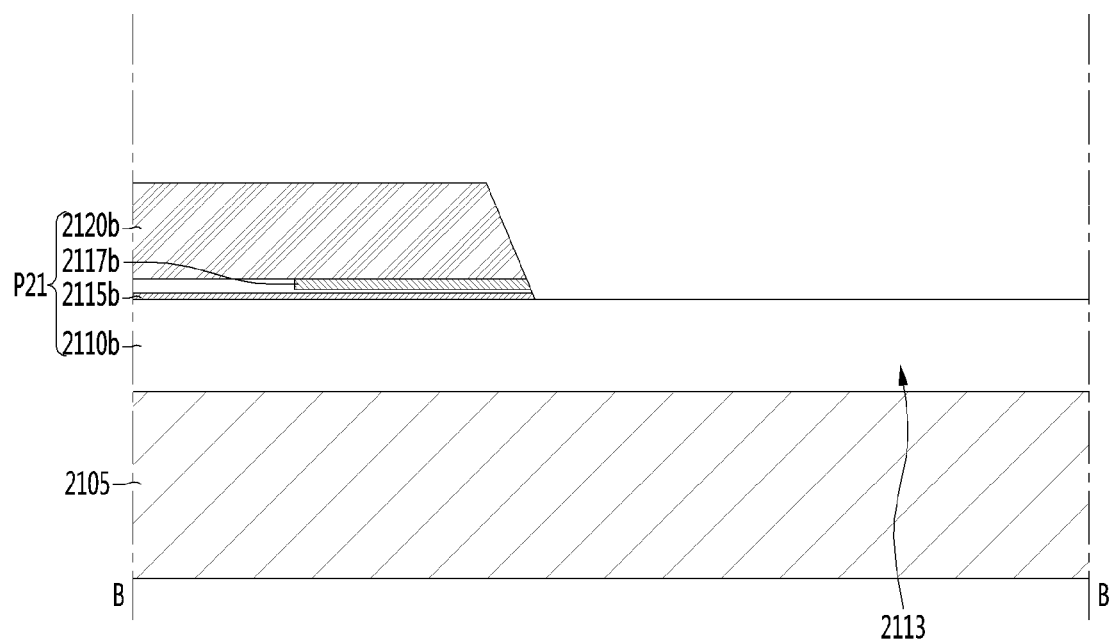

[FIG. 25a]
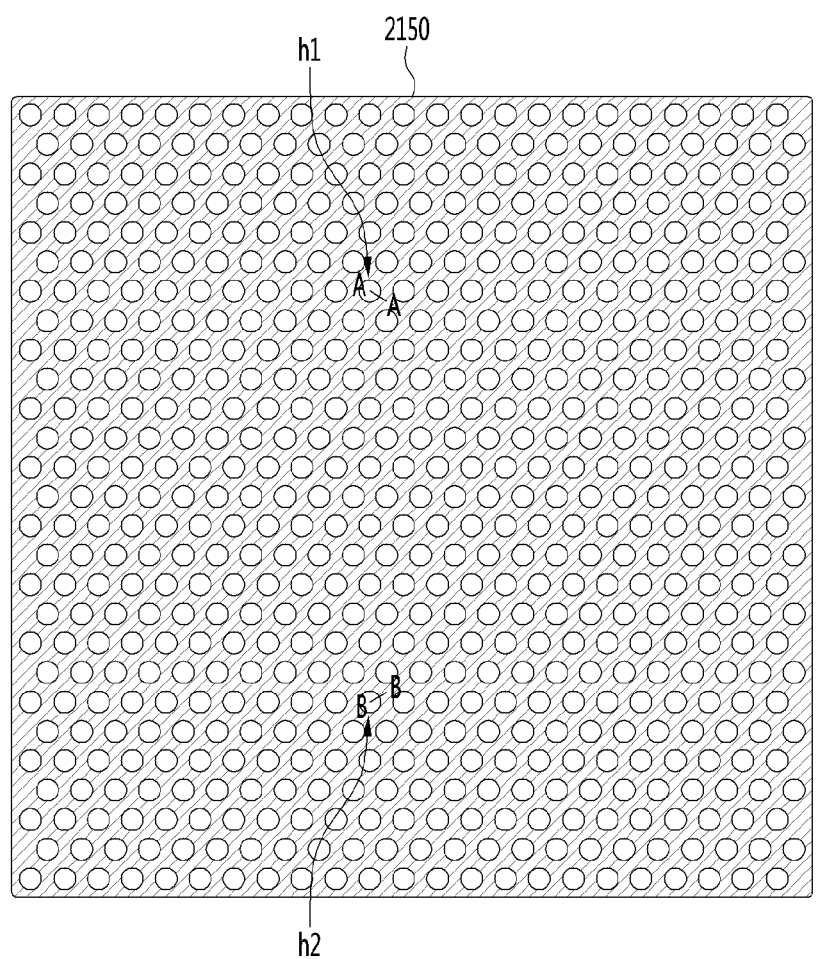

[FIG. 25b]
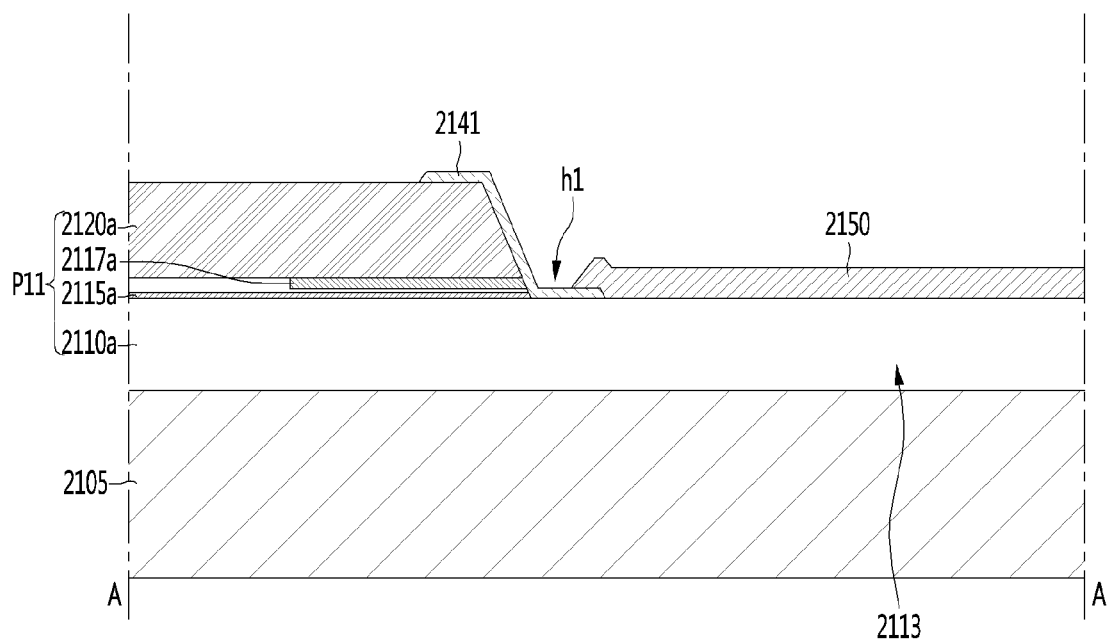

[FIG. 25c]
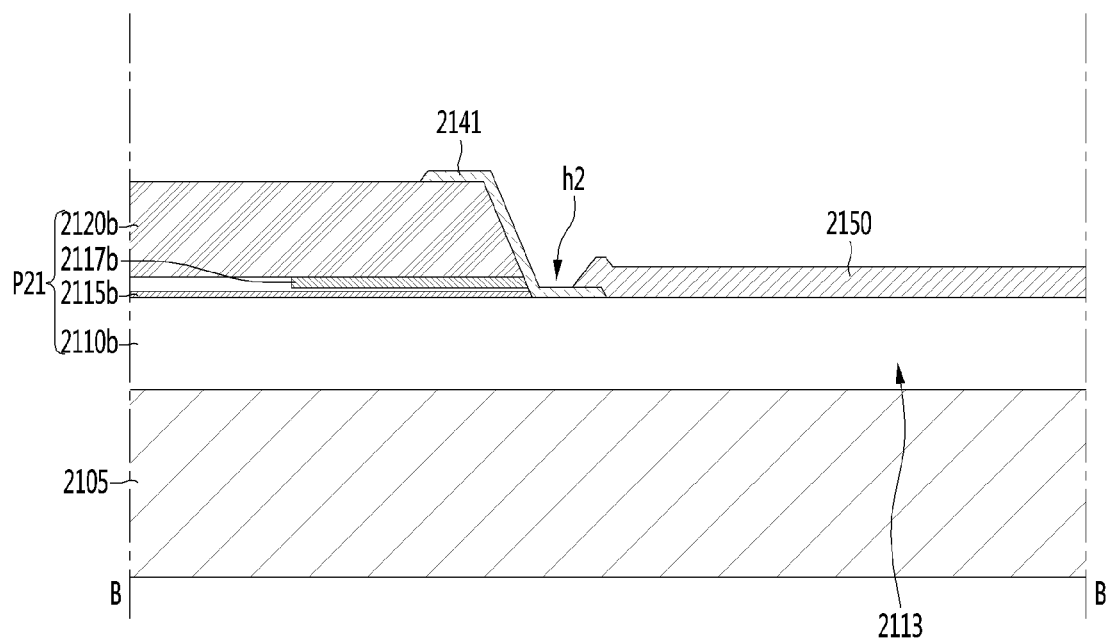

[FIG. 26a]
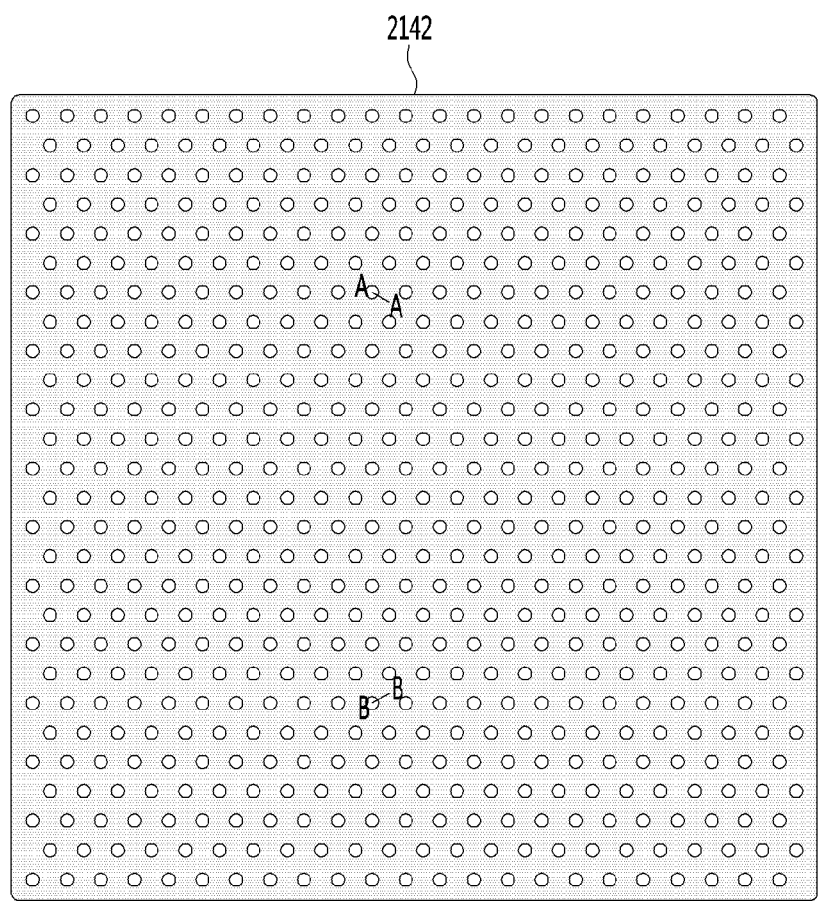

[FIG. 26b]
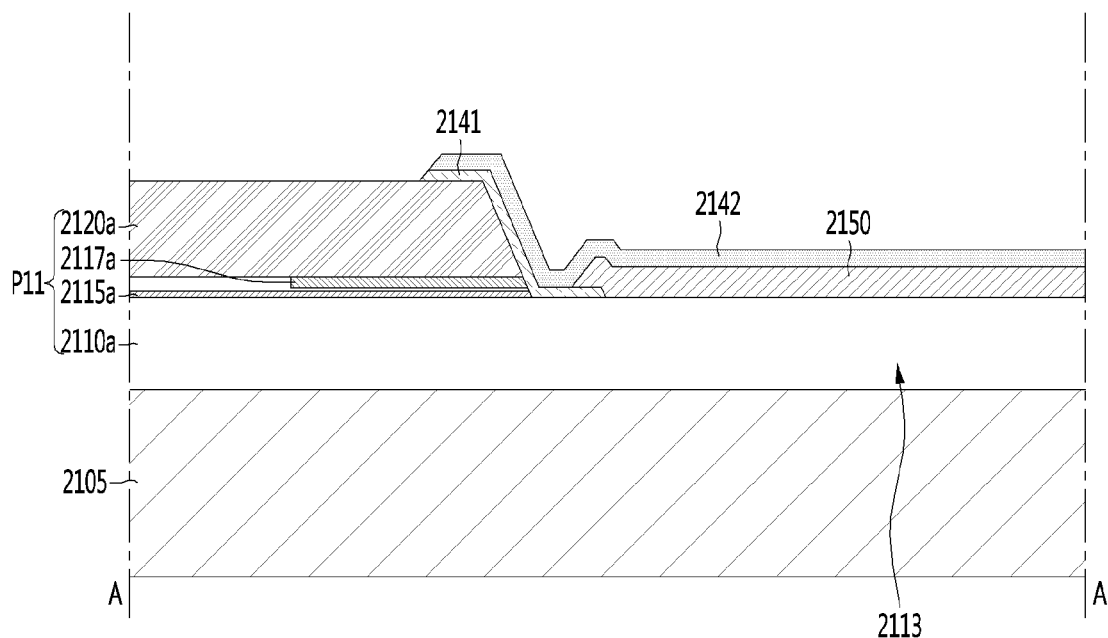

[FIG. 26c]
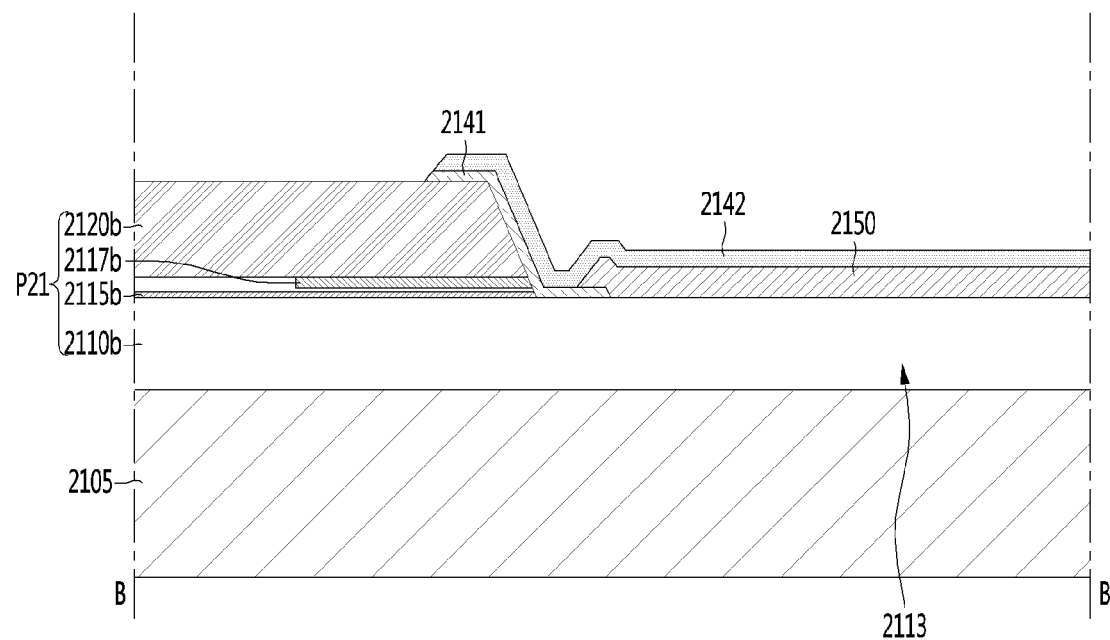

[FIG. 27a]
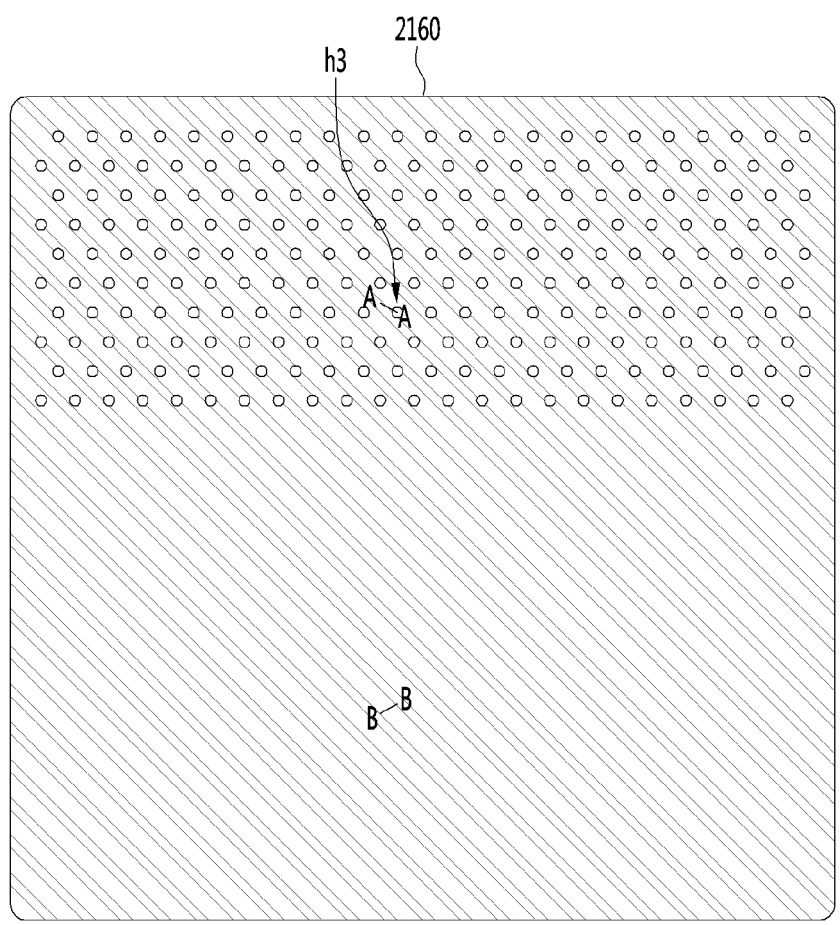

[FIG. 27b]
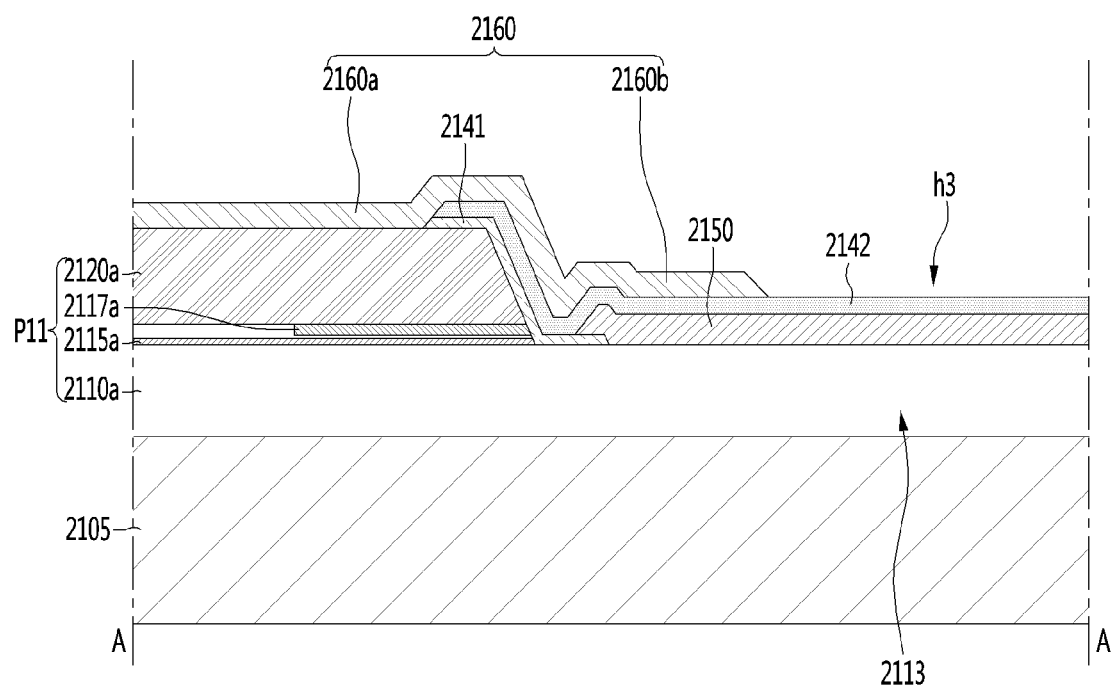

[FIG. 27c]
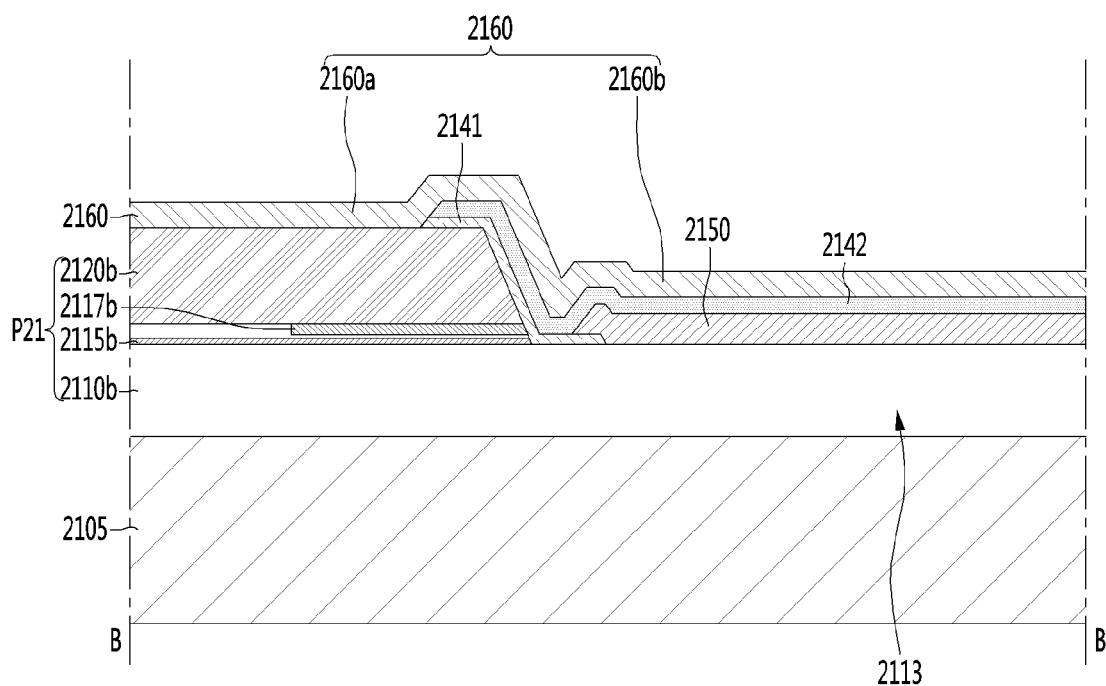

[FIG. 28a]
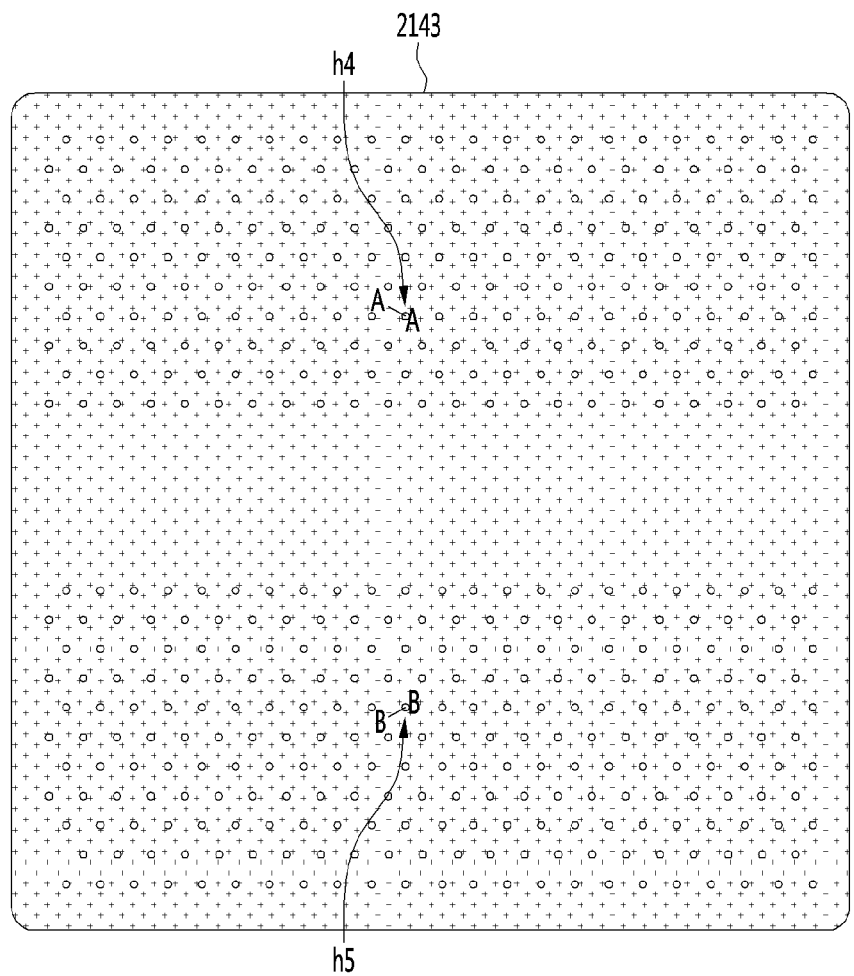

[FIG. 28b]
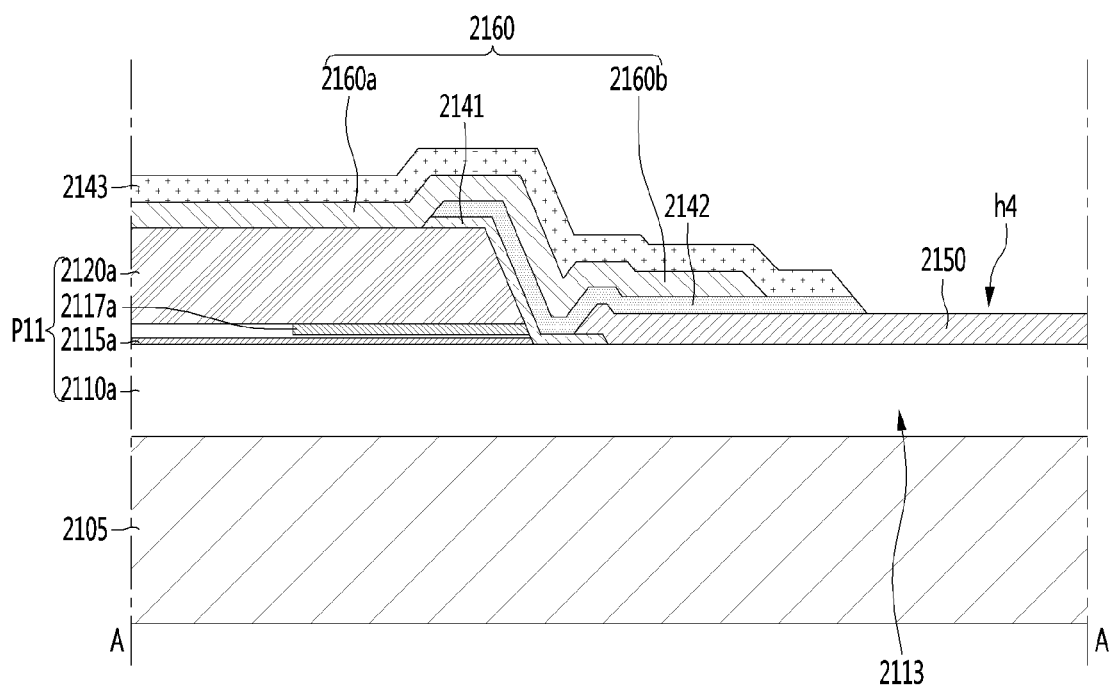

[FIG. 28c]
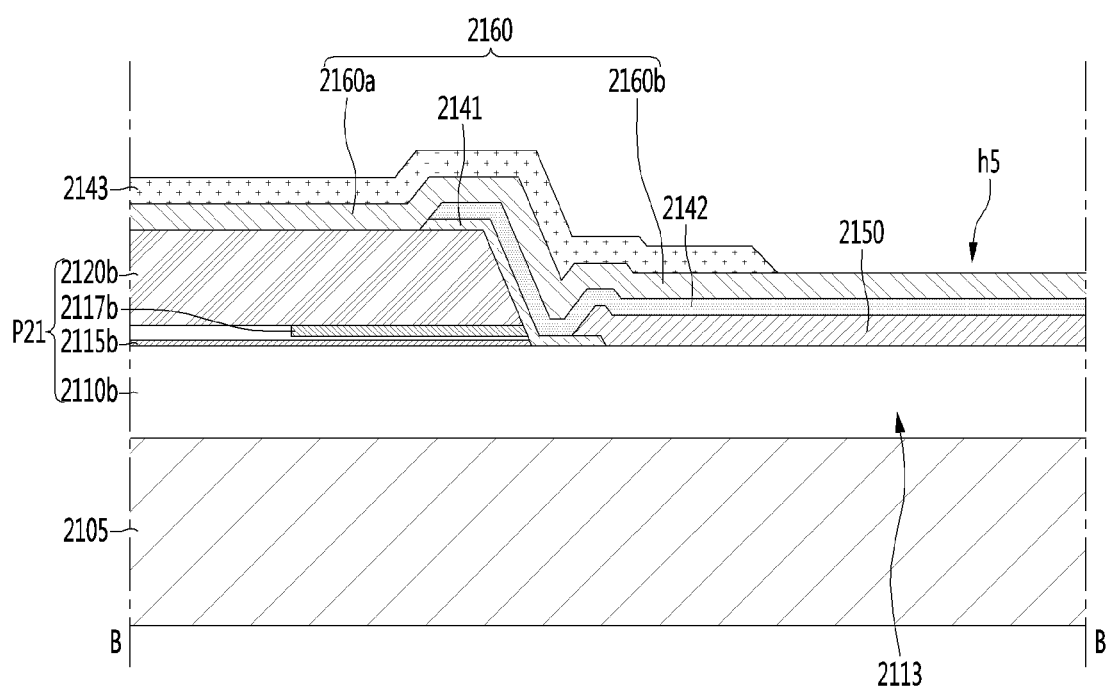

[FIG. 29a]
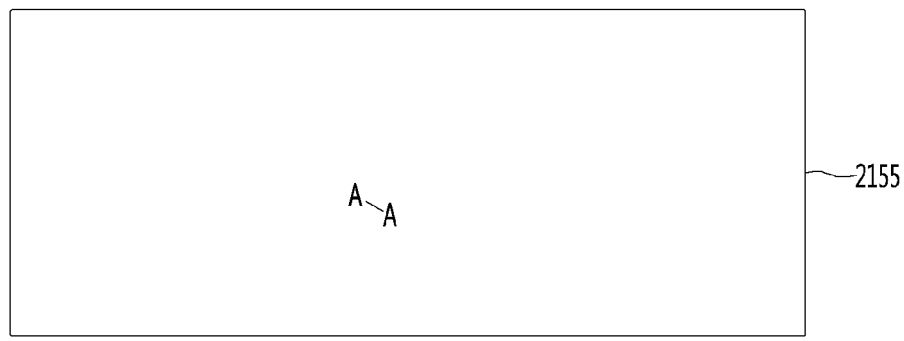
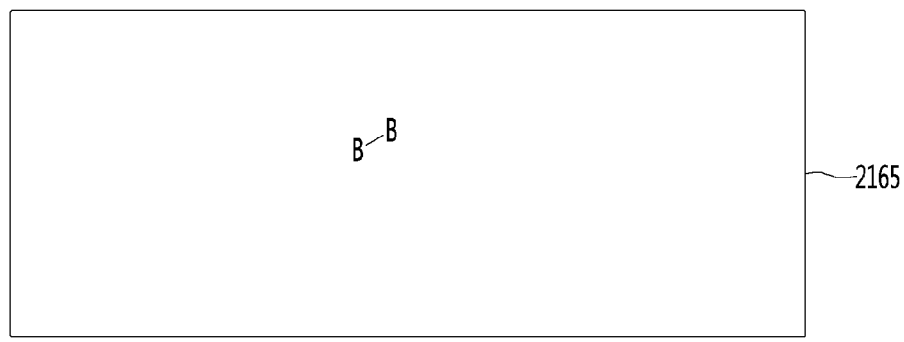

[FIG. 29b]
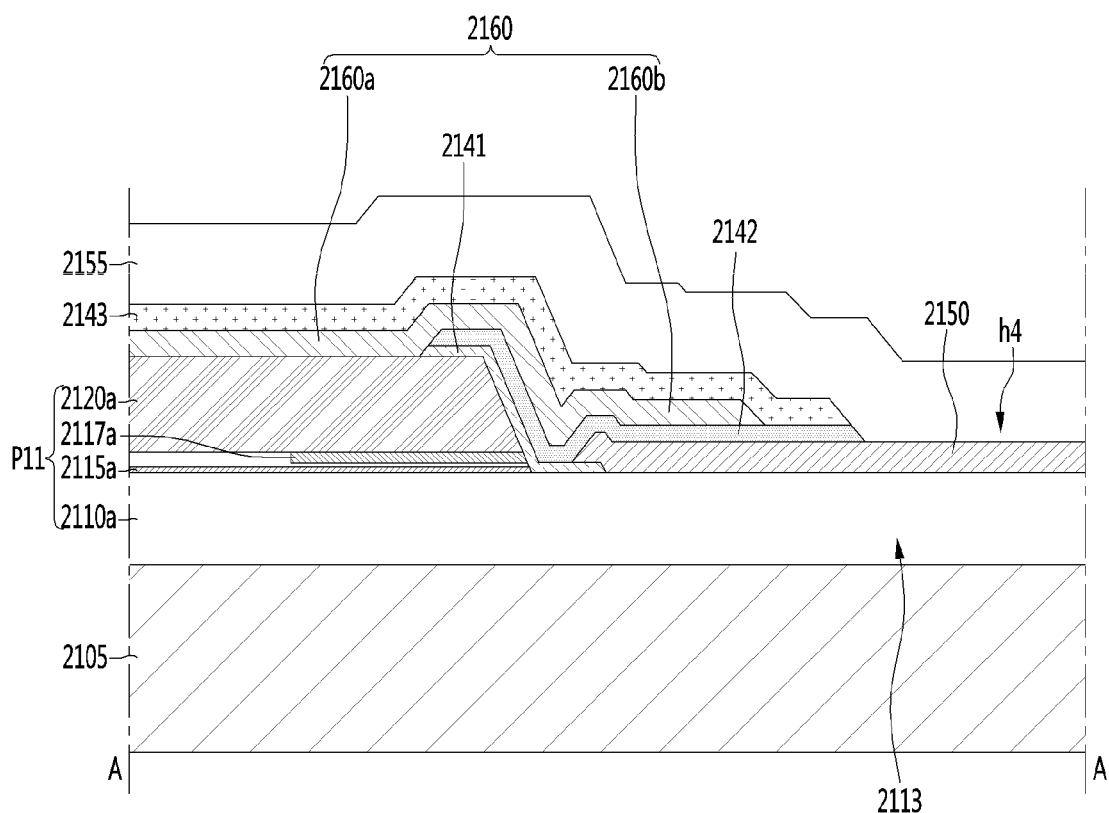

[FIG. 29c]
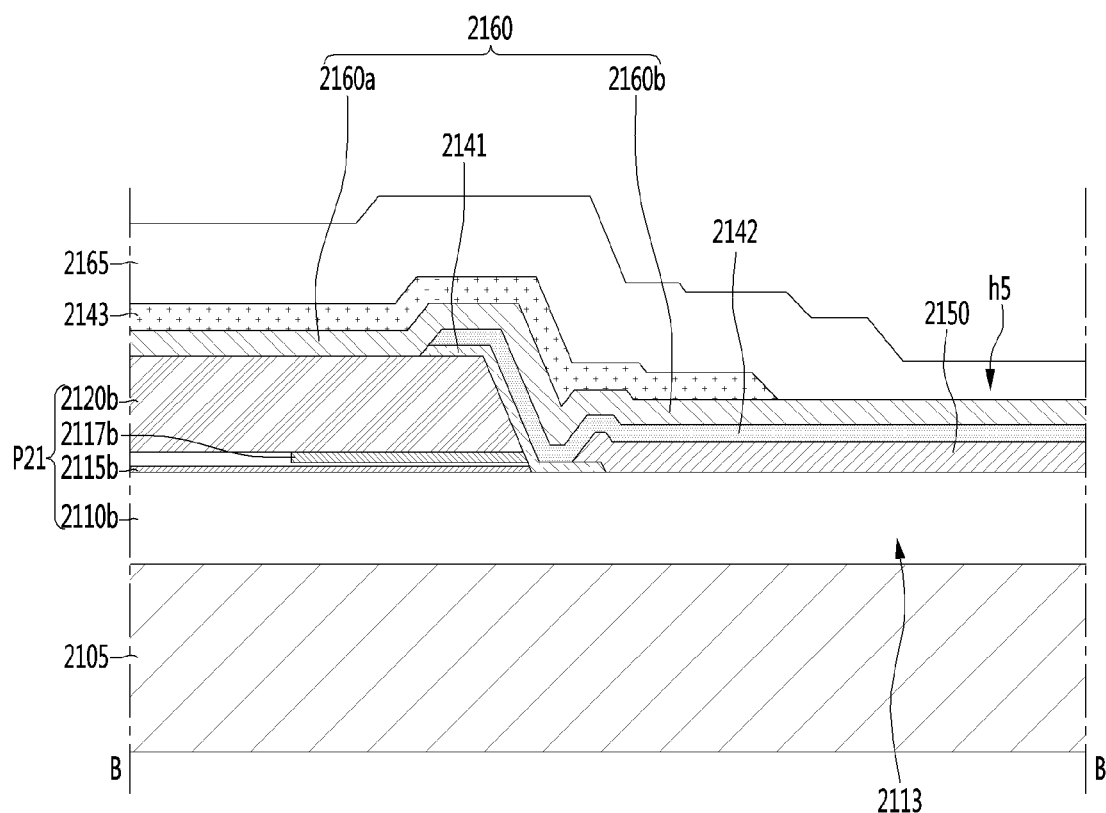

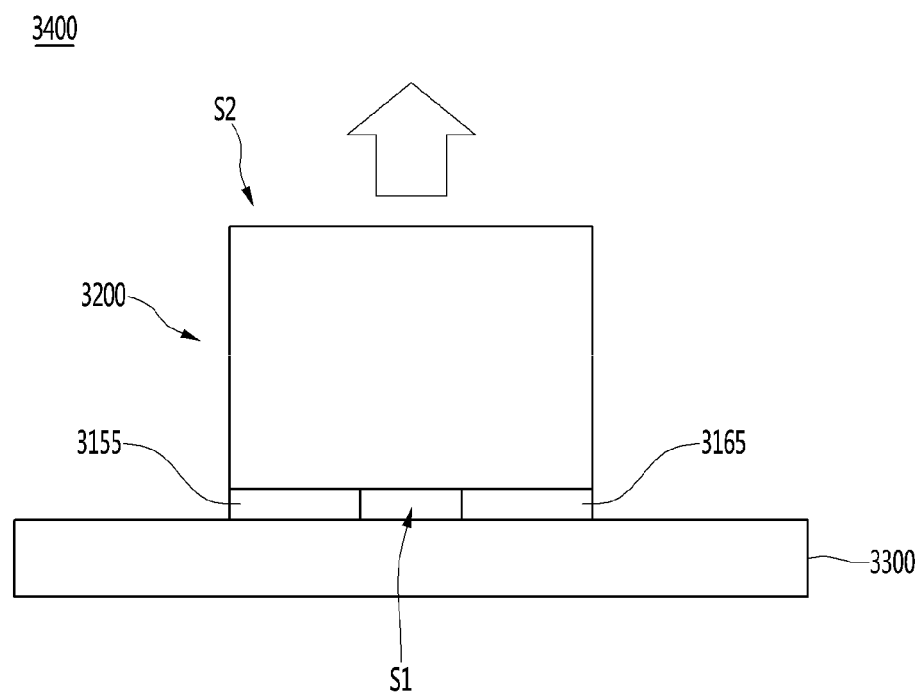
[FIG. 30]

[FIG. 31]
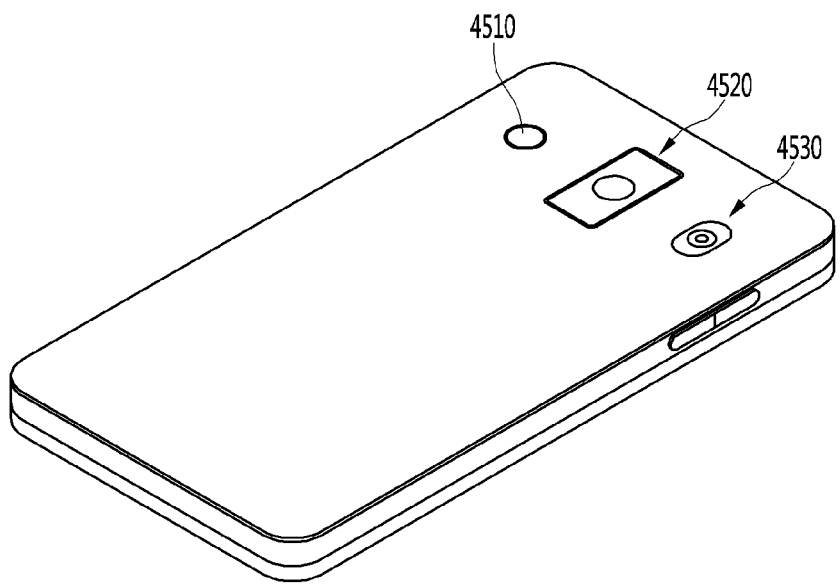

LASER DIODE

CROSS REFERENCE TO RELATED APPLICATIONS

This application is the National Phase of PCT International Application No. PCT/KR2018/005755, filed on May 18, 2018, which claims priority under 35 U.S.C. 119(a) to Patent Application Nos. 10-2017-0062132 filed in the Republic of Korea on May 19, 2017 and 10-2017-0062140, filed in the Republic of Korea on May 19, 2017, all of which are hereby expressly incorporated by reference into the present application.

TECHNICAL FIELD

Embodiments relate to a semiconductor device, a method of manufacturing a semiconductor device, a semiconductor device package, and an object detecting apparatus comprising a semiconductor device package.

BACKGROUND ART

A semiconductor device comprising compounds such as GaN and AlGaN has many merits such as wide and easily adjustable bandgap energy, so the device can be used variously as light emitting devices, light receiving devices and various kinds of diodes.

In particular, light emitting devices such as light emitting diodes and laser diodes obtained by using a group III-V or a group II-VI compound semiconductor substances can implement light having various wavelength band such as red, green, blue and ultraviolet rays due to the development of thin film growth technology and device materials. In addition, the light emitting devices such as light emitting diodes and laser diodes obtained by using a group III-V or a group II-VI compound semiconductor substances can implement a white light source having high efficiency by using fluorescent substances or combining colors. Such a light emitting device has advantages such as low power consumption, semi-permanent lifetime, quick response speed, safety, and environmental friendliness compared to conventional light source such as fluorescent lamps and incandescent lamps.

In addition, when a light receiving device such as a photo detector or a solar cell is manufactured using a group III-V or a group II-VI compound semiconductor substances, a photoelectric current is generated by absorbing light having various wavelength domains with the development of device materials, so that light having various wavelength domains such as from gamma rays to radio waves can be used. In addition, the above light receiving device has advantages such as quick response speed, safety, environmental friendliness, and easy control of device materials, so that the light receiving device can be easily used for a power control, a super-high frequency circuit or a communication module.

Accordingly, the semiconductor device has been applied and expanded to a transmission module of an optical communication tool, a light emitting diode backlight replacing a cold cathode fluorescence lamp (CCFL) constituting a backlight of a liquid crystal display (LCD), a white light emitting diode lighting apparatus replaceable with a fluorescent lamp or an incandescent bulb, a vehicular headlight, a traffic light, and a sensor for detecting gas or fire. In addition, the applications of the semiconductor device can be expanded to a high frequency application circuit, a power control apparatus, or a communication module.

For example, the light emitting device may be provided as a p-n junction diode having a characteristic in which electrical energy is converted into light energy by using a group III-V element or a group II-VI element in the periodic table, and various wavelengths can be realized by adjusting the composition ratio of the compound semiconductor substances.

Meanwhile, semiconductor devices are required to have high output and high voltage driving as their application fields become diverse. The temperature is increased by the heat generated in the semiconductor device due to the high output and high voltage driving of the semiconductor device. However, when the heat dissipation from the semiconductor device is not enough, the light output may be lowered and the power conversion efficiency (PCE) may be lowered as the temperature rises. Accordingly, there is a demand for a method for efficiently dissipating heat generated in a semiconductor device and improving power conversion efficiency.

DETAIL DESCRIPTION OF THE INVENTION

Technical Problem

Embodiments can provide a semiconductor device, a method of manufacturing the same, a semiconductor device package, and an object detecting apparatus that having excellent heat dissipation characteristics.

Embodiments can provide a semiconductor device, a method of manufacturing the same, a semiconductor device package, and an object detecting apparatus that capable of increasing light extraction efficiency and providing light with high output.

Embodiments can provide a semiconductor device, a method of manufacturing the same, a semiconductor device package, and an object detecting apparatus that capable of increasing power conversion efficiency.

Technical Solution

A laser diode according to an embodiment may comprise a substrate; a first conductivity type reflective layer disposed on the substrate; a plurality of light emitting structures, each light emitting structure comprising an active layer and a second conductivity type reflective layer, which are disposed on the first conductivity type reflective layer; a first electrode electrically connected with the first conductivity type reflective layer; a second electrode electrically connected with the second conductivity type reflective layer; a first insulating layer disposed on the first electrode; a first bonding pad disposed on the plurality of light emitting structures and electrically connected with the first electrode; and a second bonding pad disposed on the plurality of light emitting structures and spaced apart from the first bonding pad, and electrically connected with the second electrode, wherein the substrate may comprise a length in a first direction and a width in a second direction perpendicular to the first direction, wherein the first bonding pad may comprise a first side surface and a second side surface in the first direction, wherein the first side surface of the first bonding pad may be closer to a first side surface of the substrate in the first direction than the second side surface, wherein the second bonding pad may comprise a third side surface and a fourth side surface in the first direction, wherein the third side surface of the second bonding pad may be closer to the second side surface of the first bonding pad than the fourth side surface, wherein the first insulating layer may comprise a plurality of first openings overlapped with the first bonding pad and a plurality of second openings overlapped with the second bonding pad, in a third direction perpendicular to the first and second directions, wherein the first openings of the first insulating layer may be disposed spaced apart in the first direction, and comprise a first group disposed closer to the second side surface of the first bonding pad, and a second group spaced apart from the first group in the second direction, wherein the second openings of the first insulating layer may be disposed spaced apart in the first direction, and comprise a third group disposed closer to the third side surface of the second bonding pad, and a fourth group spaced apart from the third group in the second direction, wherein the first group of the first openings and the third group of the second openings may be disposed within 15% of the width in the second direction of the substrate with respect to a central axis parallel to the first direction of the substrate, and wherein a minimum distance between the first openings or the second openings of the first insulating layer may be provided to be greater than a minimum distance between the light emitting structures.

According to the embodiment, wherein the first electrode may be disposed under the first bonding pad and under the second bonding pad, and provides a plurality of openings exposing the active layer and the second conductivity type reflective layer of the plurality of light emitting structures.

According to the embodiment, wherein the second electrode may be disposed under the first bonding pad and under the second bonding pad, and provide a plurality of openings exposing the first electrode disposed around the active layer of the plurality of light emitting structures and under the first bonding pad.

According to the embodiment, wherein the second electrode may be in contact with an upper surface of the second conductivity type reflective layer of the plurality of light emitting structures.

The laser diode according to the embodiment may further comprise a second insulating layer disposed between the first electrode and the second electrode.

According to the embodiment, wherein the second insulating layer may provide a plurality of first openings and a plurality of second openings disposed under the first bonding pad, wherein the first bonding pad and the first electrode may be electrically connected through the plurality of first openings provided in the second insulating layer, and wherein the second conductivity type reflective layer of the plurality of light emitting structures and the second electrode may be electrically connected through the plurality of second openings provided in the second insulating layer.

According to the embodiment, wherein the second insulating layer may provide a plurality of openings disposed under the second bonding pad, and wherein the second conductivity type reflective layer of the plurality of light emitting structures and the second electrode may be electrically connected through the plurality of openings provided in the second insulating layer.

According to the embodiment, wherein the second electrode may comprise an upper electrode disposed in contact with an upper surface of the second conductivity type reflective layer of the plurality of light emitting structures, and a connection electrode disposed on the first electrode between the plurality of the light emitting structures.

According to the embodiment, wherein the substrate may be provided of an intrinsic semiconductor substrate.

According to the embodiment, wherein a reflectance of the first conductivity type reflective layer may be provided to be smaller than a reflectance of the second conductivity type reflective layer.

A semiconductor device according to an embodiment may comprise a first light emitting structure disposed in a first region, and comprising a first reflective layer of a first conductivity type, a first active layer disposed on the first reflective layer, and a second reflective layer of a second conductivity type disposed on the first active layer; a second light emitting structure disposed in a second region and spaced apart from the first light emitting structure, and comprising a third reflective layer of the first conductivity type, a second active layer disposed on the third reflective layer, and a fourth reflective layer of the second conductivity type disposed on the second active layer; a first electrode disposed in the first region and the second region, and electrically connected with the first reflective layer and the third reflective layer, providing a first opening disposed on the first reflective layer and exposing the first active layer and the second reflective layer, and providing a second opening disposed on the third reflective layer and exposing the second active layer and the fourth reflective layer; a second electrode disposed in the first region and electrically connected with the second reflective layer, disposed in the second region and electrically connected with the fourth reflective layer, and providing a third opening exposing the first electrode disposed around the first active layer in the first region; a first insulating layer disposed on the second electrode in the first region and the second region, providing a fourth opening exposing the first electrode disposed in a region the third opening is provided, in the first region, and providing a fifth opening exposing the second electrode disposed around the second active layer in the second region; a first bonding pad disposed on the first light emitting structure in the first region, and electrically connected with the first electrode disposed around the first active layer through a region the fourth opening is provided; and a second bonding pad disposed on the second light emitting structure in the second region, spaced apart from the first bonding pad, and electrically connected with the second electrode disposed around the second active layer through a region the fifth opening is provided.

According to the embodiment, wherein an area of the fourth opening may be greater than or equal to an area of the first active layer, and an area of the fifth opening may be greater than or equal to an area of the second active layer.

According to the embodiment, wherein a first plurality of light emitting structures comprising the first light emitting structure may be disposed under the first bonding pad, wherein a second plurality of light emitting structures comprising the second light emitting structure may be disposed under the second bonding pad, and wherein the first plurality of light emitting structures and the second plurality of light emitting structures each may comprise a first conductivity type reflective layer, an active layer disposed on the first conductivity type reflective layer, and a second conductivity type reflective layer disposed on the active layer.

According to the embodiment, wherein the second electrode may be provided in contact with an upper surface of the second conductivity type reflective layer of the first plurality of light emitting structures, and may be provided in contact with an upper surface of the second conductivity type reflective layer of the second plurality of light emitting structures.

According to the embodiment, wherein the second electrode may be disposed between the first plurality of light emitting structures and the first bonding pad in the first region, wherein the second electrode may be disposed between the second plurality of light emitting structures and the second bonding pad in the second region, wherein the second electrode may provide a plurality of openings exposing an upper surface of the first electrode and may be electrically connected with the second reflective layer of the first plurality of light emitting structures, under the first bonding pad, and wherein the second electrode may be electrically connected with the second reflective layer of the second plurality of light emitting structures, under the second bonding pad.

According to the embodiment, the semiconductor device may further comprise a second insulating layer disposed between the first electrode and the second electrode, wherein the second insulating layer may provide a plurality of openings in which the second conductivity type reflective layer of the first plurality of light emitting structures and the second electrode are electrically connected, under the first bonding pad, and wherein the second insulating layer may provide a plurality of openings in which the second conductivity type reflective layer of the second plurality of light emitting structures and the second electrode are electrically connected, under the second bonding pad.

According to the embodiment, wherein the first electrode may be disposed between the first plurality of light emitting structures and the first bonding pad in the first region, wherein the first electrode may be disposed between the second plurality of light emitting structures and the second bonding pad in the second region, wherein the first electrode may provide a plurality of openings exposing the second conductivity type reflective layer of the first plurality of light emitting structures, and may be electrically connected with the first conductivity type reflective layer of the first plurality of light emitting structures, under the first bonding pad, and wherein the first electrode may provide a plurality of openings exposing the second conductivity type reflective layer of the second plurality of light emitting structures, and may be electrically connected with the first conductivity type reflective layer of the second plurality of light emitting structures, under the second bonding pad.

According to the embodiment, wherein the second electrode may comprise an upper electrode disposed in contact with an upper surface of the second reflective layer and an upper surface of the fourth reflective layer, and a connection electrode disposed on the first electrode between the first light emitting structure and the second light emitting structure.

According to the embodiment, the semiconductor device may further comprise a first conductivity type reflective layer that physically connects the first reflective layer and the third reflective layer, and wherein the first electrode may be disposed in contact with an upper surface of the first conductivity type reflective layer.

The semiconductor device according to the embodiment may further comprise a substrate disposed under the first light emitting structure and the second light emitting structure, and wherein the substrate may be provided of an intrinsic semiconductor substrate.

According to the embodiment, wherein a reflectance of the first reflective layer may be smaller than a reflectance of the second reflective layer, and a reflectance of the third reflective layer may be provided to be smaller than a reflectance of the fourth reflective layer.

According to the embodiment, wherein the first insulating layer may provide a plurality of fifth openings in which the second bonding pad and the second electrode are electrically connected, in the second region, and wherein the plurality of fifth openings may be provided more in regions located close to the first bonding pad than in regions far from the first bonding pad, under the second bonding pad.

According to the embodiment, wherein the first insulating layer may provide a plurality of fourth openings in which the first bonding pad and the first electrode are electrically connected, in the first region, and wherein the plurality of fourth openings may be provided more in regions located close to the second bonding pad than in regions far from the second bonding pad, under the first bonding pad.

According to the embodiment, wherein a region of an upper surface of the first electrode, which is in contact with a lower surface of the first bonding pad through the fourth opening, may be provided in a space surrounded by the first plurality of light emitting structures.

According to the embodiment, wherein an area of an upper surface of the first electrode contacting a lower surface of the first bonding pad may be provided to be larger than an area of an upper surface of the first active layer.

According to the embodiment, wherein a region of an upper surface of the second electrode, which is in contact with a lower surface of the second bonding pad through the fifth opening, may be provided in a space surrounded by the second plurality of light emitting structures.

According to the embodiment, wherein an area of an upper surface of the second electrode contacting a lower surface of the second bonding pad may be provided to be larger than an area of an upper surface of the second active layer.

A semiconductor device package according to an embodiment may comprise a submount: and a semiconductor device disposed on the submount, wherein the semiconductor device may comprise a first light emitting structure disposed in a first region, and comprising a first reflective layer of a first conductivity type, a first active layer disposed on the first reflective layer, and a second reflective layer of a second conductivity type disposed on the first active layer; a second light emitting structure disposed in a second region and spaced apart from the first light emitting structure, and comprising a third reflective layer of the first conductivity type, a second active layer disposed on the third reflective layer, and a fourth reflective layer of the second conductivity type disposed on the second active layer; a first electrode disposed in the first region and the second region, and electrically connected with the first reflective layer and the third reflective layer, providing a first opening disposed on the first reflective layer and exposing the first active layer and the second reflective layer, and providing a second opening disposed on the third reflective layer and exposing the second active layer and the fourth reflective layer; a second electrode disposed in the first region and electrically connected with the second reflective layer, disposed in the second region and electrically connected with the fourth reflective layer, and providing a third opening exposing the first electrode disposed around the first active layer in the first region; a first insulating layer disposed on the second electrode in the first region and the second region, providing a fourth opening exposing the first electrode disposed in a region the third opening is provided, in the first region, and providing a fifth opening exposing the second electrode disposed around the second active layer in the second region; a first bonding pad disposed on the first light emitting structure in the first region, and electrically connected with the first electrode disposed around the first active layer through a region the fourth opening is provided; and a second bonding pad disposed on the second light emitting structure in the second region, spaced apart from the first bonding pad, and electrically connected with the second electrode disposed around the second active layer through a region the fifth opening is provided, wherein the semiconductor device may comprise a first surface on which the first bonding pad and the second bonding pad are disposed, and a second surface opposite to the first surface, and wherein the first bonding pad and the second bonding pad may be electrically connected to the submount, and light generated in the semiconductor device may be emitted to the outside through the second surface.

An object detecting apparatus according to an embodiment may comprise a semiconductor device package and a light receiving unit receiving reflected light of light emitted from the semiconductor device package, wherein the semiconductor device package may comprise a submount and a semiconductor device disposed on the submount, wherein the semiconductor device may comprise a first light emitting structure disposed in a first region, and comprising a first reflective layer of a first conductivity type, a first active layer disposed on the first reflective layer, and a second reflective layer of a second conductivity type disposed on the first active layer; a second light emitting structure disposed in a second region and spaced apart from the first light emitting structure, and comprising a third reflective layer of the first conductivity type, a second active layer disposed on the third reflective layer, and a fourth reflective layer of the second conductivity type disposed on the second active layer; a first electrode disposed in the first region and the second region, and electrically connected with the first reflective layer and the third reflective layer, providing a first opening disposed on the first reflective layer and exposing the first active layer and the second reflective layer, and providing a second opening disposed on the third reflective layer and exposing the second active layer and the fourth reflective layer; a second electrode disposed in the first region and electrically connected with the second reflective layer, disposed in the second region and electrically connected with the fourth reflective layer, and providing a third opening exposing the first electrode disposed around the first active layer in the first region; a first insulating layer disposed on the second electrode in the first region and the second region, providing a fourth opening exposing the first electrode disposed in a region the third opening is provided, in the first region, and providing a fifth opening exposing the second electrode disposed around the second active layer in the second region; a first bonding pad disposed on the first light emitting structure in the first region, and electrically connected with the first electrode disposed around the first active layer through a region the fourth opening is provided; and a second bonding pad disposed on the second light emitting structure in the second region, spaced apart from the first bonding pad, and electrically connected with the second electrode disposed around the second active layer through a region the fifth opening is provided, wherein the semiconductor device may comprise a first surface on which the first bonding pad and the second bonding pad are disposed, and a second surface opposite to the first surface, and wherein the first bonding pad and the second bonding pad may be electrically connected to the submount, and light generated in the semiconductor device may be emitted to the outside through the second surface.

A method of manufacturing a semiconductor device according to an embodiment may comprise forming a first conductivity type reflective layer, an active layer, and a second conductivity type reflective layer on a substrate; performing a mesa etching on the second conductivity type reflective layer and the active layer, and forming a plurality of light emitting structures spaced apart from each other; forming a first electrode on the first conductivity type reflective layer to expose the plurality of light emitting structures; forming a first insulating layer disposed on the first electrode and exposing an upper surface of the plurality of light emitting structures; forming a second electrode providing a first opening exposing a portion of an upper surface of the first insulating layer, and comprising an upper electrode disposed in contact with an upper surface of the plurality of light emitting structures exposed by the first insulating layer and a connection electrode disposed on the first insulating layer and connecting the upper electrode; forming a second insulating layer disposed on the second electrode, providing a second opening exposing a portion of the upper surface of the first electrode while formed in a region the first opening is provided, and providing a third opening exposing a portion of an upper surface of the second electrode; and forming a first bonding pad disposed on the second opening and electrically connected to the first electrode, and a second bonding pad disposed on the third opening and electrically connected to the second electrode.

A laser diode according to an embodiment may comprise a substrate; a first conductivity type reflective layer disposed on the substrate; a plurality of light emitting structures, each light emitting structure comprising an active layer and a second conductivity type reflective layer, which are disposed on the first conductivity type reflective layer; a first electrode electrically connected with the first conductivity type reflective layer; a second electrode electrically connected with the second conductivity type reflective layer; a first insulating layer disposed on the first electrode and providing an opening; a first bonding pad disposed on the plurality of light emitting structures and electrically connected with the first electrode; and a second bonding pad disposed on the plurality of light emitting structures and spaced apart from the first bonding pad, and electrically connected with the second electrode, wherein the laser diode may comprise a first region in which the first bonding pad is disposed; a second region in which the second bonding pad is disposed; and wherein the opening of the first insulating layer may be disposed in the first region and the second region, and disposed between the plurality of light emitting structures, and the shortest distance between the openings may be provided smaller than the shortest distance between the light emitting structures.

According to the embodiment, wherein the first electrode may be disposed under the first bonding pad and under the second bonding pad, and may providing a plurality of openings exposing the active layer and the second conductivity type reflective layer of the plurality of light emitting structures.

According to the embodiment, wherein the second electrode may be disposed under the first bonding pad and under the second bonding pad, and may providing a plurality of openings exposing the first electrode disposed around the active layer of the plurality of light emitting structures, under the first bonding pad.

According to the embodiment, wherein the second electrode may be in contact with an upper surface of the second conductivity type reflective layer of the plurality of light emitting structures.

The laser diode according to the embodiment may further comprise a second insulating layer disposed between the first electrode and the second electrode.

According to the embodiment, wherein the second insulating layer may provide a plurality of first openings and a plurality of second openings disposed under the first bonding pad, wherein the first bonding pad and the first electrode may be electrically connected through the plurality of the first openings provided in the second insulating layer, and wherein the second conductivity type reflective layer of the plurality of light emitting structures and the second electrode may be electrically connected through the plurality of second openings provided in the second insulating layer.

According to the embodiment, wherein the second insulating layer may provide a plurality of openings disposed under the second bonding pad, and wherein the second conductivity type reflective layer of the plurality of light emitting structures and the second electrode may be electrically connected through the plurality of openings provided in the second insulating layer.

According to the embodiment, wherein the second electrode may comprise an upper electrode disposed in contact with an upper surface of the second conductivity type reflective layer of the plurality of light emitting structures, and a connection electrode disposed on the first electrode between the plurality of light emitting structures.

According to the embodiment, wherein the substrate may be provided of an intrinsic semiconductor substrate.

According to the embodiment, wherein a reflectance of the first conductivity type reflective layer may be smaller than a reflectance of the second conductivity type reflective layer.

A semiconductor device according to an embodiment may comprise a first light emitting structure disposed in a first region, and comprising a first reflective layer of a first conductivity type, a first active layer disposed on the first reflective layer, and a second reflective layer of a second conductivity type disposed on the first active layer; a second light emitting structure disposed in a second region and spaced apart from the first light emitting structure, and comprising a third reflective layer of the first conductivity type, a second active layer disposed on the third reflective layer, and a fourth reflective layer of the second conductivity type disposed on the second active layer; a first electrode disposed in the first region and the second region, and electrically connected with the first reflective layer and the third reflective layer, providing a first opening disposed on the first reflective layer and exposing the first active layer and the second reflective layer, and providing a second opening disposed on the third reflective layer and exposing the second active layer and the fourth reflective layer; a second electrode disposed in the first region and electrically connected with the second reflective layer, disposed in the second region and electrically connected with the fourth reflective layer, and providing a third opening exposing the first electrode disposed around the first active layer in the first region, and comprising an area smaller than an area of the first active area; a first insulating layer disposed on the second electrode in the first region and the second region, providing a fourth opening exposing the first electrode disposed in a region the third opening is provided, in the first region, and providing a fifth opening exposing the second electrode disposed around the second active layer in the second region, and comprising an area smaller than an area of the second active area; a first bonding pad disposed on the first light emitting structure in the first region, and electrically connected with the first electrode disposed around the first active layer through a region the fourth opening is provided; and a second bonding pad disposed on the second light emitting structure in the second region, spaced apart from the first bonding pad, and electrically connected with the second electrode disposed around the second active layer through a region the fifth opening is provided.

According to the embodiment, wherein a first plurality of light emitting structures comprising the first light emitting structure may be disposed under the first bonding pad, wherein a second plurality of light emitting structures comprising the second light emitting structure may be disposed under the second bonding pad, and wherein the first plurality of light emitting structures and the second plurality of light emitting structures each may comprise a first conductivity type reflective layer, an active layer disposed on the first conductivity type reflective layer, and a second conductivity type reflective layer disposed on the active layer.

According to the embodiment, wherein the second electrode may be provided in contact with an upper surface of the second conductivity type reflective layer of the first plurality of light emitting structures, and may be provided in contact with an upper surface of the second conductivity type reflective layer of the second plurality of light emitting structures.

According to the embodiment, wherein the second electrode may be disposed between the first plurality of light emitting structures and the first bonding pad in the first region, wherein the second electrode may be disposed between the second plurality of light emitting structures and the second bonding pad in the second region, wherein the second electrode may provide a plurality of openings exposing an upper surface of the first electrode and may be electrically connected with the second reflective layer of the first plurality of light emitting structures, under the first bonding pad, and wherein the second electrode may be electrically connected with the second reflective layer of the second plurality of light emitting structures, under the second bonding pad.

The semiconductor device according to the embodiment may further comprise a second insulating layer disposed between the first electrode and the second electrode, wherein the second insulating layer may provide a plurality of openings in which the second conductivity type reflective layer of the first plurality of light emitting structures and the second electrode are electrically connected, under the first bonding pad, and wherein the second insulating layer may provide a plurality of openings in which the second conductivity type reflective layer of the second plurality of light emitting structures and the second electrode are electrically connected, under the second bonding pad.

According to the embodiment, wherein the first electrode may be disposed between the first plurality of light emitting structures and the first bonding pad in the first region, wherein the first electrode may be disposed between the second plurality of light emitting structures and the second bonding pad in the second region, wherein the first electrode may provide a plurality of openings exposing the second conductivity type reflective layer of the first plurality of light emitting structures, and may be electrically connected with the first conductivity type reflective layer of the first plurality of light emitting structures, under the first bonding pad, and wherein the first electrode may provide a plurality of openings exposing the second conductivity type reflective layer of the second plurality of light emitting structures, and may be electrically connected with the first conductivity type reflective layer of the second plurality of light emitting structures, under the second bonding pad.

According to the embodiment, wherein the second electrode may comprise an upper electrode disposed in contact with an upper surface of the second reflective layer and an upper surface of the fourth reflective layer, and may disposed on the first electrode between the first light emitting structure and the second light emitting structure.

The semiconductor device according to the embodiment may further comprise a first conductivity type reflective layer that physically connects the first reflective layer and the third reflective layer, and wherein the first electrode may be disposed in contact with an upper surface of the first conductivity type reflective layer.

The semiconductor device according to the embodiment may further comprise a substrate disposed under the first light emitting structure and the second light emitting structure, and the substrate may be provided of an intrinsic semiconductor substrate.

According to the embodiment, wherein a reflectance of the first reflective layer may be smaller than a reflectance of the second reflective layer, and a reflectance of the third reflective layer may be provided to be smaller than a reflectance of the fourth reflective layer.

According to the embodiment, wherein a region of an upper surface of the first electrode, which is in contact with a lower surface of the first bonding pad through the fourth opening, may be provided in a space surrounded by the first plurality of light emitting structures.

According to the embodiment, wherein a region of an upper surface of the second electrode, which is in contact with a lower surface of the second bonding pad through the fifth opening, may be provided in a space surrounded by the second plurality of light emitting structures.

A semiconductor device package according to an embodiment may comprise a submount: and a semiconductor device disposed on the submount, wherein the semiconductor device may comprise a first light emitting structure disposed in a first region, and comprising a first reflective layer of a first conductivity type, a first active layer disposed on the first reflective layer, and a second reflective layer of a second conductivity type disposed on the first active layer; a second light emitting structure disposed in a second region and spaced apart from the first light emitting structure, and comprising a third reflective layer of the first conductivity type, a second active layer disposed on the third reflective layer, and a fourth reflective layer of the second conductivity type disposed on the second active layer; a first electrode disposed in the first region and the second region, and electrically connected with the first reflective layer and the third reflective layer, providing a first opening disposed on the first reflective layer and exposing the first active layer and the second reflective layer, and providing a second opening disposed on the third reflective layer and exposing the second active layer and the fourth reflective layer; a second electrode disposed in the first region and electrically connected with the second reflective layer, disposed in the second region and electrically connected with the fourth reflective layer, and providing a third opening exposing the first electrode disposed around the first active layer in the first region, and comprising an area smaller than an area of the first active area; a first insulating layer disposed on the second electrode in the first region and the second region, providing a fourth opening exposing the first electrode disposed in a region the third opening is provided, in the first region, and providing a fifth opening exposing the second electrode disposed around the second active layer in the second region, and comprising an area smaller than an area of the second active area; a first bonding pad disposed on the first light emitting structure in the first region, and electrically connected with the first electrode disposed around the first active layer through a region the fourth opening is provided; and a second bonding pad disposed on the second light emitting structure in the second region, spaced apart from the first bonding pad, and electrically connected with the second electrode disposed around the second active layer through a region the fifth opening is provided, wherein the semiconductor device may comprise a first surface on which the first bonding pad and the second bonding pad are disposed, and a second surface opposite to the first surface, and wherein the first bonding pad and the second bonding pad may be electrically connected to the submount, and light generated in the semiconductor device may be emitted to the outside through the second surface.

An object detecting apparatus according to an embodiment may comprise a semiconductor device package and a light receiving unit receiving reflected light of light emitted from the semiconductor device package, wherein the semiconductor device package may comprise a submount and a semiconductor device disposed on the submount, wherein the semiconductor device may comprise a first light emitting structure disposed in a first region, and comprising a first reflective layer of a first conductivity type, a first active layer disposed on the first reflective layer, and a second reflective layer of a second conductivity type disposed on the first active layer; a second light emitting structure disposed in a second region and spaced apart from the first light emitting structure, and comprising a third reflective layer of the first conductivity type, a second active layer disposed on the third reflective layer, and a fourth reflective layer of the second conductivity type disposed on the second active layer; a first electrode disposed in the first region and the second region, and electrically connected with the first reflective layer and the third reflective layer, providing a first opening disposed on the first reflective layer and exposing the first active layer and the second reflective layer, and providing a second opening disposed on the third reflective layer and exposing the second active layer and the fourth reflective layer; a second electrode disposed in the first region and electrically connected with the second reflective layer, disposed in the second region and electrically connected with the fourth reflective layer, and providing a third opening exposing the first electrode disposed around the first active layer in the first region, and comprising an area smaller than an area of the first active area; a first insulating layer disposed on the second electrode in the first region and the second region, providing a fourth opening exposing the first electrode disposed in a region the third opening is provided, in the first region, and providing a fifth opening exposing the second electrode disposed around the second active layer in the second region, and comprising an area smaller than an area of the second active area; a first bonding pad disposed on the first light emitting structure in the first region, and electrically connected with the first electrode disposed around the first active layer through a region the fourth opening is provided; and a second bonding pad disposed on the second light emitting structure in the second region, spaced apart from the first bonding pad, and electrically connected with the second electrode disposed around the second active layer through a region the fifth opening is provided, wherein the semiconductor device may comprise a first surface on which the first bonding pad and the second bonding pad are disposed, and a second surface opposite to the first surface, and wherein the first bonding pad and the second bonding pad may be electrically connected to the submount, and light generated in the semiconductor device may be emitted to the outside through the second surface.

A method of manufacturing a semiconductor device according to an embodiment may comprise forming a first conductivity type reflective layer, an active layer, and a second conductivity type reflective layer on a substrate; performing a mesa etching on the second conductivity type reflective layer and the active layer, and forming a plurality of light emitting structures spaced apart from each other; forming a first electrode on the first conductivity type reflective layer to expose the plurality of light emitting structures; forming a first insulating layer disposed on the first electrode and exposing an upper surface of the plurality of light emitting structures; forming a second electrode providing a first opening exposing a portion of an upper surface of the first insulating layer, and comprising an upper electrode disposed in contact with an upper surface of the plurality of light emitting structures exposed by the first insulating layer and a connection electrode disposed on the first insulating layer and connecting the upper electrode; forming a second insulating layer disposed on the second electrode, providing a second opening exposing a portion of the upper surface of the first electrode while formed in a region the first opening is provided and having an area smaller than an area of the active layer, and providing a third opening exposing a portion of an upper surface of the second electrode and having an area smaller than an area of the active layer; and forming a first bonding pad disposed on the second opening and electrically connected to the first electrode, and a second bonding pad disposed on the third opening and electrically connected to the second electrode.

Advantageous Effects

According to the semiconductor device, the method of manufacturing the semiconductor device, the semiconductor device package, and the object detecting apparatus, there is an advantage that an excellent heat dissipation characteristic can be provided.

According to the semiconductor device, the method of manufacturing the semiconductor device, the semiconductor device package, and the object detecting apparatus, there is an advantage that the light extraction efficiency can be enhanced and light of high output can be provided.

According to the semiconductor device, the method of manufacturing the semiconductor device, the semiconductor device package, and the object detecting apparatus, there is an advantage that the power conversion efficiency can be improved.

According to the semiconductor device, the method of manufacturing the semiconductor device, the semiconductor device package, and the object detecting apparatus, there is an advantage that the manufacturing cost can be reduced and the reliability can be improved.

DESCRIPTION OF DRAWINGS

FIG. 1 is a view showing a semiconductor device according to an embodiment of the present invention.

FIG. 2 is a view showing a region A1 of the semiconductor device shown in FIG. 1.

FIG. 3 is a sectional view taken along line A-A of the semiconductor device shown in FIG. 2.

FIG. 4 is a view showing a region B1 of the semiconductor device shown in FIG. 1.

FIG. 5 is a sectional view taken along line B-B of the semiconductor device shown in FIG. 4.

FIG. 6 is a view explaining a contact region between a bonding pad and an electrode in the semiconductor device according to the embodiment of the present invention.

FIG. 7 is a view showing an example of a conventional semiconductor device.

FIGS. 8a to 8c are views showing an example in which a light emitting structure is formed in a method of manufacturing a semiconductor device according to an embodiment of the present invention.

FIGS. 9a to 9c are views showing an example in which a first electrode is formed in the method of manufacturing the semiconductor device according to the embodiment of the present invention.

FIGS. 10a to 10c are views showing an example in which a second insulating layer is formed in the method of manufacturing the semiconductor device according to the embodiment of the present invention.

FIGS. 11a to 11c are views showing an example in which a second electrode is formed in the method of manufacturing the semiconductor device according to the embodiment of the present invention.

FIGS. 12a to 12c are views showing an example in which a third insulating layer is formed in the method of manufacturing the semiconductor device according to the embodiment of the present invention.

FIGS. 13a to 13c are views showing an example in which a first bonding pad and a second bonding pad are formed in the method of manufacturing the semiconductor device according to the embodiment of the present invention.

FIG. 14 is a view showing another example of a semiconductor device according to an embodiment of the present invention.

FIG. 15 is a view showing shapes of the third insulating layer, the first bonding pad, and the second bonding pad applied to the semiconductor device shown in FIG. 14.

FIG. 16 is a view showing another example of a semiconductor device according to an embodiment of the present invention.

FIG. 17 is a view showing shapes of the third insulating layer, the first bonding pad, and the second bonding pad applied to the semiconductor device shown in FIG. 16.

FIG. 18 is a view showing still another example of a semiconductor device according to an embodiment of the present invention.

FIG. 19 is a view showing a region A2 of the semiconductor device shown in FIG. 18.

FIG. 20 is a sectional view taken along line A-A of the semiconductor device shown in FIG. 19.

FIG. 21 is a view showing a region B2 of the semiconductor device shown in FIG. 18.

FIG. 22 is a sectional view taken along line B-B of the semiconductor device shown in FIG. 21.

FIG. 23 is a view explaining a contact area between a bonding pad and an electrode in the semiconductor device according to the embodiment of the present invention.

FIGS. 24a to 24c are views showing an example in which a light emitting structure is formed in a method of manufacturing a semiconductor device according to an embodiment of the present invention.

FIGS. 25a to 25c are views showing an example in which a first electrode is formed in the method of manufacturing the semiconductor device according to the embodiment of the present invention.

FIGS. 26a to 26c are views showing an example in which a second insulating layer is formed in the method of manufacturing the semiconductor device according to the embodiment of the present invention.

FIGS. 27a to 27c are views showing an example in which a second electrode is formed in the method of manufacturing the semiconductor device according to the embodiment of the present invention.

FIGS. 28a to 28c are views showing an example in which a third insulating layer is formed in the method of manufacturing the semiconductor device according to the embodiment of the present invention.

FIGS. 29a to 29c are views showing an example in which a first bonding pad and a second bonding pad are formed in the method of manufacturing the semiconductor device according to the embodiment of the present invention.

FIG. 30 is a view showing a semiconductor device package according to an embodiment of the present invention.

FIG. 31 is a perspective view of a mobile terminal to which an autofocus device comprising a semiconductor device package according to an embodiment of the present invention is applied.

MODE FOR INVENTION

Hereinafter, embodiments will be described with reference to the accompanying drawings. In the description of the embodiments, in the case that each layer (film), region, pattern or structure may be referred to as provided "on/over" or "under" a substrate, each layer (film), region, pad, or pattern, the terms "on/over" and "under" include both "directly" and "indirectly interposed with another layer". In addition, "on/over" or "under" of each layer will be described based on the drawings, but the embodiments are not limited thereto.

Hereinafter, a semiconductor device, a method of manufacturing a semiconductor device, a semiconductor device package, and an object detecting apparatus comprising a semiconductor device package according to an embodiment of the present invention will be described in detail with reference to the accompanying drawings.

The semiconductor device according to an embodiment of the present invention may be selected from a light emitting device comprising a light emitting diode device and a laser diode device. For example, a semiconductor device according to an embodiment may be a vertical cavity surface emitting laser (VCSEL) semiconductor device. A vertical cavity surface emitting laser (VCSEL) semiconductor devices can emit beams in a direction perpendicular to an upper surface. A vertical cavity surface emitting laser (VCSEL) semiconductor devices can emit beams, for example, at a beam angle in a range of about 15 degrees to about 25 degrees. A vertical cavity surface emitting laser (VCSEL) semiconductor devices may comprise a single light emitting aperture or multiple light emitting apertures that emit a circular beam. The light emitting aperture may be provided of a diameter in a range of several micrometers to several tens of micrometers, for example.

Hereinafter, a semiconductor device according to an embodiment of the present invention will be described with reference to FIGS. 1 to 5.

FIG. 1 is a view showing a semiconductor device according to an embodiment of the present invention, FIG. 2 is a view showing a region A1 of the semiconductor device shown in FIG. 1, and FIG. 3 is a sectional view taken along line A-A of the semiconductor device shown in FIG. 2, FIG. 4 is a view showing a region B1 of the semiconductor device shown in FIG. 1, and FIG. 5 is a sectional view taken along line B-B of the semiconductor device shown in FIG. 4.

Meanwhile, in order to facilitate understanding, in FIGS. 1, 2, and 4, the first bonding pad 155 and the second bonding pad 165 disposed on an upper portion are treated as transparent so that the arrangement relationship of the components positioned in a lower portion can be easily grasped.

As shown in FIGS. 1 to 5, the semiconductor device 200 according to the embodiment of the present invention may comprise a plurality of light emitting structures P11, P12, P21, P22, . . . , a first electrode 150, a second electrode 160, the first bonding pad 155, and the second bonding pad 165.

The semiconductor device 200 according to the embodiment may be a vertical cavity surface emitting laser (VCSEL), and may emit light generated in the plurality of light emitting structures P11, P12, P21, P22, . . . , for example, at a beam angle in a range of about 15 degrees to about 25 degrees. The plurality of light emitting structures P11, P12, P21, P22, . . . may comprise a first plurality of light emitting structures P11, P12, P13, P14, P15, P16, . . . , disposed under the first bonding pad 155, and a second plurality of light emitting structures P21, P22, P23, P24, P25, P26, . . . disposed under the second bonding pad 165.

Each of the plurality of light emitting structures P11, P12, P21, P22, . . . may comprise a first conductivity type reflective layer, an active layer, and a second conductivity type reflective layer. For example, the reflective layer may be provided of a Distributed Bragg Reflector (DBR) layer. Each of the plurality of light emitting structures P11, P12, P21, P22, . . . may be formed in a similar structure, and a stacked structure of the semiconductor device 200 according to the embodiment will be described with reference to cross sections shown in FIGS. 3 and 5.

As shown in FIGS. 1 to 5, the semiconductor device 200 according to the embodiment may comprise a first bonding pad 155 disposed in a first region and a second bonding pad 165 disposed in a second region. The first bonding pad 155 and the second bonding pad 165 may be spaced apart from each other.

In addition, as shown in FIGS. 1 to 3, the semiconductor device 200 according to the embodiment may comprise a first plurality of light emitting structures P11, P12, P13, P14, P15, P16, . . . disposed in the first region. The first plurality of light emitting structures P11, P12, P13, P14, P15, P16, . . . may be disposed under the first bonding pad 155. The first plurality of light emitting structures P11, P12, P13, P14, P15, P16, . . . may be spaced apart from each other.

Each of the first plurality of light emitting structures P11, P12, P13, P14, P15, P16, . . . may comprise a first conductivity type reflective layer, an active layer disposed on the first conductivity type reflective layer, and a second conductivity type reflective layer disposed on the active layer.

The first conductivity type reflective layer of the first plurality of light emitting structures P11, P12, P13, P14, P15, P16, . . . may be referred to as a lower reflective layer. Also, the second conductivity type reflective layer of the first plurality of light emitting structures P11, P12, P13, P14, P15, P16, . . . may be referred to as an upper reflective layer.

At this time, the first conductivity type reflective layers constituting the first plurality of light emitting structures P11, P12, P13, P14, P15, P16, . . . may be electrically connected to each other. Also, the first conductivity type reflective layers constituting the first plurality of light emitting structures P11, P12, P13, P14, P15, P16, . . . may be provided to be physically connected to each other.

The active layers constituting the first plurality of light emitting structures P11, P12, P13, P14, P15, P16, . . . may be spaced apart from each other.

The second conductivity type reflective layers constituting the first plurality of light emitting structures P11, P12, P13, P14, P15, P16, . . . may be spaced apart from each other. The second conductivity type reflective layers constituting the first plurality of light emitting structures P11, P12, P13, P14, P15, P16, . . . may be electrically connected to each other.

In addition, as shown in FIGS. 1, 4, and 5, the semiconductor device 200 according to the embodiment may comprise a second plurality of light emitting structures P21, P22, P23, P24, P25, P26, . . . disposed in the second region. The second plurality of light emitting structures P21, P22, P23, P24, P25, P26, . . . may be disposed under the second bonding pad 165. The second plurality of light emitting structures P21, P22, P23, P24, P25, P26, . . . may be spaced apart from each other.

Each of the second plurality of light emitting structures P21, P22, P23, P24, P25, P26, . . . may comprise a first conductivity type reflective layer, an active layer disposed on the first conductivity type reflective layer, and a second conductivity type reflective layer disposed on the active layer.

The first conductivity type reflective layer of the second plurality of light emitting structures P21, P22, P23, P24, P25, P26, . . . may be referred to as a lower reflective layer. The second conductivity type reflective layer of the second plurality of light emitting structures P21, P22, P23, P24, P25, P26, . . . may be referred to as an upper reflective layer.

At this time, the first conductivity type reflective layers constituting the second plurality of light emitting structures P21, P22, P23, P24, P25, P26, . . . may be electrically connected to each other. Also, the first conductivity type reflective layers constituting the second plurality of light emitting structures P21, P22, P23, P24, P25, P26, . . . may be provided to be physically connected to each other.

In addition, the first conductivity type reflective layers constituting the second plurality of light emitting structures P21, P22, P23, P24, P25, P26, P26, . . . may be electrically connected to the first conductivity type reflective layers constituting the first plurality of light emitting structures P11, P12, P13, P14, P15, P16, . . . . The first conductivity type reflective layers constituting the second plurality of light emitting structures P21, P22, P23, P24, P25, P26, P26, . . . may be provided to be physically connected to the first conductivity type reflective layers constituting the first plurality of light emitting structures P11, P12, P13, P14, P15, P16, . . . .

The active layers constituting the second plurality of light emitting structures P21, P22, P23, P24, P25, P26, . . . may be spaced apart from each other. Also, the active layers constituting the second plurality of light emitting structures P21, P22, P23, P24, P25, P26, . . . may be spaced apart from the active layers constituting the first plurality of light emitting structures P11, P12, P13, P14, P15, P16, . . . each other.

The second conductivity type reflective layers constituting the second plurality of light emitting structures P21, P22, P23, P24, P25, P26, . . . may be spaced apart from each other. Also, the second conductivity type reflective layers constituting the second plurality of light emitting structures P21, P22, P23, P24, P25, P26, . . . may be electrically connected to each other.

In addition, the second conductivity type reflective layers constituting the second plurality of light emitting structures P21, P22, P23, P24, P25, P26, . . . may be spaced apart from the second conductivity type reflective layers constituting the first plurality of light emitting structures P11, P12, P13, P14, P15, P16, . . . each other, The second conductivity type reflective layers constituting the second plurality of light emitting structures P21, P22, P23, P24, P25, P26, P26, . . . may be electrically connected to the second conductivity type reflective layers constituting the first plurality of light emitting structures P11, P12, P13, P14, P15, P16, . . . each other.

The first bonding pad 155 and the second bonding pad 165 may be spaced apart from each other. The first bonding pad 155 may be electrically connected to the first electrode 150. The first electrode 150 may be disposed under the first bonding pad 155.

For example, a lower surface of the first bonding pad 155 may be disposed in direct contact with an upper surface of the first electrode 150. The first electrode 150 may be electrically connected to the first conductivity type reflective layer of the first plurality of light emitting structures P11, P12, P13, P14, P15, P16, . . . . Also, the first electrode 150 may be electrically connected to the first conductivity type reflective layer of the second plurality of light emitting structures P21, P22, P23, P24, P25, P26, . . . .

The second bonding pad 165 may be electrically connected to the second electrode 160. The second electrode 160 may be disposed under the second bonding pad 165.

For example, a lower surface of the second bonding pad 165 may be disposed in direct contact with an upper surface of the second electrode 160. The second electrode 160 may be electrically connected to the second conductivity type reflective layer of the second plurality of light emitting structures P21, P22, P23, P24, P25, P26, . . . . Also, the second electrode 160 may be electrically connected to the second conductivity type reflective layer of the first plurality of light emitting structures P11, P12, P13, P14, P15, P16 . . . .

According to the embodiment, the first electrode 150 may be disposed both under the first bonding pad 155 and under the second bonding pad 165. The first electrode 150 may be electrically connected with the first bonding pad 155 in a region where the first bonding pad 155 is disposed. The first electrode 150 may be electrically insulated from the second bonding pad 165.

In addition, the second electrode 160 may be disposed both under the first bonding pad 155 and under the second bonding pad 165. The second electrode 160 may be electrically connected with the second bonding pad 165 in a region where the second bonding pad 165 is disposed. The second electrode 160 may be electrically insulated from the first bonding pad 155.

The electrical connection between the first electrode 150 and the first bonding pad 155, and the electrical connection between the second electrode 160 and the second bonding pad 165 will be described later.

Then, referring to FIGS. 2 and 3, the structure of the semiconductor device 200 according to the embodiment will be further described with reference to the first light emitting structure P11 disposed under the first bonding pad 155. FIG. 3 is a sectional view taken along line A-A of the semiconductor device 200 according to the embodiment shown in FIG. 2.

The semiconductor device 200 according to the embodiment may comprise a first light emitting structure P11 disposed under the first bonding pad 155, as shown in FIGS. 2 and 3.

The first light emitting structure P11 may comprise a first reflective layer 110a of a first conductivity type, a second reflective layer 120a of a second conductivity type, and a first active layer 115a. The first active layer 115a may be disposed between the first reflective layer 110a and the second reflective layer 120a. For example, the first active layer 115a may be disposed on the first reflective layer 110a, and the second reflective layer 120a may be disposed on the first active layer 115a. The first light emitting structure P11 may further comprise a first aperture layer 117a disposed between the first active layer 115a and the second reflective layer 120a.

In addition, a first conductivity type reflective layer 113 may be disposed around the first reflective layer 110a of the first light emitting structure P11. The first conductivity type reflective layer 113 may be disposed around the first light emitting structure P11. For example, the first conductivity type reflective layer 113 may be disposed between the first plurality of light emitting structures P11, P12, P13, P14, P15, P16, . . . .

A lower reflective layer of the first plurality of light emitting structures P11, P12, P13, P14, P15, P16, . . . may be physically connected by the first conductivity type reflective layer 113. For example, an upper surface of the first conductivity type reflective layer 113 and an upper surface of the first reflective layer 110a may be disposed on the same horizontal plane. The upper surface of the first conductivity type reflective layer 113 and an upper surface of the lower reflective layer of the first plurality of light emitting structures P11, P12, P13, P14, P15, P16, . . . may be disposed on the same horizontal plane.

Next, with reference to FIGS. 4 and 5, the structure of the semiconductor device 200 according to the embodiment will be further described with reference to a second light emitting structure P21 disposed under the second bonding pad 165. FIG. 5 is a sectional view taken along line B-B of the semiconductor device 200 according to the embodiment shown in FIG. 4.

The semiconductor device 200 according to the embodiment may comprise a second light emitting structure P21 disposed under the second bonding pad 165, as shown in FIGS. 4 and 5.

The second light emitting structure P21 may comprise a third reflective layer 110b of the first conductivity type, a fourth reflective layer 120b of the second conductivity type, and a second active layer 115b. The second active layer 115b may be disposed between the third reflective layer 110b and the fourth reflective layer 120b. For example, the second active layer 115b may be disposed on the third reflective layer 110b, and the fourth reflective layer 120b may be disposed on the second active layer 115b. The second light emitting structure P21 may further comprise a second aperture layer 117b disposed between the second active layer 115b and the fourth reflective layer 120b.

In addition, a first conductivity type reflective layer 113 may be disposed around the third reflective layer 110b of the second light emitting structure P21. The first conductivity type reflective layer 113 may be disposed around the second light emitting structure P21. For example, the first conductivity type reflective layer 113 may be disposed between the second plurality of light emitting structures P21, P22, P23, P24, P25, P26 . . . .

A lower reflective layer of the second plurality of light emitting structures P21, P22, P23, P24, P25, P26, . . . may be physically connected by the first conductivity type reflective layer 113. For example, an upper surface of the first conductivity type reflective layer 113 and an upper surface of the third reflective layer 110b may be disposed on the same horizontal plane. The upper surface of the first conductivity type reflective layer 113 and an upper surface of the lower reflective layer of the second plurality of light emitting structures P21, P22, P23, P24, P25, P26, . . . may be disposed on the same horizontal plane.

In addition, the semiconductor device 200 according to the embodiment may comprise a first insulating layer 141 as shown in FIGS. 3 and 5.

The first insulating layer 141 is not shown in FIGS. 1, 2, and 4 in order to solve the complexity of the drawing and to help understand the structure. Meanwhile, according to a semiconductor device 200 of another embodiment, the first insulating layer 141 may be omitted.

The first insulating layer 141 may be disposed on a side surface of the first light emitting structure P11. The first insulating layer 141 may be disposed to surround the side surface of the first light emitting structure P11.

The first insulating layer 141 may be disposed on a side surface of the upper reflective layer of the first plurality of light emitting structures P11, P12, P13, P14, P15, P16, . . . . The first insulating layer 141 may be disposed to surround the side surfaces of the first plurality of light emitting structures P11, P12, P13, P14, P15, P16 . . . .

The first insulating layer 141 may expose an upper surface of the first light emitting structure P11. The first insulating layer 141 may expose an upper surface of the second reflective layer 120a of the first light emitting structure P11.

The first insulating layer 141 may expose an upper surface of the first plurality of light emitting structures P11, P12, P13, P14, P15, P16, . . . . The first insulating layer 141 may expose an upper surface of the upper reflective layer of the first plurality of light emitting structures P11, P12, P13, P14, P15, P16 . . . .

In addition, the first insulating layer 141 may be disposed on a side surface of the second light emitting structure P21. The first insulating layer 141 may be disposed to surround the side surface of the second light emitting structure P21.

The first insulating layer 141 may be disposed on a side surface of the upper reflective layer of the second plurality of light emitting structures P21, P22, P23, P24, P25, P26, . . . . The first insulating layer 141 may be disposed to surround the side surfaces of the second plurality of the light emitting structures P21, P22, P23, P24, P25, P26, . . . .

The first insulating layer 141 may expose an upper surface of the second light emitting structure P21. The first insulating layer 141 may expose an upper surface of the fourth reflective layer 120b of the second light emitting structure P21.

The first insulating layer 141 may expose an upper surface of the second plurality of light emitting structures P21, P22, P23, P24, P25, P26, . . . . The first insulating layer 141 may expose an upper surface of the upper reflective layer of the second plurality of light emitting structures P21, P22, P23, P24, P25, P26 . . . .

In addition, the semiconductor device 200 according to the embodiment may comprise a first electrode 150, as shown in FIGS. 1 to 5. The first electrode 150 may be disposed around the plurality of light emitting structures P11, P12, P21, P22, . . . .

The first electrode 150 may be disposed around the first plurality of light emitting structures P11, P12, P13, P14, P15, P16, . . . . The first electrode 150 may provide a plurality of first openings h1 exposing the first plurality of light emitting structures P11, P12, P13, P14, P15, P16, . . . . The active layer and the upper reflective layer of the first plurality of light emitting structures P11, P12, P13, P14, P15, P16, . . . may be exposed by the plurality of first openings h1.

In other words, under the first bonding pad 155, the first electrode 150 may provide the plurality of first openings h1 exposing the second conductivity type reflective layer of the first plurality of light emitting structures P11, P12, P13, P14, P15, P16, . . . , and may be electrically connected to the first conductivity type reflective layer of the first plurality of light emitting structures P11, P12, P13, P14, P15, P16, . . . .

In addition, the first electrode 150 may be disposed around the second plurality of light emitting structures P21, P22, P23, P24, P25, P26, . . . . The first electrode 150 may provide a plurality of second openings h2 exposing the second plurality of light emitting structures P21, P22, P23, P24, P25, P26, . . . . The active layer and the upper reflective layer of the second plurality of light emitting structures P21, P22, P23, P24, P25, P26, . . . may be exposed by the plurality of second openings h2.

In other words, under the second bonding pad 165, the first electrode 150 may provide the plurality of second openings h2 exposing the second conductivity type reflective layer of the second plurality of light emitting structures P21, P22, P23, P24, P25, P26, . . . , and may be electrically connected to the first conductivity type reflective layer of the second plurality of light emitting structures P21, P22, P23, P24, P25, P26, . . . .

The first electrode 150 may be disposed on the first conductivity type reflective layer 113. The first electrode 150 may be electrically connected with the first reflective layer 110a of the first light emitting structure P11. The first electrode 150 may be electrically connected with the third reflective layer 110b of the second light emitting structure P21.

The semiconductor device 200 according to the embodiment may comprise the second electrode 160, as shown in FIGS. 1 to 5. The second electrode 160 may be disposed on the plurality of light emitting structures P11, P12, P21, P22, . . . . The second electrode 160 may be disposed under the first bonding pad 155 and under the second bonding pad 165.

The second electrode 160 may be disposed on the first plurality of light emitting structures P11, P12, P13, P14, P15, P16, . . . , as shown in FIGS. 2 and 3. The second electrode 160 may be disposed on the upper reflective layer of the first plurality of light emitting structures P11, P12, P13, P14, P15, P16, . . . . The second electrode 160 may be disposed on the first electrode 150.

The second electrode 160 may be electrically connected with the second reflective layer 120a of the first light emitting structure P11. The second electrode 160 may comprise an upper electrode 160a and a connection electrode 160b.

The upper electrode 160a may be disposed in contact with the upper surface of the upper reflective layer of the first plurality of the light emitting structures P11, P12, P13, P14, P15, P16, . . . . The connection electrode 160b may be disposed on a side surface and periphery of the first plurality of light emitting structures P11, P12, P13, P14, P15, P16, . . . so as to be electrically connected to the upper electrode 160a. The connection electrode 160b may electrically connect the upper electrode 160a disposed on the first plurality of light emitting structures P11, P12, P13, P14, P15, P16, . . . .

The second electrode 160 may provide a third opening h3 exposing the first electrode 150 disposed around the first active layer 115a of the first light emitting structure P11. An upper surface of the first electrode 150 may be exposed through the third opening h3.

The second electrode 160 may be disposed on a side surface of the first light emitting structure P11. The second electrode 160 may be disposed on the upper surface of the first light emitting structure P11. The upper electrode 160a of the second electrode 160 may be disposed on the second reflective layer 120a of the first light emitting structure P11. The upper electrode 160a of the second electrode 160 may be disposed in direct contact with the upper surface of the second reflective layer 120a.

In addition, the second electrode 160 may be disposed on the second plurality of light emitting structures P21, P22, P23, P24, P25, P26, . . . , as shown in FIGS. 4 and 5. The second electrode 160 may be disposed on the upper reflective layer of the second plurality of light emitting structures P21, P22, P23, P24, P25, P26, . . . . The second electrode 160 may be disposed on the first electrode 150.

The second electrode 160 may be electrically connected with the fourth reflective layer 120b of the second light emitting structure P21. The second electrode 160 may comprise an upper electrode 160a and a connection electrode 160b.

The upper electrode 160a may be disposed in contact with the upper surface of the upper reflective layer of the second plurality of light emitting structures P21, P22, P23, P24, P25, P26, . . . . The connection electrode 160b may be disposed on a side surface and periphery of the second plurality of light emitting structures P21, P22, P23, P24, P25, P26, . . . so as to be electrically connected with the upper electrode 160a. The connection electrode 160b may electrically connect the upper electrode 160a disposed on the second plurality of light emitting structures P21, P22, P23, P24, P25, P26 . . . .

The second electrode 160 may be disposed on a side surface of the second light emitting structure P21. The second electrode 160 may be disposed on the upper surface of the second light emitting structure P21. The upper electrode 160a of the second electrode 160 may be disposed on the fourth reflective layer 120b of the second light emitting structure P21. The upper electrode 160a of the second electrode 160 may be disposed in direct contact with the upper surface of the fourth reflective layer 120b.

The semiconductor device 200 according to the embodiment may comprise a second insulating layer 142, as shown in FIGS. 2 to 5.

The second insulating layer 142 may be disposed between the first electrode 150 and the second electrode 160. The second insulating layer 142 may be disposed between an upper surface of the first electrode 150 and a lower surface of the second electrode 160. The second insulating layer 142 may electrically insulate the first electrode 150 and the second electrode 160.

The second insulating layer 142 may provide a plurality of openings exposing an upper surface of the first plurality of light emitting structures P11, P12, P13, P14, P15, P16, . . . under the first bonding pad 155. The second insulating layer 142 may provide a plurality of openings in which the second conductivity type reflective layer of the first plurality of the light emitting structures P11, P12, P13, P14, P15, P16, . . . and the second electrode 160 are electrically connected, under the first bonding pad 155.

In addition, the second insulating layer 142 may provide a plurality of openings exposing an upper surface of the first electrode disposed around the first plurality of light emitting structures P11, P12, P13, P14, P15, P16, . . . under the firsts bonding pad 155. The second insulating layer 142 may provide a plurality of openings in which the first conductivity type reflective layer of the first plurality of the light emitting structures P11, P12, P13, P14, P15, P16, . . . and the first bonding pad 155 are electrically connected, under the first bonding pad 155.

The second insulating layer 142 may provide a plurality of openings exposing an upper surface of the second plurality of light emitting structures P21, P22, P23, P24, P25, P26, . . . under the second bonding pad 165. The second insulating layer 142 may provide a plurality of openings in which the second conductivity type reflective layer of the second plurality of light emitting structures P21, P22, P23, P24, P25, P26, . . . and the second electrode 160 are electrically connected, under the second bonding pad 165.

In addition, according to the semiconductor device 200 of the embodiment, the second conductivity type reflective layer of the second plurality of light emitting structures P21, P22, P23, P24, P25, P26, . . . , and the second bonding pad 165 may be electrically connected through a plurality of openings provided in the second insulating layer 142, under the second bonding pads 165.

The semiconductor device 200 according to the embodiment may comprise a third insulating layer 143, as shown in FIGS. 1 to 5.

The third insulating layer 143 may be disposed under the first bonding pad 155 and under the second bonding pad 165. The third insulating layer 143 may be disposed on the second electrode 160 under the first bonding pad 155. Also, the third insulating layer 143 may be disposed on the second electrode 160 under the second bonding pad 165.

The third insulating layer 143 may be disposed on the upper electrode 160a of the second electrode 160 under the first bonding pad 155 as shown in FIGS. 2 and 3. The third insulating layer 143 may provide a plurality of fourth openings h4 exposing the first electrode 150 under the first bonding pad 155. For example, the fourth opening h4 may be provided in a region where the third opening h3 is formed.

The third insulating layer 143 may provide the plurality of fourth openings h4 in which the first bonding pad 155 and the first electrode 155 are electrically connected, in a first region in which the first bonding pad 155 is disposed.

According to the embodiment, an area of the fourth opening h4 may be provided greater than or equal to an area of the first active layer 115a. The area of the fourth opening h4 may be provided greater than or equal to an area of the second reflective layer 120a.

Also, according to the embodiment, an area of the third opening h3 may be provided greater than the area of the fourth opening h4. The area of the third opening h3 may be provided greater than the area of the first active layer 115a. The area of the third opening h3 may be provide greater than the area of the second reflective layer 120a.

The third insulating layer 143 may be disposed on the upper electrode 160a of the second electrode 160 under the second bonding pad 165 as shown in FIGS. 4 and 5. The third insulating layer 143 may provide a plurality of fifth openings h5 exposing the second electrode 160 under the second bonding pad 165. The third insulating layer 143 may provide the fifth opening h5 exposing an upper surface of the connection electrode 160b of the second electrode 160 under the second bonding pad 165.

The third insulating layer 143 may provide the fifth opening h5 exposing the second electrode 160 disposed around the second active layer 115b of the second light emitting structure P21. The third insulating layer 143 may provide the fifth opening h5 exposing the connection electrode 160b of the second electrode 160 disposed around the fourth reflective layer 120b of the second light emitting structure P21. The upper surface of the second electrode 160 may be exposed through the fifth opening h5.

The third insulating layer 143 may provide the plurality of fifth openings in which the second bonding pad 165 and the second electrode 160 are electrically connected, in a second region in which the second bonding pad 165 is disposed.

According to the embodiment, an area of the fifth opening h5 may be provided greater than or equal to an area of the second active layer 115b. The area of the fifth opening h5 may be provided greater than or equal to an area of the fourth reflective layer 120b.

According to the embodiment, as shown in FIGS. 1 to 5, it may comprise the first bonding pad 155 and the second bonding pad 165. The first bonding pad 155 and the second bonding pad 165 may be disposed spaced apart from each other.

The first bonding pad 155 may be electrically connected to the first electrode 150 through a region in which the fourth opening h4 is provided. The lower surface of the first bonding pad 155 may contact with the upper surface of the first electrode 150 through the fourth opening h4.

In addition, the second bonding pad 165 may be electrically connected to the second electrode 160 through a region in which the fifth opening h5 is provided. The lower surface of the second bonding pad 165 may contact with the upper surface of the second electrode 160 through the fifth opening h5. The lower surface of the second bonding pad 165 may be in contact with the upper surface of the connection electrode 160b of the second electrode 160 through the fifth opening h5.

Meanwhile, according to the semiconductor device 200 of the embodiment, as shown in FIG. 1, the third insulating layer 143 may comprise a plurality of fourth openings h4 provided under the first bonding pad 155. At this time, as an example, the plurality of fourth openings h4 may be provided in a plurality of rows arranged under the first bonding pad 155.

As an example, the plurality of fourth openings h4 may be provided in three rows f1, f2 and f3, as shown in FIG. 1. In FIG. 1, a plurality of fourth openings h4 are shown as being provided in three rows. However, the plurality of fourth openings h4 may be arranged to be smaller than three rows, or may be designed to be arranged in four or more rows, depending on the size of the semiconductor device 200 and the like.

According to the embodiment, under the first bonding pad 155, the plurality of fourth openings h4 may be provided more in a region located close to the second bonding pad 165 than a region far from the second bonding pad 165. For example, as shown in FIG. 1, the plurality of fourth openings h4 may comprise four openings provided in a first row f1, which is a region distant from the second bonding pad 165 under the first bonding pad 155, and may comprise six openings provided in a third row f3, which is near the second bonding pad 165.

Meanwhile, according to the semiconductor device 200 of the embodiment, as shown in FIG. 1, the third insulating layer 143 may comprise a plurality of fifth openings h5 provided under the second bonding pad 165. Here, as one example, the plurality of fifth openings h5 may be provided in a plurality of rows arranged under the second bonding pad 165.

As an example, the plurality of second openings h5 may be provided to be arranged in three rows s1, s2, s3, as shown in FIG. 1. In FIG. 1, the plurality of fifth openings h5 are shown as being provided in three rows. However, the plurality of fifth openings h5 may be arranged to be smaller than three rows or may be designed to be arranged in four or more rows depending on the size of the semiconductor device 200 and the like.

According to the embodiment, under the second bonding pad 165, the plurality of fifth openings h5 may be provided more in a region closer to the first bonding pad 155 than a region farther from the first bonding pad 155. For example, as shown in FIG. 1, the plurality of fifth openings h5 may comprise four openings provided in a first row s which is a region distant from the first bonding pad 155 under the second bonding pad 165, and may comprise six openings provided in a third row s3 close to the first bonding pad 155.

Meanwhile, according to the semiconductor device 200 of the embodiment, as shown in FIGS. 1 to 3, the lower surface of the first bonding pad 155 and the upper surface of the first electrode 150 may be contacted through the fourth opening h4. At this time, a region of the upper surface of the first electrode 150, that is contacted with the lower surface of the first bonding pad 155 through the fourth opening h4, may be provided in a space surrounded by the first light emitting structure P11, P12, P13, P14, P15, P16.

According to the embodiment, an area of the region of the upper surface of the first electrode 150, that is contacted with the lower surface of the first bonding pad 155 through the fourth opening h4, may be provided greater than an area of an upper surface of the first active layer 115a.

In addition, according to the semiconductor device 200 of the embodiment, as shown in FIGS. 1, 4, and 5, the lower surface of the second bonding pad 165 and the upper surface of the second electrode 160 may be contacted through the fifth opening h5. At this time, a region of the upper surface of the second electrode 160, that is contacted with the lower surface of the second bonding pad 165 through the fifth opening h5, may be provided in a space surrounded by the second light emitting structure P21, P22, P23, P24, P25, P26.

According to the embodiment, an area of the region of the upper surface of the second electrode 160, that is contacted with the lower surface of the second bonding pad 165 through the fifth opening h5, may be provided greater than an area of an upper surface of the second active layer 115b.

As described above, according to the semiconductor device 200 of the embodiment, a contact area between the first bonding pad 155 and the first electrode 150 is more provided in a region closer to the second bonding pad 165. Further, a contact area between the second bonding pad 165 and the second electrode 160 is more provided in a region closer to the first bonding pad 155.

Therefore, according to the embodiment, the power supplied through the first bonding pad 155 and the second bonding pad 165 can be smoothly diffused and supplied to the entire light emitting structure of the semiconductor device 200 of the embodiment through the first electrode 150 and the second electrode 160.

According to the semiconductor device 100 of the embodiment, the substrate 105 may have a length in a first direction and a width in a second direction perpendicular to the first direction.

The first bonding pad 155 may have a first side surface and a second side surface in the first direction. The first side surface of the first bonding pad 155 may be disposed closer to the first side surface of the substrate 105 in the first direction than the second side surface.

The second bonding pad 165 may have a third side surface and a fourth side surface in the first direction. The third side surface of the second bonding pad 165 may be disposed closer to the second side surface of the first bonding pad 155 than the fourth side surface.

According to the embodiment, the third insulating layer 143 may comprise the plurality of fourth openings h4 overlapped with the first bonding pad 155, and the plurality of fifth openings h5 overlapped with the second bonding pad 165, in a third direction perpendicular to the first and second directions.

The plurality of fourth openings h4 of the third insulating layer 143 may be disposed spaced apart from each other in the first direction, and may comprise a first group f3 disposed closer to the second side surface of the first bonding pad 155, and a second group f2 spaced apart from the first group f3 in the second direction.

The plurality of fifth openings h5 of the third insulating layer 143 may be disposed spaced apart from each other in the first direction, and may comprise a third group s3 disposed closer to the third side surface of the second bonding pad 165, and a fourth group s2 spaced apart from the third group s3 in the second direction.

The first group f3 of the plurality of fourth openings h4 and the third group s3 of the plurality of fifth openings h5 may be disposed within 15% of the width in the second direction of the substrate 105 with respect to a central axis parallel to the first direction of the substrate 105.

According to the embodiment, the minimum distance between the plurality of fourth openings h4 or the plurality of fifth openings h5 of the third insulating layer 143 may be provided greater than the minimum distance between the light emitting structures.

According to the semiconductor device 100 of the embodiment, upon considering the first bonding pad 155 and the second bonding pad 165 are mounted on the first pad electrode and the second pad electrode of the semiconductor device package and are electrically connected to each other, the spacing distance between the first bonding pad 155 and the second bonding pad 165 may be 100 micrometers or more, for example. The spacing distance is provided in consideration of a process error and is provided to prevent an electrical connection between the first bonding pad 155 and the second bonding pad 165. For example, the spacing distance may be provided in a range of 100 micrometers to 300 micrometers.

Meanwhile, the openings provided in the third row f3 disposed closest to the second bonding pad 165 under the first bonding pad 155 may be disposed and arranged within 15% of the width of the semiconductor device 100 with respect to a central line in the length direction of the semiconductor device 100. Here, the central line in the length direction of the semiconductor device 100 may be arranged as a virtual line provided between the first bonding pad 155 and the second bonding pad 165, parallel to the row f3 and parallel to the row s3.

In addition, the openings provided in the third row s3 disposed closest to the first bonding pad 155 under the second bonding pad 165 may be disposed and arranged within 15% of the width of the semiconductor device 100 with respect to the central line in the length direction of the semiconductor device 100. Here, the central line in the length direction of the semiconductor device 100 may be arranged as the virtual line provided between the first bonding pad 155 and the second bonding pad 165, parallel to the row f3 and parallel to the row s3.

For example, the opening provided in the third row f3 disposed closest to the second bonding pad 165 under the first bonding pad 155 may be disposed within in a range of 100 micrometers to 300 micrometers from the center line in the length direction of the semiconductor device 100. In addition, the opening provided in the third row s3 disposed closest to the first bonding pad 155 under the second bonding pad 165 may be disposed within in a range of 100 micrometers to 300 micrometers from the center line in the length direction of the semiconductor device 100.

Accordingly, the power applied through the first bonding pad 155 and the second bonding pad 165 can be effectively dispersed and provided in the entire region of the semiconductor device 100.

Meanwhile, FIG. 6 is a view explaining a contact region between a bonding pad and an electrode in the semiconductor device according to the embodiment of the present invention. In describing the semiconductor device 200 according to the embodiment with reference to FIG. 6, description overlapping with those described above with reference to FIGS. 1 to 5 may be omitted.

As an example, in the semiconductor device 200 according to the embodiment, each light emitting structure may be provided with a diameter of "d", the distance between the light emitting structures may be provided with a length of "ϑ", and the fourth opening h4 may be provided with a diameter of "D".

According to the embodiment, the distance ϑ between the light emitting structure P14 and the light emitting structure P15 may indicate a distance between the center of the light emitting structure P14 and the center of the light emitting structure P15 that is the nearest light emitting structure of the light emitting structures P14, when viewed above the top of the semiconductor device 200.

The diameter of the light emitting structure may be provided, for example, several tens of micrometers. For example, if the diameter of the light emitting structure is provided of 30 micrometers, the distance between the adjacent light emitting structures may be designed to be smaller than 80 micrometers.

In this case, the distance between the neighboring light emitting structures is provided less than 80 micrometers, and the fourth opening h4, through which the first bonding pad 155 and the first electrode 150 can be in contact, may be provided in a space surrounded by the first plurality of light emitting structures P11, P12, P13, P14, P15, and P16.

Meanwhile, since the diameter D of the fourth opening h4 is larger than the diameter d of the light emitting structure, a light emitting structure may be further provided in a region where the fourth opening h4 is formed. However, according to the embodiment, one light emitting structure is removed, and the fourth opening h4 is formed in the region, and a current injection region, in which the first bonding pad 155 and the first electrode 150 can be in contact, is formed.

According to the embodiment, by designing the distance ϑ between the neighboring light emitting structures to be shorter, more light emitting structures can be formed in a predetermined area of the semiconductor device 200. For example, as shown in FIG. 1, fourteen light emitting structures are removed under the first bonding pad 155, and, through the removed region, the contact region between the first bonding pad 155 and the first electrode 150 is provided.

According to the semiconductor device 200 of the embodiment, more light emitting structures can be formed in a predetermined area of the semiconductor device 200, and power can be efficiently supplied through the plurality of fourth openings h4.

In addition, the diameter of the fourth opening h4 provided in a region where the first bonding pad 155 and the first electrode 150 are in contact with each other may be better to be provided of 10 micrometers or more in consideration of reducing the resistance, providing stable current, and process error.

Meanwhile, according to the embodiment, the fourth opening h4 may be provided in a wide space surrounded by the first plurality of the light emitting structures P11, P12, P13, P14, P15, and P16. When viewed from above the semiconductor device, the diameter of the fourth opening h4 may be provided larger than the distance from the center of the first light emitting structure to the center of the light emitting structure closest to the first light emitting structure.

The diameter of the fourth opening h4 may be provided several tens of micrometers. For example, if the diameter of the light emitting structure is provided at 30 micrometers and the distance between adjacent light emitting structures is provided at 80 micrometers, the diameter of the fourth opening h4 may be designed to be provided greater than 80 micrometers.

Thus, according to the semiconductor device of the embodiment, since the diameter of the fourth opening h4 can be provided greater than 10 micrometers, resistance between the first bonding pad 155 and the first electrode 150 can be reduced and current injection can be smoothly provided.

Referring to FIG. 6, the design described with reference to the first bonding pad 155 and the fourth opening h4 may be applied to the second bonding pad 165 and the fifth opening h5 in the same manner. That is, according to the semiconductor device 200 of the embodiment, more light emitting structures can be formed in a predetermined area of the semiconductor device 200, and power can be efficiently supplied through the plurality of fifth openings h5.

For example, if the diameter of the light emitting structure is provided at 30 micrometers and the distance between adjacent light emitting structures is provided at 80 micrometers, the diameter of the fifth opening h5 may be designed to be provided greater than 80 micrometers.

Thus, according to the semiconductor device of the embodiment, since the diameter of the fifth opening h5 can be provided greater than 10 micrometers, resistance between the first bonding pad 155 and the first electrode 150 can be reduced and current injection can be smoothly provided.

Next, effect of the semiconductor device according to the embodiment, compared to the conventional semiconductor device, will be further described with reference to FIG. 7.

FIG. 7 is a view showing an example of a conventional semiconductor device, which is shown with based on one light emitting structure 1110. The light emitting structure 1110 may be provided on the substrate 1120. A plurality of light emitting structures 1110 may be disposed on the substrate 1120. Also, a first electrode 1125 may be disposed under the substrate 1120.

The conventional semiconductor device may comprise a light emitting structure 1110, a first electrode 1125, and a second electrode 1160. The light emitting structure 1110 may comprise a lower reflective layer 1111, an active layer 1113, an aperture layer 1114, and an upper reflective layer 1115. At this time, the reflectance of the upper reflective layer 1115 is provided lower than the reflectance of the lower reflective layer 1111, and light generated from the active layer 1113 can be extracted upward through the upper reflective layer 1115.

In addition, the conventional semiconductor device may comprise a conductive layer 1140 disposed on the light emitting structure 1110. The conductive layer 1140 may be electrically connected to the second electrode 1160. The conventional semiconductor device may comprise an insulating layer 1130 disposed on the light emitting structure 1110.

Since the conventional semiconductor device is supplied with power through the first electrode 1125 and the second electrode 1160, the substrate 1120 must be conductive. The substrate 1120 may comprise, for example, a conductive semiconductor substrate.

When power is supplied to the plurality of light emitting structures 1110 through the first electrode 1125 and the second electrode 1160, light may be emitted upward in the plurality of light emitting structures 1110. At this time, the first electrode 1125 may be disposed under the substrate 1120 and electrically connected to an external submount, for example. In addition, the second electrode 1160 may be electrically connected to the electrode pad disposed at one end of the outer edge of the semiconductor device when viewed from the upper direction of the semiconductor device.

However, according to the conventional semiconductor device, when viewed from the upper direction of the semiconductor device, the difference in intensity of light emission in the first region R1 closer to the electrode pad and in the second region R2 relatively far from the electrode pad may be generated. This is because the diffusion of the current supplied through the second electrode 1160 is not smooth in the light emitting structure located in the region far from the electrode pad disposed at one end of the outer edge of the semiconductor device when viewed from the upper direction of the semiconductor device.

For example, when the conventional semiconductor device is provided at a size of 1300 micrometers*1100 micrometers, it is detected that the light intensity of the light emitting structure 1110 disposed at a distance of about 600 micrometers or more from the electrode pad is lowered. This phenomenon is known to occur even when the second electrode 1160 is provided in a thickness of several micrometers, for example, a sufficient thickness of 3 micrometers. This is interpreted that the amount of current flowing due to an increase in resistance is reduced in a conventional semiconductor device in a light emitting structure disposed over a certain distance from an electrode pad.

However, according to the semiconductor device 200 of the embodiment, power can be supplied in a flip-chip manner through the first bonding pad 155 and the second bonding pad 165 as described above, the current can be smoothly diffused and supplied to the light emitting structure disposed in the entire region of the light emitting structure 200. Thus, according to the semiconductor device 200 of the embodiment, light can be efficiently and uniformly emitted from a plurality of light emitting structures arranged in the entire region.

Meanwhile, the semiconductor device 200 according to the embodiment may further comprise a substrate 105, as shown in FIGS. 1 to 5. A plurality of light emitting structures P11, P21, . . . may be disposed on the substrate 105. For example, the substrate 105 may be a growth substrate on which the plurality of light emitting structures P11, P21, . . . may be grown. For example, the substrate 105 may be an intrinsic semiconductor substrate.

According to the semiconductor device 200 of the embodiment, power may be supplied to the plurality of light emitting structures P11, P12, P21, P22, . . . through the first bonding pad 155 and the second bonding pad 165. The first electrode 150 may be disposed on the upper surface of the first conductivity type reflective layer of the plurality of light emitting structures P11, P12, P21, P22, . . . . The second electrode 160 may be disposed on the upper surface of the second conductivity type reflective layer of the plurality of light emitting structures P11, P12, P21, P22 . . . .

Therefore, according to the embodiment, when power is supplied to the plurality of light emitting structures P11, P12, P21, P22, . . . , power is not need to be applied through the lower surface of the substrate 105. In a conventional semiconductor device, when power is to be applied through the lower surface of the substrate 105, the substrate 105 must be provided as a conductive substrate. However, according to the semiconductor device 200 of the embodiment, the substrate 105 may be a conductive substrate or an insulating substrate. For example, the substrate 105 according to the embodiment may be provided as an intrinsic semiconductor substrate.

In addition, the substrate 105 may be a support substrate attached to the plurality of light emitting structures P11, P12, P21, P22, . . . , in which the support substrate may be attached after the plurality of light emitting structures P11, P12, P21, P22, . . . are grown on a growth substrate and the growth substrate is removed.

Meanwhile, the semiconductor device 200 according to the embodiment may be implemented such that light is emitted in a lower direction of the semiconductor device 200, as shown in FIGS. 1 to 5. According to the embodiment, the reflectance of the lower reflective layer of the semiconductor device 200 can be provided to be smaller than the reflectance of the upper reflective layer.

That is, according to the semiconductor device 200 of the embodiment, light can be emitted in a direction in which the lower reflective layer is disposed from the active layer constituting the plurality of light emitting structures P11, P12, P21, P22, . . . . Light may be emitted from the active layer constituting the plurality of light emitting structures P11, P12, P21, P22, . . . in the direction in which the substrate 105 is disposed.

According to the embodiment, the second electrode 160 is disposed on the upper surface of the second conductivity type reflective layer of the plurality of light emitting structures P11, P12, P21, P22, . . . , and the second bonding pad 165 is disposed on and in contact with the second electrode 160. Also, the first electrode 150 is disposed on the upper surface of the first conductivity type reflective layer of the plurality of light emitting structures P11, P12, P21, P22, . . . , and the first bonding pad 155 is disposed on and in contact with the first electrode 150. Accordingly, the heat generated in the plurality of light emitting structures P11, P12, P21, P22, . . . can be effectively dissipated to the outside through the first bonding pad 155 and the second bonding pad 165.

Meanwhile, in the case of a general semiconductor device, it is known that the power conversion efficiency (PCE) is significantly lowered due to the heat generated in the light emitting structure. When power is supplied to the light emitting structure through the substrate disposed at the lower portion, generally heat dissipation is performed through the substrate. However, since the thermal conductivity of the substrate is low, it is difficult to dissipate the heat generated in the light emitting structure to the outside. For example, it is known that the thermal conductivity of a GaAs substrate is as low as 52 W/(m*K).

However, according to the embodiment, since the first bonding pad 155 and the second bonding pad 165 may be connected to the external heat dissipating substrate or the like, so that the heat generated in the plurality of light emitting structures P11, P12, P21, P22, . . . can be effectively dissipated to the outside. Therefore, according to the embodiment, since the heat generated in the semiconductor device 200 can be effectively dissipated to the outside, the power conversion efficiency (PCE) can be improved.

Meanwhile, according to the semiconductor device 200 of the embodiment, as described above, light can be emitted in a downward direction of the semiconductor device 200.

According to the semiconductor device 200 of the embodiment, the reflectance of the first conductivity type reflective layer provided in a lower portion of the plurality of light emitting structures P11, P12, P21, P22, . . . can be selected to be smaller than the reflectance of the second conductivity type reflective layer provided in an upper portion of the plurality of light emitting structures P11, P12, P21, P22, . . . . Accordingly, light generated in the plurality of light emitting structures P11, P12, P21, P22, . . . can be emitted toward the substrate 105 of the semiconductor device 200.

In addition, according to the semiconductor device 200 of the embodiment, the second insulating layer 142 may be provided as a DBR layer. According to the semiconductor device 200 of the embodiment, the third insulating layer 143 may be provided as a DBR layer. According to the embodiment, at least one of the second insulating layer 142 and the third insulating layer 143 may be provided as a DBR layer. Accordingly, light generated in the plurality of light emitting structures P11, P12, P21, P22, . . . can be reflected by the second insulating layer 142 and the third insulating layer 143 disposed at the upper portion and can be effectively extracted downward.

For example, at least one of the second insulating layer 142 and the third insulating layer 143 may be provided as a DBR layer formed by stacking $SiO_2$ and $TiO_2$ as a plurality of layers. Also, at least one of the second insulating layer 142 and the third insulating layer 143 may be provided as a DBR layer formed by stacking $Ta_2O_3$ and $SiO_2$ as a plurality of layers. Also, at least one of the second insulating layer 142 and the third insulating layer 143 may be provided as a DBR layer formed by stacking $SiO_2$ and $Si_3N_4$ as a plurality of layers.

In addition, according to the semiconductor device 200 of the embodiment, at least one of the second insulating layer 142 and the third insulating layer 143 may comprise a spin on glass (SOG) layer. For example, according to the semiconductor device 200 of the embodiment, at least one of the second insulating layer 142 and the third insulating layer 143 may comprise a plurality of insulating layers including an SOG layer.

If the second insulating layer 142 or the third insulating layer 143 comprises an SOG layer, problem caused by a step in the peripheral region of the semiconductor device 200 can be solved. A step may be generated between the region where the upper reflective layer is provided and the region where the upper reflective layer is not provided in the vicinity of the light emitting structure of the semiconductor device 200.

At this time, if the stepped portion is formed to be large around the light emitting structure of the semiconductor device 200, the thickness of the second insulating layer 142 or the third insulating layer 143 may not be uniformly formed in the stepped region, and pit can be formed. Also, when a pit is formed in the second insulating layer 142 or the third insulating layer 143, an insulation characteristic may be deteriorated, and electrical short may occur between the first electrode 150 and the second electrode 160 or electrical short may occur between the first bonding pad 155 and the second bonding pad 165.

However, according to the semiconductor device 200 of the embodiment, since the second insulating layer 142 or the third insulating layer 143 comprises the SOG layer, pits can be prevented from being formed in the second insulating layer 142 or the third insulating layer 143. Thus, electrical short between the first electrode 150 and the second electrode 160, and electrical short between the first bonding pad 155 and the second bonding pad 165 can be prevented from being occurred.

Meanwhile, in the conventional semiconductor device, when the power is supplied to the light emitting structure through the substrate, the substrate must be conductive. Accordingly, when a conductive semiconductor substrate is applied, a dopant is added to the substrate to improve the conductivity. However, the dopant added to the substrate causes absorption and scattering of emitted light, which may cause a decrease in power conversion efficiency (PCE).

However, according to the semiconductor device 200 of the embodiment, as described above, the substrate 105 may not be a conductive substrate, so that an additional dopant may not be added to the substrate 105. Accordingly, dopant is not added to the substrate 105 according to the embodiment, so that absorption and scattering by the dopant in the substrate 105 can be reduced. Therefore, according to the embodiment, light generated in the plurality of light emitting structures P11, P12, P21, P22, . . . can be effectively provided in a downward direction, and power conversion efficiency (PCE) can be improved.

In addition, the semiconductor device 200 according to the embodiment may further comprise an anti-reflection layer provided on the lower surface of the substrate 105. The anti-reflection layer prevents light emitted from the semiconductor device 200 from being reflected on the surface of the substrate 105 and transmits the light, thereby improving light loss due to reflection.

Hereinafter, a method of manufacturing a semiconductor device according to an embodiment of the present invention will be described with reference to the drawings. In explaining the method of manufacturing the semiconductor device according to the embodiment, description overlapping with those described with reference to FIGS. 1 to 6 may be omitted.

First, FIGS. 8a to 8c are views showing an example in which a light emitting structure is formed in the method of manufacturing the semiconductor device according to the embodiment of the present invention. FIG. 8a is a plan view showing a step of forming a light emitting structure according to the method of manufacturing the semiconductor device of the embodiment, FIG. 8b is a sectional view taken along line A-A of the semiconductor device of the embodiment shown in FIG. 8a, and FIG. 8c is a sectional view taken along line B-B of the semiconductor device of the embodiment shown in FIG. 8a.

According to the method of manufacturing the semiconductor device of the embodiment, as shown in FIGS. 8a to 8c, a plurality of light emitting structures P11, P12, P21, P22, . . . may be formed on a substrate 105.

The substrate 105 may be any one selected from an intrinsic semiconductor substrate, a conductive substrate, and an insulating substrate. For example, the substrate 105 may be a GaAs intrinsic semiconductor substrate. Also, the substrate 105 may be provided of at least one selected from a conductive material including copper (Cu), gold (Au), nickel (Ni), molybdenum (Mo), copper-tungsten (Cu—W), and carrier wafers such as Si, Ge, AlN, GaAs, ZnO, SiC, and the like.

For example, a first conductivity type reflective layer, an active layer, and a second conductivity type reflective layer may be sequentially formed on the substrate 105. The plurality of light emitting structures P11, P12, P21, P22, . . . may be formed through a mesa etching for the second conductivity type reflective layer and the active layer.

The plurality of light emitting structures P11, P21, . . . may comprise a first conductivity type reflective layer 110a, 110b, . . . , an active layer 115a, 115b, . . . , an aperture layer 117a, 117b, . . . , and a second conductivity type reflective layer 120a, 120b, . . . . A first conductivity type reflective layer 113 may be provided around the plurality of light emitting structures P11, P12, P21, P22, . . . . The first conductivity type reflective layer 113 may be disposed in a region between the plurality of light emitting structures P11, P12, P21, P22, . . . .

For example, the plurality of light emitting structures P11, P12, P21, P22, . . . may be grown as a plurality of compound semiconductor layers. The plurality of light emitting structures P11, P12, P21, P22, . . . may be formed by an electron beam evaporator, physical vapor deposition (PVD), chemical vapor deposition (CVD), plasma laser deposition (PLD) dual-type thermal evaporator, sputtering, metal organic chemical vapor deposition (MOCVD), or the like.

The first conductivity type reflective layer 110a, 110b, . . . constituting the plurality of light emitting structures P11, P21, . . . may be provided of at least one of a Group III-V or a Group II-VI compound semiconductors doped with a dopant of the first conductivity type. For example, the first conductivity type reflective layer 110a, 110b, . . . may be one of a group including GaAs, GaAl, InP, InAs, and GaP. The first conductivity type reflective layer 110a, 110b, . . . may be provided of a semiconductor material having a composition formula of $Al_xGa_{1-x}As$ (0<x<1)/ $Al_yGa_{1-y}As$ (0<y<1)(y<x). The first conductivity type reflective layer 110a may be an n-type semiconductor layer doped with the first conductivity type dopant that is an n-type dopant such as Si, Ge, Sn, Se, Te, or the like. The first conductivity type reflective layer 110a, 110b, . . . may be a DBR layer having a thickness of $\lambda/4n$ by alternately arranging different semiconductor layers.

The active layer 115a, 115b, . . . constituting the plurality of light emitting structures P11, P21, . . . may be provided as at least one of Group III-V or Group II-VI compound semiconductors. For example, the active layer 115a, 115b, . . . may be one of a group including GaAs, GaAl, InP, InAs, and GaP. When the active layer 115a, 115b, . . . is implemented in a multi-well structure, the active layer 115a, 115b, . . . may comprise alternately arranged a plurality of well layers and a plurality of barrier layers. The plurality of well layers may be provided as a semiconductor material having a composition formula of $In_pGa_{1-p}As$ (0≤p≤1), for example. The barrier layer may be disposed of a semiconductor material having a composition formula of, for example, $In_qGa_{1-q}As$ (0≤q≤1).

The aperture layer 117a, 117b, . . . constituting the plurality of light emitting structures P11, P21, . . . may be disposed on the active layer 115a, 115b . . . . The aperture layer 117a, 117b, . . . may comprise circular opening at the central portion. The aperture layer 117a, 117b, . . . may comprise a function of restricting current movement so as to concentrate current to the central portion of the active layer 115a, 115b, . . . . That is, the aperture layer 117a, 117b, . . . can adjust the resonance wavelength and adjust the beam angle to emit light in the vertical direction from the active layer 115a, 115b . . . . The aperture layer 117a, 117b, . . . may comprise an insulating material such as $SiO_2$ or $Al_2O_3$. In addition, the aperture layer 117a, 117b, . . . may have a higher band gap energy than the active layer 115a, 115b, . . . , the first conductivity type reflective layers 110a, 110b, . . . , and the second conductivity type reflective layer 120a, 120b . . . .

The second conductivity type reflective layer 120a, 120b, . . . constituting the plurality of light emitting structures P11, P21, . . . may be provided of at least one of a group III-V or a group II-VI compound semiconductor doped with a dopant of the second conductivity type. For example, the second conductivity type reflective layer 120a, 120b, . . . may be one of a group including GaAs, GaAl, InP, InAs, GaP. The second conductivity type reflective layer 120a may be formed of a semiconductor material having a composition formula of $Al_xGa_{1-x}As$ (0<x<1)/$Al_yGa_{1-y}As$ (0<y<1)(y<x). The second conductivity type reflective layer 120a may be a p-type semiconductor layer having the second conductivity type dopant that is a p-type dopant such as Mg, Zn, Ca, Sr, and Ba. The second conductivity type reflective layer 120a, 120b, . . . may be a DBR layer having a thickness of $\lambda/4n$ by alternately arranging different semiconductor layers.

For example, the second conductivity type reflective layer 120a, 120b, . . . may have a higher reflectance than the first conductivity type reflective layer 110a, 110b, . . . . For example, the second conductivity type reflective layer 120a, 120b, . . . and the first conductivity type reflective layer 110a, 110b, . . . can form a resonant cavity in the vertical direction by a reflectance of 90% or more. At this time, the generated light can be emitted to the outside through the first conductivity type reflective layer 110a, 110b, . . . , which is lower than the reflectance of the second conductivity type reflective layer 120a, 120b . . . .

Next, as shown in FIGS. 9a to 9c, a first electrode 150 may be formed.

FIGS. 9a to 9c are views showing an example in which a first electrode is formed in the method of manufacturing the semiconductor device according to the embodiment of the present invention. FIG. 9a is a plan view showing a shape of the first electrode provided according to the method of manufacturing the semiconductor device of the embodiment, FIG. 9b is a sectional view taken along line A-A of the semiconductor device according to the embodiment shown in FIG. 9a, and FIG. 9c is a sectional view taken along line B-B of the semiconductor device according to the embodiment shown in FIG. 9a.

According to the embodiment, as shown in FIGS. 9a to 9c, the first electrode 150 may be formed around the plurality of light emitting structures P11, P12, P21, P22 . . . .

The first electrode 150 may be formed on the first conductivity type reflective layer 113, and may comprise a plurality of first openings h1 exposing the first plurality of light emitting structures P11, P12, . . . . The first electrode 150 may be formed in a region between the first plurality of light emitting structures P11, P12, . . . .

In addition, the first electrode 150 may be formed on the first conductivity type reflective layer 113, and may comprise a plurality of second openings h2 exposing the second plurality of light emitting structures P21, P22, . . . . The first electrode 150 may be formed in a region between the second plurality of light emitting structures P21, P22, . . . .

Meanwhile, according to the embodiment, a first insulating layer 141 may be further formed on the side surfaces of the plurality of light emitting structures P11, P12, P21, P22, . . . before the first electrode 150 is formed. The first insulating layer 141 may be formed on the upper surface and the side surfaces of the plurality of light emitting structures P11, P12, P21, P22, . . . . The first insulating layer 141 may electrically insulate the first electrode 150 from the active layer and the upper reflective layer of the plurality of light emitting structures P11, P12, P21, P22 . . . .

According to another embodiment, since the first electrode 150 is disposed spaced apart from the side surfaces of the plurality of light emitting structures P11, P12, P21, P22, . . . , the first insulating layer 141 may not be formed and may be omitted when electrical insulation characteristics between the first electrode 150, and the active layer and the upper reflective layer of the plurality of light emitting structures P11, P12, P21, P22, . . . are stably ensured.

In addition, an area An of the first electrode 150 may be provided greater than an area Am of the plurality of light emitting structures P11, P12, P21, P22, . . . . Here, the area Am of the plurality of light emitting structures P11, P12, P21, P22, . . . may indicate the area of the remaining active layer 115a, 115b, . . . , without being etched by the mesa etching. A ratio of Am/An, that is the area Am of the plurality of light emitting structures P11, P12, P21, P22, . . . with reference to the area An of the first electrode 150, may be provided greater than 25%, for example. According to the semiconductor device 200 of the embodiment, the number and the diameter of the plurality of light emitting structures P11, P12, P21, P22, . . . may be variously modified according to the application example.

According to the embodiment, the ratio of Am/An, that is the area Am of the plurality of light emitting structures P11, P12, P21, P22, . . . with reference to the area An of the first electrode 150, may be provided of, for example, in a range of 25% to 70%. According to another embodiment, the ratio of Am/An, that is the area Am of the plurality of light emitting structures P11, P12, P21, P22, . . . with reference to the area An of the first electrode 150, may be provided of, for example, in a range of 30% to 60%.

The number and diameter of the plurality of light emitting structures P11, P12, P21, P22, . . . disposed in the semiconductor device 200 can be variously changed according to the application example of the semiconductor device 200 of the embodiment. [Table 1] shows data for semiconductor devices provided with 630 light emitting structures as an example. In [Table 1], "Ap" represents an area of the second electrode 160, and "At" represents the total area of the semiconductor device 200.

TABLE 1

| Diameter of light emitting structure (μm) | 30 |
|---|---|
| Am ($\mu m^2$) | 445,347 |
| An ($\mu m^2$) | 750,000 |
| Am/An (%) | 59.4 |
| Ap ($\mu m^2$) | 1,600,000 |
| At ($\mu m^2$) | 1,822,500 |

For example, the first electrode 150 may be formed of selected material from a group including Ag, Ni, Al, Rh, Pd, Ir, Ru, Mg, Zn, Pt, Au, Hf, Ti, W, Cr, and those alloys including two or more materials above. The first electrode 150 may be formed of one layer or a plurality of layers. As the first electrode 150, a plurality of metal layers may be applied as a reflective metal, and Cr, Ti or the like may be applied as an adhesive layer. For example, the first electrode 150 may be formed of a Cr/Al/Ni/Au/Ti layer.

Next, as shown in FIGS. 10a to 10c, a second insulating layer 142 may be formed on the first electrode 150.

FIGS. 10a to 10c are views showing an example in which the second insulating layer is formed in the method of manufacturing the semiconductor device according to the embodiment of the present invention. FIG. 10a is a plan view showing a shape of the second insulating layer formed according to the method of manufacturing the semiconductor device of the embodiment, FIG. 10b is a sectional view taken along line A-A of the semiconductor device according to the embodiment shown in FIG. 10a, and FIG. 10c is a sectional view taken along line B-B of the semiconductor device according to the embodiment shown in FIG. 10a.

According to the embodiment, as shown in FIGS. 10a to 10c, the second insulating layer 142 may be formed on the first electrode 150 to expose the upper surfaces of the plurality of light emitting structures P11, P12, P21, P22, . . . . The second insulating layer 142 may be formed on the side surfaces of the plurality of light emitting structures P11, P12, P21, P22, . . . . The second insulating layer 142 may be formed on the first conductivity type reflective layer 113. The second insulating layer 142 may be formed in a region between the plurality of light emitting structures P11, P12, P21, P22, . . . .

The second insulating layer 142 may be provided as an insulating material. For example, the second insulating layer 142 may be formed of at least one material selected from a group including $SiO_2$, $TiO_2$, $Ta_2O_5$, $SiO_x$, $SiO_xN_y$, $Si_3N_4$, and $Al_2O_3$.

In addition, the second insulating layer 142 may be formed of a DBR layer. According to the embodiment, since the second insulating layer 142 is provided as a DBR layer, light generated in the plurality of light emitting structures P11, P12, P21, P22, . . . can be efficiently reflected and extracted downward. For example, the second insulating layer 142 may be provided as a DBR layer formed by stacking $SiO_2$ and $TiO_2$ as a plurality of layers. In addition, the second insulating layer 142 may be provided as a DBR layer formed by stacking $Ta_2O_3$ and $SiO_2$ as a plurality of layers. In addition, the second insulating layer 142 may be provided as a DBR layer formed by stacking $SiO_2$ and $Si_3N_4$ as a plurality of layers.

In addition, the second insulating layer 142 may comprise a spin on glass (SOG) layer. When the second insulating layer 142 comprises an SOG layer, it is possible to solve a problem caused by a step in the peripheral region of the light emitting structure of the semiconductor device 200.

A step may be generated between the region where the upper reflective layer is provided and the region where the upper reflective layer is not provided in the vicinity of the light emitting structure of the semiconductor device 200. If the step difference is large in the vicinity of the light emitting structure of the semiconductor device 200, the thickness of the second insulating layer 142 may not be uniformly formed in the stepped region, and a pit may be partially formed. When a pit is formed in the second insulating layer 142, there is a risk that an insulation characteristic may be deteriorated, and electrical short may occur between the first electrode 150 and the second electrode 160 to be formed later.

However, according to the semiconductor device 200 of the embodiment, since the second insulating layer 142 comprises the SOG layer, pits can be prevented from being formed in the second insulating layer 142. Thus, according to the embodiment, it is possible to prevent electrical short between the first electrode 150 and the second electrode 160 from being occurred.

Next, as shown in FIGS. 11a to 11c, a second electrode 160 may be formed on the second insulating layer 142.

FIGS. 11a to 11c are views showing an example in which a second electrode is formed in the method of manufacturing the semiconductor device according to the embodiment of the present invention. FIG. 11a is a plan view showing a shape of the second electrode formed according to the method of manufacturing the semiconductor device of the embodiment, FIG. 11b is a sectional view taken along line A-A of the semiconductor device according to the embodiment shown in FIG. 11*a*, and FIG. 11*c* is a sectional view taken along line B-B of the semiconductor device according to the embodiment shown in FIG. 11*a*.

According to the embodiment, as shown in FIGS. 11*a* to 11*c*, the second electrode 160 comprising an upper electrode 160*a* and a connection electrode 160*b* may be formed on the second insulating layer 142. The upper electrode 160*a* may be formed on the upper surface of the plurality of light emitting structures P11, P12, P21, P22, . . . exposed by the second insulating layer 142. The connection electrode 160*b* may connect the upper electrode 160*a*.

The upper electrode 160*a* may be formed on the upper surface of the second conductivity type reflective layer constituting the plurality of light emitting structures P11, P12, P21, P22, . . . . The connection electrode 160*b* may electrically and physically connect the upper electrodes 160*a* disposed on the plurality of light emitting structures P11, P12, P21, P22, . . . to each other. The connection electrode 160*b* may be formed in a region between the plurality of light emitting structures P11, P12, P21, P22, . . . .

The second electrode 160 may be electrically connected to the second reflective layer 120*a* of the first light emitting structure P11. The second electrode 160 may comprise an upper electrode 160*a* and a connection electrode 160*b*.

The upper electrode 160*a* may be disposed in contact with the upper surface of the upper reflective layer of the first light emitting structure P11. The connection electrode 160*b* may be disposed on a side surface and a periphery of the first light emitting structure P11, and may be electrically connected to the upper electrode 160*a*.

The second electrode 160 may provide a third opening h3 exposing the first electrode 150 disposed around the first active layer 115*a* of the first light emitting structure P11. The upper surface of the first electrode 150 may be exposed through the third opening h3.

The second electrode 160 may be disposed on a side surface of the first light emitting structure P11. The second electrode 160 may be disposed on the upper surface of the first light emitting structure P11. The upper electrode 160*a* of the second electrode 160 may be disposed on the second reflective layer 120*a* of the first light emitting structure P11. The upper electrode 160*a* of the second electrode 160 may be disposed in direct contact with the upper surface of the second reflective layer 120*a*.

In addition, the second electrode 160 may be electrically connected with the fourth reflective layer 120*b* of the second light emitting structure P21. The second electrode 160 may comprise an upper electrode 160*a* and a connection electrode 160*b*.

The upper electrode 160*a* may be disposed in contact with the upper surface of the upper reflective layer of the second light emitting structure P21. The connection electrode 160*b* may be disposed on a side surface and a periphery of the second light emitting structure P21, and may be electrically connected with the upper electrode 160*a*.

The second electrode 160 may be disposed on a side surface of the second light emitting structure P21. The second electrode 160 may be disposed on the upper surface of the second light emitting structure P21. The upper electrode 160*a* of the second electrode 160 may be disposed on the fourth reflective layer 120*b* of the second light emitting structure P21. The upper electrode 160*a* of the second electrode 160 may be disposed in direct contact with the upper surface of the fourth reflective layer 120*b*.

For example, the second electrode 160 may be formed of selected material from a group including Ag, Ni, Al, Rh, Pd, Ir, Ru, Mg, Zn, Pt, Au, Hf, Ti, W, Cr, and those alloys including two or more materials above. The second electrode 160 may be formed of one layer or a plurality of layers. As the second electrode 160, a plurality of metal layers may be applied as a reflective metal, and Cr, Ti or the like may be applied as an adhesive layer. For example, the second electrode 160 may be formed of a Cr/Al/Ni/Au/Ti layer.

Next, as shown in FIGS. 12*a* to 12*c*, a third insulating layer 143 may be formed on the second electrode 160.

FIGS. 12*a* to 12*c* are views showing an example in which the third insulating layer is formed in the method of manufacturing the semiconductor device according to the embodiment of the present invention. FIG. 12*a* is a plan view showing a shape of the third insulating layer formed according to the method of manufacturing the semiconductor device according to the embodiment, FIG. 12*b* is a sectional view taken along line A-A of the semiconductor device according to the embodiment shown in FIG. 12*a*, and FIG. 12*c* is a sectional view taken along line B-B of the semiconductor device according to the embodiment shown in FIG. 12*a*.

According to the embodiment, as shown in 12*a* and 12*b*, the third insulating layer 143 exposing the first electrode 150 disposed between the first plurality of light emitting structures P11, P12, . . . may be formed. The third insulating layer 143 may comprise a plurality of fourth openings h4 exposing the first electrode 150. For example, the fourth opening h4 may be provided in a region where the third opening h3 is formed.

In addition, according to the embodiment, as shown in FIGS. 12*a* and 12*c*, the third insulating layer 143 exposing the second electrode 160 disposed between the second plurality of light emitting structures P21, P22, . . . may be formed. The third insulating layer 143 may comprise a plurality of fifth openings h5 exposing the second electrode 160. The third insulating layer 143 may provide the fifth opening h5 exposing an upper surface of the connection electrode 160*b* of the second electrode 160.

The third insulating layer 143 may be provided as an insulating material. For example, the third insulating layer 143 may be formed of at least one material selected from a group including $SiO_2$, $TiO_2$, $Ta_2O_5$, $SiO_x$, $SiO_xN_y$, $Si_3N_4$, and $Al_2O_3$.

In addition, the third insulating layer 143 may be formed of a DBR layer. According to the embodiment, since the third insulating layer 143 is provided as a DBR layer, light generated in the plurality of light emitting structures P11, P12, P21, P22, . . . can be efficiently reflected and extracted in a downward direction. For example, the third insulating layer 143 may be provided as a DBR layer formed by stacking $SiO_2$ and $TiO_2$ as a plurality of layers. In addition, the third insulating layer 143 may be provided as a DBR layer formed by stacking $Ta_2O_3$ and $SiO_2$ in a plurality of layers. Also, the third insulating layer 143 may be provided as a DBR layer formed by stacking $SiO_2$ and $Si_3N_4$ as a plurality of layers.

In addition, the third insulating layer 143 may comprise a spin on glass (SOG) layer. If the third insulating layer 143 comprises an SOG layer, it is possible to solve a problem caused by a step in the peripheral region of the light emitting structure of the semiconductor device 200.

A step may be generated between the region where the upper reflective layer is provided and the region where the upper reflective layer is not provided in the vicinity of the light emitting structure of the semiconductor device 200. If the stepped difference is large in the vicinity of the light emitting structure of the semiconductor device 200, the thickness of the third insulating layer 143 may not be uniformly formed in the stepped region, and a pit may be partially formed. When a pit is formed in the third insulating layer 143, there is a risk that an insulation characteristic may be deteriorated, and electrical short may occur between the second electrode 160 and the first bonding pad 155 to be formed later.

However, according to the semiconductor device 200 of the embodiment, since the third insulating layer 143 comprises the SOG layer, pits can be prevented from being formed in the third insulating layer 143. Thus, according to the embodiment, it is possible to prevent electrical short between the second electrode 160 and the first bonding pad 155 from being occurred.

Next, as shown in FIGS. 13a to 13c, a first bonding pad 155 and a second bonding pad 165 may be formed on the third insulating layer 143.

FIGS. 13a to 13c are views showing an example in which the first bonding pad and the second bonding pad are formed in the method of manufacturing the semiconductor device according to the embodiment of the present invention. FIG. 13a is a plan view showing a shape of the first bonding pad and the second bonding pad formed according to the method of manufacturing the semiconductor device of the embodiment. FIG. 13c is a sectional view taken along line A-A of the semiconductor device according to the embodiment shown in FIG. 13a, and FIG. 13c is a sectional view taken along line B-B of the semiconductor device according to the embodiment shown in FIG. 13a.

According to the embodiment, as shown in FIGS. 13a to 13c, the first bonding pad 155 and the second bonding pad 165 may be formed on the third insulating layer 143 to be spaced apart from each other.

The first bonding pad 155 may be disposed on the plurality of fourth openings h4 and may be electrically connected to the first electrode 150. For example, a lower surface of the first bonding pad 155 may be disposed in direct contact with an upper surface of the first electrode 150 through the fourth opening h4.

The second bonding pad 165 may be disposed on the plurality of fifth openings h5 and may be electrically connected to the second electrode 160. For example, a lower surface of the second bonding pad 165 may be disposed in direct contact with an upper surface of the second electrode 160 through the fifth opening h5.

For example, the first bonding pad 155 and the second bonding pad 165 may be formed of selected material from a group including Ag, Ni, Al, Rh, Pd, Ir, Ru, Mg, Zn, Pt, Au, Hf, Ti, W, Cr, Cu, and those alloys including two or more materials above. The first bonding pad 155 and the second bonding pad 165 may be formed of one layer or a plurality of layers. The first bonding pad 155 and the second bonding pad 165 may comprise a diffusion barrier metal such as Cr, Cu, and the like to prevent diffusion of Sn from solder bonding. For example, the first bonding pad 155 and the second bonding pad 172 may be formed of a plurality of layers including Ti, Ni, Cu, Cr, and Au.

Meanwhile, FIG. 14 is a view showing another example of the semiconductor device according to the embodiment of the present invention, and FIG. 15 is a view showing a shape of a third insulating layer, a first bonding pad, and a second bonding pad which are applied to the semiconductor device shown in FIG. 14.

In describing another example of the semiconductor device according to the embodiment with reference to FIGS. 14 and 15, description overlapping with those described above may be omitted.

According to another example of the semiconductor device 200 of the embodiment, as shown in FIGS. 14 and 15, the shape of the third insulating layer 143 can be changed.

According to the embodiment, in a region under the first bonding pad 155, the third insulating layer 143 may comprise a plurality of openings provided to be arranged with a plurality of rows f1, f2, and f3, similar to those described with reference to FIGS. 1 to 5. The first bonding pad 155 may be electrically connected to the first electrode 150 through the plurality of openings provided in the plurality of rows f1, f2, and f3 of the third insulating layer 143.

In addition, according to the embodiment, in a region under the second bonding pad 165, the third insulating layer 143 may comprise a relatively large first opening Q1, unlike what is described with reference to FIGS. 1 to 5. The second bonding pad 165 may be electrically connected to the second electrode 160 through the first opening Q1 of the third insulating layer 143.

According to the embodiment, the third insulating layer 143 provides a relatively large first opening Q1 in the region under the second bonding pad 165 so that the second bonding pad 165 and the second electrode 160 can be in contact with each other in a wider area.

Accordingly, power can be efficiently supplied by the contact between the second bonding pad 165 and the second electrode 160. In addition, as the contact area between the second bonding pad 165 and the second electrode 160 increases, the heat generated in the light emitting structure can be effectively dissipated to the outside.

In addition, as the third insulating layer 143 disposed in the second bonding pad 165 and the second electrode 160 is removed, it is possible to reduce the inhibition of heat dissipate by the third insulating layer 143. Thus, according to the embodiment, the heat generated in the semiconductor device 200 can be efficiently dissipated to the outside.

Meanwhile, FIG. 16 is a view showing another example of the semiconductor device according to the embodiment of the present invention, and FIG. 17 is a view showing a shape of a third insulating layer, a first bonding pad, and a second bonding pad which are applied to the semiconductor device shown in FIG. 16.

In describing another example of the semiconductor device according to the embodiment with reference to FIGS. 16 and 17, description overlapping with those described above may be omitted.

According to another example of the semiconductor device 200 of the embodiment, as shown in FIGS. 16 and 17, the shape of the third insulating layer 143 can be changed. In addition, according to the embodiment, the shapes of the first bonding pad 155 and the second bonding pad 165 can be changed.

According to the embodiment, as shown in FIGS. 16 and 17, a width of the first bonding pad 155 and a width of the second bonding pad 165 may be provided to be different from each other. For example, the width of the first bonding pad 155 may be provided as "L1", and the width of the second bonding pad 165 may be provided as "L2" greater than "L1".

In addition, according to the embodiment, in a region under the first bonding pad 155, the third insulating layer 143 may comprise a plurality of openings provided to be arranged with a plurality of rows f1, f2, and f3, similar to those described with reference to FIGS. 1 to 5. The first bonding pad 155 may be electrically connected to the first electrode 150 through the plurality of openings provided in the plurality of rows f1, f2, and f3 of the third insulating layer 143.

In addition, according to the embodiment, in a region under the second bonding pad 165, the third insulating layer 143 may comprise a relatively large second opening Q2, unlike what is described with reference to FIGS. 1 to 5. The second bonding pad 165 may be electrically connected to the second electrode 160 through the second opening Q2 of the third insulating layer 143.

According to the embodiment, by providing a width L2 of the second bonding pad 165 larger than a width L1 of the first bonding pad 155, the second opening Q2 shown in FIG. 18 may be provided larger than the first opening Q1 shown in FIG. 16.

Accordingly, power can be efficiently supplied by the contact between the second bonding pad 165 and the second electrode 160. In addition, as the contact area between the second bonding pad 165 and the second electrode 160 increases, the heat generated in the light emitting structure can be effectively dissipated to the outside.

In addition, as the third insulating layer 143 disposed in the second bonding pad 165 and the second electrode 160 is removed, it is possible to reduce the inhibition of heat dissipate by the third insulating layer 143. Thus, according to the embodiment, the heat generated in the semiconductor device 200 can be efficiently dissipated to the outside.

Next, another example of a semiconductor device according to an embodiment of the present invention will be described with reference to FIGS. 18 to 22.

FIG. 18 is a view showing still another example of the semiconductor device according to the embodiment of the present invention, FIG. 19 is a view showing a region A2 of the semiconductor device shown in FIG. 18, FIG. 20 is a sectional view taken along line A-A of the semiconductor device shown in FIG. 19, FIG. 21 is a view showing a region B2 of the semiconductor device shown in FIG. 18, and FIG. 22 is a sectional view taken along line B-B of the semiconductor device shown in FIG. 21.

Meanwhile, in order to facilitate understanding, in FIGS. 18, 19, and 21, the first bonding pad 2155 and the second bonding pad 2165 disposed on an upper portion are treated as transparent so that the arrangement relationship of the components positioned in a lower portion can be easily grasped.

In describing the semiconductor device 2200 of the embodiment with reference to FIGS. 18 to 22, description overlapping with those described with reference to FIGS. 1 to 17 may be omitted.

The semiconductor device 2200 according to the embodiment of the present invention may comprise a plurality of light emitting structures P11, P12, P13, P21, P22, P23, . . . , a first electrode 2150, a second electrode 2160, a first bonding pad 2155, and a second bonding pad 2165, as shown in FIGS. 18 to 22.

The semiconductor device 2200 according to the embodiment may be a vertical cavity surface emitting laser (VCSEL), and may emit light generated in the plurality of light emitting structures P11, P12, P13, P21, P22, P23, . . . , for example, at a beam angle in a range of about 15 degrees to about 25 degrees. The plurality of light emitting structures P11, P12, P13, P21, P22, P23, . . . may comprise a first plurality of light emitting structures P11, P12, P13, . . . disposed under the first bonding pad 2155, and a second plurality of light emitting structures P21, P22, P23, . . . disposed under the second bonding pad 2165.

Each of the plurality of light emitting structures P11, P12, P13, P21, P22, P23, . . . may comprise a first conductivity type reflective layer, an active layer, and a second conductivity type reflective layer. For example, the reflective layer may be provided as a Distributed Bragg Reflector (DBR) layer. Each of the plurality of light emitting structures P11, P12, P13, P21, P22, P23, . . . may be formed in a similar structure, and a stacked structure of the semiconductor device 2200 according to the embodiment will be described with reference to cross sections shown in FIGS. 20 and 22.

As shown in FIGS. 18 to 22, the semiconductor device 2200 according to the embodiment may comprise a first bonding pad 2155 disposed in a first region and a second bonding pad 2165 disposed in a second region. The first bonding pad 2155 and the second bonding pad 2165 may be spaced apart from each other.

In addition, as shown in FIGS. 18 to 20, the semiconductor device 2200 according to the embodiment may comprise a first plurality of light emitting structures P11, P12, P13, . . . disposed in the first region. The first plurality of light emitting structures P11, P12, P13, . . . may be disposed under the first bonding pads 2155. The first plurality of light emitting structures P11, P12, P13, . . . may be spaced apart from each other.

Each of the first plurality of light emitting structures P11, P12, P13, . . . may comprise a first conductivity type reflective layer, an active layer disposed on the first conductivity type reflective layer, and a second conductivity type reflective layer disposed on the active layer.

The first conductivity type reflective layer of the first plurality of light emitting structures P11, P12, P13, P14, . . . may be referred to as a lower reflective layer. Also, the second conductivity type reflective layer of the first plurality of light emitting structures P11, P12, P13, . . . may be referred to as an upper reflective layer.

At this time, the first conductivity type reflective layers constituting the first plurality of light emitting structures P11, P12, P13, . . . may be electrically connected to each other. Also, the first conductivity type reflective layers constituting the first plurality of light emitting structures P11, P12, P13, . . . may be provided to be physically connected to each other.

The active layers constituting the first plurality of light emitting structures P11, P12, P13, . . . may be spaced apart from each other.

The second conductivity type reflective layers constituting the first plurality of light emitting structures P11, P12, P13, . . . may be spaced apart from each other. The second conductivity type reflective layers constituting the first plurality of light emitting structures P11, P12, P13, . . . may be electrically connected to each other.

In addition, as shown in FIGS. 18, 21, and 22, the semiconductor device 2200 according to the embodiment may comprise a second plurality of light emitting structures P21, P22, P23, . . . disposed in the second region. The second plurality of light emitting structures P21, P22, P23, . . . may be disposed under the second bonding pads 2165. The second plurality of light emitting structures P21, P22, P23, . . . may be spaced apart from each other.

Each of the second plurality of light emitting structures P21, P22, P23, . . . may comprise a first conductivity type reflective layer, an active layer disposed on the first conductivity type reflective layer, and a second conductivity type reflective layer disposed on the active layer.

The first conductivity type reflective layer of the second plurality of light emitting structures P21, P22, P23, . . . may be referred to as a lower reflective layer. The second conductivity type reflective layer of the second plurality of light emitting structures P21, P22, P23, . . . may be referred to as an upper reflective layer.

At this time, the first conductivity type reflective layers constituting the second plurality of light emitting structures P21, P22, P23, . . . may be electrically connected to each other. In addition, the first conductivity type reflective layers constituting the second plurality of light emitting structures P21, P22, P23, . . . may be provided to be physically connected to each other.

In addition, the first conductivity type reflective layers constituting the second plurality of the light emitting structures P21, P22, P23, . . . may be electrically connected to the first conductivity type reflective layers constituting the first plurality of the light emitting structures P11, P12, P13, . . . . The first conductivity type reflective layers constituting the second plurality of light emitting structures P21, P22, P23, . . . may be provided to be physically connected to the first conductivity type reflective layers constituting the first plurality of light emitting structures P11, P12, P13 . . . .

The active layers constituting the second plurality of light emitting structures P21, P22, P23, . . . may be spaced apart from each other. Also, the active layers constituting the second plurality of the light emitting structures P21, P22, P23, . . . may be spaced apart from the active layers constituting the first plurality of the light emitting structures P11, P12, P13, . . . each other.

The second conductivity type reflective layers constituting the second plurality of light emitting structures P21, P22, P23, . . . may be spaced apart from each other. Further, the second conductivity type reflective layers constituting the second plurality of light emitting structures P21, P22, P23, . . . may be electrically connected to each other.

In addition, the second conductivity type reflective layers constituting the second plurality of light emitting structures P21, P22, P23, . . . may be spaced apart from the second conductivity type reflective layers constituting the first plurality of light emitting structures P11, P12, P13, . . . each other, The second conductivity type reflective layers constituting the second plurality of light emitting structures P21, P22, P23, . . . may be electrically connected to the second conductivity type reflective layers constituting the first plurality of light emitting structures P11, P12, P13, . . . each other.

The first bonding pad 2155 and the second bonding pad 2165 may be spaced apart from each other. The first bonding pad 2155 may be electrically connected to the first electrode 2150. The first electrode 2150 may be disposed under the first bonding pad 2155.

For example, a lower surface of the first bonding pad 2155 may be disposed in direct contact with an upper surface of the first electrode 2150. The first electrode 2150 may be electrically connected to the first conductivity type reflective layer of the first plurality of light emitting structures P11, P12, P13, . . . . Also, the first electrode 2150 may be electrically connected to the first conductivity type reflective layer of the second plurality of light emitting structures P21, P22, P23 . . . .

The second bonding pad 2165 may be electrically connected to the second electrode 2160. The second electrode 2160 may be disposed under the second bonding pad 2165.

For example, a lower surface of the second bonding pad 2165 may be disposed in direct contact with an upper surface of the second electrode 2160. The second electrode 2160 may be electrically connected to the second conductivity type reflective layer of the second plurality of light emitting structures P21, P22, P23, . . . . Also, the second electrode 2160 may be electrically connected to the second conductivity type reflective layer of the first plurality of light emitting structures P11, P12, P13, . . . .

According to the embodiment, the first electrode 2150 may be disposed both under the first bonding pad 2155 and under the second bonding pad 2165. The first electrode 2150 may be electrically connected with the first bonding pad 2155 in a region where the first bonding pad 2155 is disposed. The first electrode 2150 may be electrically insulated from the second bonding pad 2165.

In addition, the second electrode 2160 may be disposed both under the first bonding pad 2155 and under the second bonding pad 2165. The second electrode 2160 may be electrically connected with the second bonding pad 2165 in a region where the second bonding pad 2165 is disposed. The second electrode 2160 may be electrically insulated from the first bonding pad 2155.

The electrical connection relationship between the first electrode 2150 and the first bonding pad 2155, and the electrical connection between the second electrode 2160 and the second bonding pad 2165 will be described later.

Then, referring to FIGS. 19 and 20, the structure of the semiconductor device 2200 according to the embodiment will be further described with reference to the first light emitting structure P11 disposed under the first bonding pad 2155. FIG. 20 is a sectional view taken along line A-A of the semiconductor device 2200 according to the embodiment shown in FIG. 19.

The semiconductor device 2200 according to the embodiment may comprise a first light emitting structure P11 disposed under the first bonding pad 2155, as shown in FIGS. 19 and 20.

The first light emitting structure P11 may comprise a first reflective layer 2110a of a first conductivity type, a second reflective layer 2120a of a second conductivity type, and a first active layer 2115a. The first active layer 2115a may be disposed between the first reflective layer 2110a and the second reflective layer 2120a. For example, the first active layer 2115a may be disposed on the first reflective layer 2110a, and the second reflective layer 2120a may be disposed on the first active layer 2115a. The first light emitting structure P11 may further comprise a first aperture layer 2117a disposed between the first active layer 2115a and the second reflective layer 2120a.

In addition, a first conductivity type reflective layer 2113 may be disposed around the first reflective layer 2110a of the first light emitting structure P11. The first conductivity type reflective layer 2113 may be disposed around the first light emitting structure P11. For example, the first conductivity type reflective layer 2113 may be disposed between the first plurality of light emitting structures P11, P12, P13, . . . .

A lower reflective layer of the first plurality of light emitting structures P11, P12, P13, . . . may be physically connected by the first conductivity type reflective layer 2113. For example, an upper surface of the first conductivity type reflective layer 2113 and an upper surface of the first reflective layer 2110a may be disposed on the same horizontal plane. The upper surface of the first conductivity type reflective layer 2113 and an upper surface of the lower reflective layer of the first plurality of the light emitting structures P11, P12, P13, . . . may be disposed on the same horizontal plane.

Next, with reference to FIGS. 21 and 22, the structure of the semiconductor device 2200 according to the embodiment will be further described with reference to the second light emitting structure P21 disposed under the second bonding pad 2165. FIG. 22 is a sectional view taken along line B-B of the semiconductor device 2200 according to the embodiment shown in FIG. 21.

The semiconductor device 2200 according to the embodiment may comprise a second light emitting structure P21 disposed under the second bonding pad 2165 as shown in FIGS. 21 and 22.

The second light emitting structure P21 may comprise a third reflective layer 2110b of the first conductivity type, a fourth reflective layer 2120b of the second conductivity type, and a second active layer 2115b. The second active layer 2115b may be disposed between the third reflective layer 2110b and the fourth reflective layer 2120b. For example, the second active layer 2115b may be disposed on the third reflective layer 2110b, and the fourth reflective layer 2120b may be disposed on the second active layer 2115b. The second light emitting structure P21 may further comprise a second aperture layer 2117b disposed between the second active layer 2115b and the fourth reflective layer 2120b.

In addition, a first conductivity type reflective layer 2113 may be disposed around the third reflective layer 2110b of the second light emitting structure P21. The first conductivity type reflective layer 2113 may be disposed around the second light emitting structure P21. For example, the first conductivity type reflective layer 2113 may be disposed between the second plurality of light emitting structures P21, P22, P23 . . . .

A lower reflective layer of the second plurality of light emitting structures P21, P22, P23, . . . may be physically connected by the first conductivity type reflective layer 2113. For example, an upper surface of the first conductivity type reflective layer 2113 and an upper surface of the third reflective layer 2110b may be disposed on the same horizontal plane. The upper surface of the first conductivity type reflective layer 2113 and an upper surface of the lower reflective layer of the second plurality of light emitting structures P21, P22, P23, . . . may be disposed on the same horizontal plane.

In addition, the semiconductor device 2200 according to the embodiment may comprise a first insulating layer 2141, as shown in FIGS. 20 and 22.

The first insulating layer 2141 is not shown in FIGS. 18, 19, and 21 in order to solve the complexity of the drawing and help understand the structure. Meanwhile, according to the semiconductor device 2200 of another embodiment, the first insulating layer 2141 may be omitted.

The first insulating layer 2141 may be disposed on a side surface of the first light emitting structure P11. The first insulating layer 2141 may be disposed to surround the side surface of the first light emitting structure P11.

The first insulating layer 2141 may be disposed on a side surface of the upper reflective layer of the first plurality of light emitting structures P11, P12, P13, . . . . The first insulating layer 2141 may be disposed to surround the side surfaces of the first plurality of light emitting structures P11, P12, P13 . . . .

The first insulating layer 2141 may expose an upper surface of the first light emitting structure P11. The first insulating layer 2141 may expose an upper surface of the second reflective layer 2120a of the first light emitting structure P11.

The first insulating layer 2141 may expose an upper surface of the first plurality of light emitting structures P11, P12, P13, . . . . The first insulating layer 2141 may expose an upper surface of the upper reflective layer of the first plurality of light emitting structures P11, P12, P13, . . . .

In addition, the first insulating layer 2141 may be disposed on a side surface of the second light emitting structure P21. The first insulating layer 2141 may be disposed to surround the side surface of the second light emitting structure P21.

The first insulating layer 2141 may be disposed on a side surface of the upper reflective layer of the second plurality of light emitting structures P21, P22, P23, . . . . The first insulating layer 2141 may be disposed to surround the side surfaces of the second plurality of light emitting structures P21, P22, P23, . . . .

The first insulating layer 2141 may expose an upper surface of the second light emitting structure P21. The first insulating layer 2141 may expose an upper surface of the fourth reflective layer 2120b of the second light emitting structure P21.

The first insulating layer 2141 may expose an upper surface of the second plurality of light emitting structures P21, P22, P23, . . . . The first insulating layer 2141 may expose an upper surface of the upper reflective layer of the second plurality of light emitting structures P21, P22, P23 . . . .

In addition, the semiconductor device 2200 according to the embodiment may comprise a first electrode 2150, as shown in FIGS. 18 to 22. The first electrode 2150 may be disposed around the plurality of light emitting structures P11, P12, P13, P21, P22, P23 . . . .

The first electrode 2150 may be disposed around the first plurality of light emitting structures P11, P12, P13, . . . . The first electrode 2150 may provide a plurality of first openings h1 exposing the first plurality of light emitting structures P11, P12, P13, . . . . The active layer and the upper reflective layer of the first plurality of light emitting structures P11, P12, P13, . . . may be exposed by the plurality of first openings h1.

In other words, under the first bonding pad 2155, the first electrode 2150 may provide the plurality of first openings h1 exposing the second conductivity type reflective layer of the first plurality of light emitting structures P11, P12, P13, . . . , and may be electrically connected to the first conductivity type reflective layer of the first plurality of light emitting structures P11, P12, P13, . . . .

In addition, the first electrode 2150 may be disposed around the second plurality of light emitting structures P21, P22, P23, . . . . The first electrode 2150 may provide a plurality of second openings h2 exposing the second plurality of light emitting structures P21, P22, P23, . . . . The active layer and the upper reflective layer of the second plurality of light emitting structures P21, P22, P23, . . . may be exposed by the plurality of second openings h2.

In other words, under the second bonding pad 2165, the first electrode 2150 may provide the plurality of second openings h2 exposing the second conductivity type reflective layer of the second plurality of light emitting structures P21, P22, P23, . . . , and may be electrically connected to the first conductivity type reflective layer of the second plurality of light emitting structures P21, P22, P23, . . . .

The first electrode 2150 may be disposed on the first conductivity type reflective layer 2113. The first electrode 2150 may be electrically connected with the first reflective layer 2110a of the first light emitting structure P11. The first electrode 2150 may be electrically connected with the third reflective layer 2110b of the second light emitting structure P21.

The semiconductor device 2200 according to the embodiment may comprise a second electrode 2160, as shown in FIGS. 18 to 22. The second electrode 2160 may be disposed on the plurality of light emitting structures P11, P12, P13, P21, P22, P23, . . . . The second electrode 2160 may be disposed under the first bonding pad 2155 and under the second bonding pad 2165.

The second electrode 2160 may be disposed on the first plurality of light emitting structures P11, P12, P13, . . . , as shown in FIGS. 19 and 20. The second electrode 2160 may be disposed on the upper reflective layer of the first plurality of light emitting structures P11, P12, P13 . . . . The second electrode 2160 may be disposed on the first electrode 2150.

The second electrode 2160 may be electrically connected with the second reflective layer 2120a of the first light emitting structure P11. The second electrode 2160 may comprise an upper electrode 2160a and a connection electrode 2160b.

The upper electrode 2160a may be disposed in contact with the upper surface of the upper reflective layer of the first plurality of light emitting structures P11, P12, P13, . . . . The connection electrode 2160b may be disposed on a side surface and periphery of the first plurality of the light emitting structures P11, P12, P13, . . . , so as to electrically connected to the upper electrode 2160a. The connection electrode 2160b may electrically connect the upper electrode 2160a disposed on the first plurality of light emitting structures P11, P12, P13, . . . .

The second electrode 2160 may provide a third opening h3 exposing the first electrode 2150 disposed around the first active layer 2115a of the first light emitting structure P11. An upper surface of the first electrode 2150 may be exposed through the third opening h3.

The second electrode 2160 may be disposed on a side surface of the first light emitting structure P11. The second electrode 2160 may be disposed on the upper surface of the first light emitting structure P11. The upper electrode 2160a of the second electrode 2160 may be disposed on the second reflective layer 2120a of the first light emitting structure P11. The upper electrode 2160a of the second electrode 2160 may be disposed in direct contact with the upper surface of the second reflective layer 2120a.

In addition, the second electrode 2160 may be disposed on the second plurality of light emitting structures P21, P22, P23, . . . , as shown in FIGS. 21 and 22. The second electrode 2160 may be disposed on the upper reflective layer of the second plurality of light emitting structures P21, P22, P23, . . . . The second electrode 2160 may be disposed on the first electrode 2150.

The second electrode 2160 may be electrically connected with the fourth reflective layer 2120b of the second light emitting structure P21. The second electrode 2160 may comprise an upper electrode 2160a and a connection electrode 2160b.

The upper electrode 2160a may be disposed in contact with the upper surface of the upper reflective layer of the second plurality of light emitting structures P21, P22, P23, . . . . The connection electrode 2160b may be disposed on a side surface and periphery of the second plurality of light emitting structures P21, P22, P23, . . . so as to be electrically connected with the upper electrode 2160a. The connection electrode 2160b may electrically connect the upper electrode 2160a disposed on the second plurality of light emitting structures P21, P22, P23 . . . .

The second electrode 2160 may be disposed on a side surface of the second light emitting structure P21. The second electrode 2160 may be disposed on the upper surface of the second light emitting structure P21. The upper electrode 2160a of the second electrode 2160 may be disposed on the fourth reflective layer 2120b of the second light emitting structure P21. The upper electrode 2160a of the second electrode 2160 may be disposed in direct contact with the upper surface of the fourth reflective layer 2120b.

The semiconductor device 2200 according to an embodiment may comprise a second insulating layer 2142, as shown in FIGS. 19 to 22.

The second insulating layer 2142 may be disposed between the first electrode 2150 and the second electrode 2160. The second insulating layer 2142 may be disposed between an upper surface of the first electrode 2150 and a lower surface of the second electrode 2160. The second insulating layer 2142 may electrically insulate the first electrode 2150 and the second electrode 2160.

The second insulating layer 2142 may provide a plurality of openings exposing an upper surface of the first plurality of light emitting structures P11, P12, P13, . . . under the first bonding pads 2155. The second insulating layer 2142 may provide a plurality of openings in which the second conductivity type reflective layer of the first plurality of light emitting structures P11, P12, P13, . . . and the second electrode 2160 are electrically connected, under the first bonding pad 2155.

In addition, the second insulating layer 2142 may provide a plurality of openings exposing an upper surface of the first electrode disposed around the first plurality of the light emitting structures P11, P12, P13, . . . under the first bonding pad 2155. The second insulating layer 2142 may provide a plurality of openings in which the first conductivity type reflective layer of the first plurality of the light emitting structures P11, P12, P13, . . . and the first bonding pad 2155 are electrically connected, under the first bonding pad 2155.

The second insulating layer 2142 may provide a plurality of openings exposing an upper surfaces of the second plurality of light emitting structures P21, P22, P23, . . . under the second bonding pads 2165. The second insulating layer 2142 may provide a plurality of openings in which the second conductivity type reflective layer of the second plurality of light emitting structures P21, P22, P23, . . . and the second electrode 2160 are electrically connected, under the second bonding pad 2165.

In addition, according to the semiconductor device 2200 of the embodiment, the second conductivity type reflective layer of the second plurality of light emitting structures P21, P22, P23, . . . , and the second bonding pad 2165 may be electrically connected through a plurality of openings provided in the second insulating layer 2142, under the second bonding pads 2165.

The semiconductor device 2200 according to the embodiment may comprise a third insulating layer 2143, as shown in FIGS. 18 to 22.

The third insulating layer 2143 may be disposed under the first bonding pad 2155 and under the second bonding pad 2165. The third insulating layer 2143 may be disposed on the second electrode 2160 under the first bonding pad 2155. Also, the third insulating layer 2143 may be disposed on the second electrode 2160 under the second bonding pad 2165.

The third insulating layer 2143 may be disposed on the upper electrode 2160a of the second electrode 2160 under the first bonding pad 2155 as shown in FIGS. 19 and 20. The third insulating layer 2143 may provide a plurality of fourth openings h4 exposing the first electrode 2150 under the first bonding pad 2155. For example, the fourth opening h4 may be provided in a region where the third opening h3 is formed.

The third insulating layer 2143 may provide the plurality of fourth openings h4 in which the first bonding pad 2155 and the first electrode 2155 are electrically connected, in a first region in which the first bonding pad 2155 is disposed.

According to the embodiment, an area of the fourth opening h4 may be provided smaller than an area of the first active layer 2115*a*. The area of the fourth opening h4 may be provided smaller than an area of the second reflective layer 2120*a*.

Also, according to the embodiment, an area of the third opening h3 may be provided greater than the area of the fourth opening h4. The area of the third opening h3 may be provided smaller than the area of the first active layer 2115*a*. The area of the third opening h3 may be provided smaller than the area of the second reflective layer 2120*a*.

The fourth opening h4 may be provided in a region surrounded by three light emitting structures among the first plurality of light emitting structures P11, P12, P13, . . . . For example, one of the fourth openings h4 may be provided in a space surrounded by the P11, P12, and P13 light emitting structures.

For example, a distance from the center of the fourth opening h4 to the center of the P11 light emitting structure, and a distance from the center of the fourth opening h4 to the center of the P12 light emitting structure can be similarly provided. Further, the distance from the center of the fourth opening h4 to the center of the P11 light emitting structure and a distance from the center of the fourth opening h4 to the center of the P13 light emitting structure can be similarly provided.

In addition, three fourth openings h4 may be provided around the first light emitting structure P11. For example, the distances from the center of the first light emitting structure P11 to the centers of the three fourth openings h4 disposed adjacent to the first light emitting structure P11 may be provided to be similar to each other.

The third insulating layer 2143 may be disposed on the upper electrode 2160*a* of the second electrode 2160 under the second bonding pad 2165 as shown in FIGS. 21 and 22. The third insulating layer 2143 may provide a plurality of fifth openings h5 exposing the second electrode 2160 under the second bonding pad 2165. The third insulating layer 2143 may provide the fifth opening h5 exposing an upper surface of the connection electrode 2160*b* of the second electrode 2160 under the second bonding pad 2165.

The third insulating layer 2143 may provide the fifth opening h5 exposing the second electrode 2160 disposed around the second active layer 2115*b* of the second light emitting structure P21. The third insulating layer 2143 may provide the fifth opening h5 exposing the connection electrode 2160*b* of the second electrode 2160 disposed around the fourth reflective layer 2120*b* of the second light emitting structure P21. The upper surface of the second electrode 2160 may be exposed through the fifth opening h5.

The third insulating layer 2143 may provide the plurality of fifth openings in which the second bonding pad 2165 and the second electrode 2160 are electrically connected, in a second region in which the second bonding pad 2165 is disposed.

According to the embodiment, an area of the fifth opening h5 may be provided smaller than an area of the second active layer 2115*b*. The area of the fifth opening h5 may be provided smaller than an area of the fourth reflective layer 2120*b*.

The fifth opening h5 may be provided in a region surrounded by three light emitting structures among the second plurality of light emitting structures P21, P22, P23, . . . . For example, one of the fifth openings h5 may be provided in a space surrounded by P21, P22, and P23 light emitting structures.

For example, a distance from the center of the fifth opening h5 to the center of the P21 light emitting structure and a distance from the center of the fifth opening h5 to the center of the P22 light emitting structure can be similarly provided. Further, the distance from the center of the fifth opening h5 to the center of the P21 light emitting structure and a distance from the center of the fifth opening h5 to the center of the P23 light emitting structure can be similarly provided.

In addition, three fifth openings h5 may be provided around the second light emitting structure P21. For example, the distances from the center of the second light emitting structure P21 to the centers of the three fifth openings h5 disposed adjacent to the second light emitting structure P21 may be provided to be similar to each other.

According to the embodiment, as shown in FIGS. 18 to 22, it may comprise the first bonding pad 2155 and the second bonding pad 2165. The first bonding pad 2155 and the second bonding pad 2165 may be spaced apart from each other.

The first bonding pad 2155 may be electrically connected to the first electrode 2150 through a region in which the fourth opening h4 is provided. The lower surface of the first bonding pad 2155 may contact with the upper surface of the first electrode 2150 through the fourth opening h4.

Also, the second bonding pad 2165 may be electrically connected to the second electrode 2160 through a region in which the fifth opening h5 is provided. The lower surface of the second bonding pad 2165 may contact with the upper surface of the second electrode 2160 through the fifth opening h5. The lower surface of the second bonding pad 2165 may be in contact with the upper surface of the connection electrode 2160*b* of the second electrode 2160 through the fifth opening h5.

Meanwhile, according to the semiconductor device 2200 of the embodiment, as shown in FIG. 18, the third insulating layer 2143 may comprise a plurality of fourth openings h4 provided under the first bonding pad 2155. At this case, as an example, the plurality of fourth openings h4 may be provided in a plurality of rows arranged under the first bonding pad 2155.

Meanwhile, according to the semiconductor device 2200 of the embodiment, as shown in FIG. 18, the third insulating layer 2143 may comprise a plurality of fifth openings h5 provided under the second bonding pad 2165.

In this case, as an example, the plurality of fifth openings h5 may be provided to be arranged in a plurality of rows arranged under the second bonding pad 2165.

Meanwhile, according to the semiconductor device 2200 of the embodiment, as shown in FIGS. 18 to 20, the lower surface of the first bonding pad 2155 and the upper surface of the first electrode 2155 may be contacted through the fourth opening h4. At this time, a region of the upper surface of the first electrode 2150, that is contacted with the lower surface of the first bonding pad 2155 through the fourth opening h4, may be provided in a space surrounded by the P11, P12, and P13 light emitting structures.

According to the embodiment, an area of the region of the upper surface of the first electrode 2150, that is contacted with the lower surface of the first bonding pad 2155 through the fourth opening h4, may be provided smaller than an area of an upper surface of the first active layer 115*a*.

In addition, according to the semiconductor device 2200 of the embodiment, as shown in FIGS. 18, 21, and 22, the lower surface of the second bonding pad 2165 and the upper surface of the second electrode 160 may be contacted through the fifth opening h5. At this time, a region of the upper surface of the second electrode 2160, that is contacted with the lower surface of the second bonding pad 2165 through the fifth opening h5, may be provided in a space surrounded by the P21, P22, and P23 light emitting structure.

According to the embodiment, an area of the region of the upper surface of the second electrode 2160, that is contacted with the lower surface of the second bonding pad 2165 through the fifth opening h5, may be provided smaller than an area of an upper surface of the second active layer 2115b.

Meanwhile, FIG. 23 is a view explaining a contact region between a bonding pad and an electrode in the semiconductor device according to the embodiment of the present invention. In describing the semiconductor device 2200 according to the embodiment with reference to FIG. 23, description overlapping with those described with reference to FIGS. 18 to 22 may be omitted.

As an example, in the semiconductor device 2200 according to the embodiment, each light emitting structure may be provided with a diameter of "d", the distance between the light emitting structures may be provided with a length of "d", and the fourth opening h4 may be provided with a diameter of "D".

The diameter of the light emitting structure may be provided, for example, several tens of micrometers. For example, when the diameter of the light emitting structure is provided of 30 micrometers, the distance between the neighboring light emitting structures may be designed to be greater than 50 micrometers.

At this time, the distance between the neighboring light emitting structures is provided greater than 50 micrometers, and the fourth opening h4, through which the first bonding pad 2155 and the first electrode 2150 can be in contact, may be provided in a space surrounded by the P11, P12 and P13 light emitting structures.

According to the embodiment, in the case of a semiconductor device to which a high current is applied, it having a larger gap between the light emitting structures can exhibit better characteristics. For example, in a semiconductor device to which a high current of 5 amperes or more is applied, the light emitting characteristic may be deteriorated due to a heat generation problem in the light emitting structure. Therefore, by arranging the spaces between the light emitting structures larger, it is possible to reduce the degradation of the light emitting characteristics due to the heat generated in the light emitting structure.

Thus, according to the embodiment, by designing the space between the light emitting structures to be relatively large, a sufficient space can be provided so that the fourth opening h4 can be formed between the light emitting structures. Also, the current injection can be smoothly performed by the electrical contact between the first bonding pad 2155 and the first electrode 2150 through the fourth opening h4.

Referring to FIG. 23, the design described with reference to the first bonding pad 2155 and the fourth opening h4 may be similarly applied to the second bonding pad 2165 and the fifth opening h5.

According to the embodiment, by designing the space between the light emitting structures to be relatively large, a sufficient space can be provided between the light emitting structures so that the fifth opening h5 can be formed. Also, the current injection can be smoothly performed by electrical contact between the second bonding pad 2165 and the second electrode 2160 through the fifth opening h5.

Meanwhile, as described with reference to FIG. 7, according to the conventional semiconductor device, when viewed from the upper direction of the semiconductor device, the difference in intensity of light emission in the first region R1 closer to the electrode pad and in the second region R2 relatively far from the electrode pad may be generated. This is because the diffusion of the current supplied through the second electrode is not smooth in the light emitting structure located in the region far from the electrode pad disposed at one end of the outer edge of the semiconductor device when viewed from the upper direction of the semiconductor device.

However, according to the semiconductor device 2200 of the embodiment, power can be supplied in a flip-chip manner through the first bonding pad 2155 and the second bonding pad 2165 as described above, the current can be smoothly diffused and supplied to the light emitting structure disposed in the entire area of the light emitting structure 2200. Thus, according to the semiconductor device 2200 of the embodiment, light can be efficiently and uniformly emitted from a plurality of light emitting structures arranged in the entire region.

Meanwhile, the semiconductor device 2200 according to the embodiment may further comprise a substrate 2105, as shown in FIGS. 18 to 22. A plurality of light emitting structures P11, P12, P13, P21, P22, P23, . . . may be disposed on the substrate 2105. For example, the substrate 2105 may be a growth substrate on which the plurality of light emitting structures P11, P12, P13, P21, P22, P23, . . . may be grown. For example, the substrate 2105 may be an intrinsic semiconductor substrate.

According to the semiconductor device 2200 of the embodiment, power may be supplied to the plurality of light emitting structures P11, P12, P13, P21, P22, P23 . . . through the first bonding pad 2155 and the second bonding pad 2165. The first electrode 2150 may be disposed on the upper surface of the first conductivity type reflective layer of the plurality of light emitting structures P11, P12, P13, P21, P22, P23, . . . . The second electrode 2160 may be disposed on the upper surface of the second conductivity type reflective layer of the plurality of light emitting structures P11, P12, P13, P21, P22, P23, . . . .

Therefore, according to the embodiment, when power is supplied to the plurality of light emitting structures P11, P12, P13, P21, P22, P23, . . . , power is not need to be supplied through the lower surface of the substrate 2105. In a conventional semiconductor device, when power is to be applied through the lower surface of the substrate 2105, the substrate 2105 must be provided as a conductive substrate. However, according to the semiconductor device 2200 of the embodiment, the substrate 2105 may be a conductive substrate or an insulating substrate. As an example, the substrate 2105 according to the embodiment may be provided as an intrinsic semiconductor substrate.

In addition, the substrate 2105 may be a support substrate attached to the plurality of light emitting structures P11, P12, P13, P21, P22, P23, . . . , in which the support substrate may be attached after the plurality of light emitting structures P11, P12, P13, P21, P22, P23, . . . are grown on a growth substrate and the growth substrate is removed.

Meanwhile, the semiconductor device 2200 according to the embodiment may be implemented such that light is emitted in a downward direction of the semiconductor device 2200, as shown in FIGS. 18 to 22. According to the embodiment, the reflectance of the lower reflective layer of the semiconductor element 2200 can be provided to be smaller than the reflectance of the upper reflective layer.

That is, according to the semiconductor device 2200 of the embodiment, light can be emitted in a direction in which the lower reflective layer is disposed from the active layer constituting the plurality of light emitting structures P11, P12, P13, P21, P22, P23, . . . . Light may be emitted from the active layer constituting the plurality of light emitting structures P11, P12, P13, P21, P22, P23, . . . in the direction in which the substrate 2105 is disposed.

According to the embodiment, the second electrode 2160 is disposed on the upper surface of the second conductivity type reflective layer of the plurality of light emitting structures P11, P12, P13, P21, P22, P23, . . . , and the second bonding pad 2165 is disposed on and in contact with the second electrode 2160. Also, the first electrode 2150 is disposed on the upper surface of the first conductivity type reflective layer of the plurality of light emitting structures P11, P12, P13, P21, P22, P23, . . . , and the first bonding pad 2155 is disposed on and in contact with the first electrode 2150.

Accordingly, the heat generated in the plurality of light emitting structures P11, P12, P13, P21, P22, P23, . . . can be effectively dissipated to the outside through the first bonding pad 2155 and the second bonding pad 2165.

Meanwhile, in the case of a general semiconductor device, it is known that the power conversion efficiency (PCE) is significantly lowered due to the heat generated in the light emitting structure. When power is supplied to the light emitting structure through the substrate disposed at the lower portion, generally heat dissipation is performed through the substrate.

However, since the thermal conductivity of the substrate is low, it is difficult to dissipate the heat generated in the light emitting structure to the outside. For example, it is known that the thermal conductivity of a GaAs substrate is as low as 52 W/(m*K).

However, according to the embodiment, since the first bonding pad 2155 and the second bonding pad 2165 may be connected to the external heat dissipating substrate or the like, so that heat generated in the plurality of light emitting structures P11, P12, P13, P21, P22, P23, . . . can be effectively dissipated to the outside. Therefore, according to the embodiment, since the heat generated in the semiconductor device 2200 can be effectively dissipated to the outside, the power conversion efficiency (PCE) can be improved.

Meanwhile, according to the semiconductor device 2200 of the embodiment, as described above, light can be emitted in a downward direction of the semiconductor device 2200. According to the semiconductor device 2200 of the embodiment, the reflectance of the first conductivity type reflective layer provided in a lower portion of the plurality of light emitting structures P11, P12, P13, P21, P22, P23, . . . can be selected to be smaller than the reflectance of the second conductivity type reflective layer provided in an upper portion of the plurality of light emitting structures P11, P12, P13, P21, P22, P23, . . . . Accordingly, light generated in the plurality of light emitting structures P11, P12, P13, P21, P22, P23, . . . can be emitted toward the substrate 2105 of the semiconductor device 2200.

In addition, according to the semiconductor device 2200 of the embodiment, the second insulating layer 2142 may be provided as a DBR layer. According to the semiconductor device 2200 of the embodiment, the third insulating layer 2143 may be provided as a DBR layer. According to the embodiment, at least one of the second insulating layer 2142 and the third insulating layer 2143 may be provided as a DBR layer. Accordingly, light generated in the plurality of light emitting structures P11, P12, P13, P21, P22, P23, . . . can be reflected by the second insulating layer 2142 and the third insulating layer 2143 disposed at the upper portion and can be effectively extracted downward.

For example, at least one of the second insulating layer 2142 and the third insulating layer 2143 may be provided as a DBR layer formed by stacking $SiO_2$ and $TiO_2$ as a plurality of layers. Also, at least one of the second insulating layer 2142 and the third insulating layer 2143 may be provided as a DBR layer formed by stacking $Ta_2O_3$ and $SiO_2$ as a plurality of layers. Also, at least one of the second insulating layer 2142 and the third insulating layer 2143 may be provided as a DBR layer formed by stacking $SiO_2$ and $Si_3N_4$ as a plurality of layers.

In addition, according to the semiconductor device 2200 of the embodiment, at least one of the second insulating layer 2142 and the third insulating layer 2143 may comprise a spin on glass (SOG) layer. For example, according to the semiconductor device 2200 of the embodiment, at least one of the second insulating layer 2142 and the third insulating layer 2143 may comprise a plurality of insulating layers including an SOG layer.

If the second insulating layer 2142 or the third insulating layer 2143 comprises the SOG layer, it is possible to solve the problem caused by a step in the peripheral region of the semiconductor device 2200. A step may be generated between the region where the upper reflective layer is provided and the region where the upper reflective layer is not provided in the vicinity of the light emitting structure of the semiconductor element 2200.

At this time, if the stepped portion is formed to be large in the vicinity of the light emitting structure of the semiconductor device 2200, the thickness of the second insulating layer 2142 or the third insulating layer 2143 may not be uniformly formed in the stepped region, and pit can be formed. Also, when a pit is formed in the second insulating layer 2142 or the third insulating layer 2143, an insulation characteristic may be deteriorated, and electrical short may occur between the first electrode 2150 and the second electrode 2160 or electrical short may occur between the first bonding pad 2155 and the second bonding pad 2165.

However, according to the semiconductor device 2200 of the embodiment, since the second insulating layer 2142 or the third insulating layer 2143 comprises the SOG layer, pits can be prevented from being formed in the second insulating layer 2142 or the third insulating layer 2143. Accordingly, electrical short between the first electrode 2150 and the second electrode 2160, and electrical short between the first bonding pad 2155 and the second bonding pad 2165 can be prevented from being occurred.

Meanwhile, in the conventional semiconductor device, when the power is supplied to the light emitting structure through the substrate, the substrate must be conductive. Accordingly, when a conductive semiconductor substrate is applied, a dopant is added to the substrate to improve the conductivity. However, the dopant added to the substrate causes absorption and scattering of the emitted light, which may cause a decrease in power conversion efficiency (PCE).

However, according to the semiconductor device 2200 of the embodiment, as described above, the substrate 2105 may not be a conductive substrate, so that an additional dopant may not be added to the substrate 2105. Accordingly, dopant is not added to the substrate 2105 according to the embodiment, so that absorption and scattering by the dopant in the substrate 2105 can be reduced. Therefore, according to the embodiment, light generated in the plurality of light emitting structures P11, P12, P13, P21, P22, P23, . . . can be effectively provided in a downward direction, and power conversion efficiency (PCE) can be improved.

In addition, the semiconductor device 2200 according to the embodiment may further comprise an anti-reflection layer provided on the lower surface of the substrate 2105. The anti-reflection layer prevents light emitted from the semiconductor device 2200 from being reflected on the surface of the substrate 2105 and transmits the light, thereby improving light loss due to reflection.

Hereinafter, a method of manufacturing a semiconductor device according to an embodiment of the present invention will be described with reference to the drawings. In explaining the method of manufacturing the semiconductor device according to the embodiment, description overlapping with those described with reference to FIGS. 1 to 23 may be omitted.

First, FIGS. 24a to 24c are views showing an example in which a light emitting structure is formed in the method of manufacturing the semiconductor device according to the embodiment of the present invention. FIG. 24a is a plan view showing a step of forming a light emitting structure according to the method of manufacturing the semiconductor device of the embodiment, FIG. 24b is a sectional view taken along line A-A of the semiconductor device according to the embodiment shown in FIG. 24a, and FIG. 24c is a sectional view taken along line B-B of the semiconductor device according to the embodiment shown in FIG. 24a.

According to the method of manufacturing the semiconductor device of the embodiment, as shown in FIGS. 24a to 24c, a plurality of light emitting structures P11, P12, P21, P22, . . . may be formed on a substrate 2105.

The substrate 2105 may be any one selected from an intrinsic semiconductor substrate, a conductive substrate, and an insulating substrate.

For example, a first conductivity type reflective layer, an active layer, and a second conductivity type reflective layer may be sequentially formed on the substrate 2105. The plurality of light emitting structures P11, P12, P13, P21, P22, P23, . . . may be formed through a mesa etching for the second conductivity type reflective layer and the active layer.

The plurality of light emitting structures P11, P21, . . . may comprise a first conductivity type reflective layer 110a, 110b, . . . , an active layer 115a, 115b, . . . , an aperture layer 117a, 117b, . . . , and a second conductivity type reflective layer 120a, 120b, . . . . A first conductivity type reflective layer 2113 may be provided around the plurality of light emitting structures P11, P12, P21, P22, . . . . The first conductivity type reflective layer 2113 may be disposed in a region between the plurality of light emitting structures P11, P12, P21, P22, . . . .

The first conductivity type reflective layer 2110a, 2110b, . . . constituting the plurality of light emitting structures P11, P21, . . . may be provided of at least one of a Group III-V or a Group II-VI compound semiconductors doped with a dopant of the first conductivity type. The active layer 2115a, 2115b, . . . constituting the plurality of light emitting structures P11, P21, . . . may be provided of at least one of a Group III-V or a Group II-VI compound semiconductors. The aperture layer 2117a, 2117b, . . . constituting the plurality of light emitting structures P11, P21, . . . may be disposed on the active layer 2115a, 2115b, . . . . The aperture layer 2117a, 2117b, . . . may comprise circular opening at the central portion. The aperture layer 2117a, 2117b, . . . may comprise a function of restricting current movement so as to concentrate current to the central portion of the active layer 2115a, 2115b, . . . .

The second conductivity type reflective layer 2120a, 2120b, . . . constituting the plurality of light emitting structures P11, P21, . . . may be provided of at least one of a group III-V or a group II-VI compound semiconductor doped with a dopant of the second conductivity type. For example, the second conductivity type reflective layer 2120a, 2120b, . . . may have a higher reflectance than the first conductivity type reflective layer 2110a, 2110b, . . . . For example, the second conductivity type reflective layer 2120a, 2120b, . . . and the first conductivity type reflective layer 2110a, 2110b, . . . can form a resonance cavity in a vertical direction by a reflectance of 90% or more. At this time, the generated light can be emitted to the outside through the first conductivity type reflective layer 2110a, 2110b, . . . , which is lower than the reflectance of the second conductivity type reflective layer 2120a, 2120b . . . .

Next, as shown in FIGS. 25a to 25c, a first electrode 2150 may be formed.

FIGS. 25a to 25c are views showing an example in which a first electrode is formed in the method of manufacturing the semiconductor device according to the embodiment of the present invention. FIG. 25a is a plan view showing a shape of the first electrode provided according to the method of manufacturing the semiconductor device of the embodiment, FIG. 25c is a sectional view taken along line A-A of the semiconductor device according to the embodiment shown in FIG. 25a, and FIG. 25c is a sectional view taken along line B-B of the semiconductor device according to the embodiment shown in FIG. 25a.

According to the embodiment, as shown in FIGS. 25a to 25c, the first electrode 2150 may be formed around the plurality of light emitting structures P11, P12, P21, P22, . . . .

The first electrode 2150 may be formed on the first conductivity type reflective layer 2113, and may comprise a plurality of first openings h1 exposing the first plurality of light emitting structures P11, P12 . . . . The first electrode 2150 may be formed in a region between the first plurality of light emitting structures P11, P12, . . . .

In addition, the first electrode 2150 may be formed on the first conductivity type reflective layer 2113, and comprise a plurality of second openings h2 exposing the second plurality of light emitting structures P21, P22, . . . . The first electrode 2150 may be formed in a region between the second plurality of light emitting structures P21, P22, . . . .

Meanwhile, according to the embodiment, a first insulating layer 2141 may be further formed on the side surfaces of the plurality of light emitting structures P11, P12, P21, P22, . . . before the first electrode 2150 is formed. The first insulating layer 2141 may be formed on the upper surface and the side surfaces of the plurality of light emitting structures P11, P12, P21, P22, . . . . The first insulating layer 2141 may electrically insulate the first electrode 2150 from the active layer and the upper reflective layer of the plurality of light emitting structures P11, P12, P21, P22 . . . .

According to another embodiment, since the first electrode 2150 is disposed spaced apart from the side surfaces of the plurality of light emitting structures P11, P12, P21, P22, . . . , the first insulating layer 2141 may not be formed and may be omitted if electrical insulation characteristics between the first electrode 2150, and the active layer and the upper reflective layer of the plurality of light emitting structures P11, P12, P21, P22, . . . are stably ensured.

In addition, an area An of the first electrode 2150 may be provided greater than an area Am of the plurality of light emitting structures P11, P12, P21, P22, . . . . Here, the area Am of the plurality of light emitting structures P11, P12, P21, P22, . . . may indicate the area of the remaining active layer 115a, 115b, . . . , without being etched by the mesa etching. A ratio of Am/An, that is the area Am of the plurality of light emitting structures P11, P12, P21, P22, . . . with reference to the area An of the first electrode 2150, may be provided greater than 25%, for example. According to the semiconductor device 2200 of the embodiment, the number and the diameter of the plurality of light emitting structures P11, P12, P21, P22, . . . may be variously modified according to the application example.

According to the embodiment, the ratio of Am/An, that is the area Am of the plurality of light emitting structures P11, P12, P21, P22, . . . with reference to the area An of the first electrode 2150, may be provided of, for example, in a range of 25% to 70%. According to another embodiment, the ratio of Am/An, that is the area Am of the plurality of light emitting structures P11, P12, P21, P22, . . . with reference to the area An of the first electrode 2150, may be provided of, for example, in a range of 30% to 60%.

The number and diameter of the plurality of light emitting structures P11, P12, P21, P22, . . . disposed in the semiconductor device 2200 can be variously changed according to the application example of the semiconductor device 2200 of the embodiment. The following [Table 2] shows data for semiconductor devices provided with 621 light emitting structures as an example. In [Table 2], "Ap" represents an area of the second electrode 2160, and "At" represents the total area of the semiconductor device 2200.

TABLE 2

| Diameter of light emitting structure (μm) | 30 |
|---|---|
| Am (μm$^2$) | 440,000 |
| An (μm$^2$) | 790,000 |
| Am/An (%) | 55.7 |
| Ap (μm$^2$) | 1,460,000 |
| At (μm$^2$) | 1,690,000 |

Then, as shown in FIGS. 26a to 26c, a second insulating layer 2142 may be formed on the first electrode 2150.

FIGS. 26a to 26c are views showing an example in which the second insulating layer is formed in the method of manufacturing the semiconductor device according to the embodiment of the present invention.

FIG. 26a is a plan view showing a shape of the second insulating layer formed according to the method of manufacturing the semiconductor device of the embodiment, FIG. 26b is a sectional view taken along line A-A of the semiconductor device according to the embodiment shown in FIG. 26a, and FIG. 26c is a sectional view taken along line B-B of the semiconductor device according to the embodiment shown in FIG. 26a.

According to the embodiment, as shown in FIGS. 26a to 26c, the second insulating layer 2130 may be formed on the first electrode 2150 to expose the upper surfaces of the plurality of light emitting structures P11, P12, P21, P22, . . . . The second insulating layer 2142 may be formed on the side surfaces of the plurality of light emitting structures P11, P12, P21, P22, . . . .

The second insulating layer 2142 may be formed on the first conductivity type reflective layer 2113. The second insulating layer 2142 may be formed in a region between the plurality of light emitting structures P11, P12, P21, P22, . . . .

The second insulating layer 2142 may be provided as an insulating material. In addition, the second insulating layer 2142 may be formed of a DBR layer. According to the embodiment, since the second insulating layer 2142 is provided as a DBR layer, light generated in the plurality of light emitting structures P11, P12, P21, P22, . . . can be efficiently reflected and extracted downward. For example, the second insulating layer 2142 may be provided as a DBR layer formed by stacking $SiO_2$ and $TiO_2$ as a plurality of layers. In addition, the second insulating layer 2142 may be provided as a DBR layer formed by stacking $Ta_2O_3$ and $SiO_2$ as a plurality of layers. In addition, the second insulating layer 2142 may be provided as a DBR layer formed by stacking $SiO_2$ and $Si_3N_4$ as a plurality of layers.

In addition, the second insulating layer 2142 may comprise a spin on glass (SOG) layer. When the second insulating layer 2142 comprises an SOG layer, it is possible to solve a problem caused by a step in the peripheral region of the light emitting structure of the semiconductor device 2200.

Next, as shown in FIGS. 27a to 27c, a second electrode 2160 may be formed on the second insulating layer 2142.

FIGS. 27a to 27c are views showing an example in which the second electrode is formed in the method of manufacturing the semiconductor device according to the embodiment of the present invention. FIG. 27a is a plan view showing a shape of the second electrode formed according to the method of manufacturing the semiconductor device according to the embodiment, FIG. 27b is a sectional view taken along line A-A of the semiconductor device according to the embodiment shown in FIG. 27a, and FIG. 27c is a sectional view taken along line B-B of the semiconductor device according to the embodiment shown in FIG. 27a.

According to the embodiment, as shown in FIGS. 27a to 27c, the second electrode 2160 comprising an upper electrode 2160a and a connection electrode 2160b may be formed on the second insulating layer 2142. The upper electrode 2160a may be formed on the upper surface of the plurality of light emitting structures P11, P12, P21, P22, . . . exposed by the second insulating layer 2142. The connection electrode 2160b may connect the upper electrode 2160a.

The upper electrode 2160a may be formed on the upper surface of the second conductivity type reflective layer constituting the plurality of light emitting structures P11, P12, P21, P22, . . . . The connection electrode 2160b may electrically and physically connect the upper electrodes 2160a disposed on the plurality of light emitting structures P11, P12, P21, P22, . . . to each other. The connection electrode 2160b may be formed in a region between the plurality of light emitting structures P11, P12, P21, P22, . . . .

The second electrode 2160 may be electrically connected to the second reflective layer 2120a of the first light emitting structure P11. The second electrode 2160 may comprise an upper electrode 2160a and a connection electrode 2160b.

The upper electrode 2160a may be disposed in contact with the upper surface of the upper reflective layer of the first light emitting structure P11. The connection electrode 2160b may be disposed on a side surface and a periphery of the first light emitting structure P11, and may be electrically connected to the upper electrode 2160a.

The second electrode 2160 may provide a third opening h3 exposing the first electrode 2150 disposed around the first active layer 2115a of the first light emitting structure P11. The upper surface of the first electrode 2150 may be exposed through the third opening h3.

The second electrode 2160 may be disposed on a side surface of the first light emitting structure P11. The second electrode 2160 may be disposed on the upper surface of the first light emitting structure P11. The upper electrode 2160a of the second electrode 2160 may be disposed on the second reflective layer 2120a of the first light emitting structure P11. The upper electrode 2160a of the second electrode 2160 may be disposed in direct contact with the upper surface of the second reflective layer 2120a.

In addition, the second electrode 2160 may be electrically connected with the fourth reflective layer 2120b of the second light emitting structure P21. The second electrode 2160 may comprise an upper electrode 2160a and a connection electrode 2160b.

The upper electrode 2160a may be disposed in contact with the upper surface of the upper reflective layer of the second light emitting structure P21. The connection electrode 2160b may be disposed on a side surface and a periphery of the second light emitting structure P21, and may be electrically connected with the upper electrode 2160a.

The second electrode 2160 may be disposed on a side surface of the second light emitting structure P21. The second electrode 2160 may be disposed on the upper surface of the second light emitting structure P21. The upper electrode 2160a of the second electrode 2160 may be disposed on the fourth reflective layer 2120b of the second light emitting structure P21. The upper electrode 2160a of the second electrode 2160 may be disposed in direct contact with the upper surface of the fourth reflective layer 2120b.

Then, as shown in FIGS. 28a to 28c, a third insulating layer 2143 may be formed on the second electrode 2160.

FIGS. 28a to 28c are views showing an example in which the third insulating layer is formed in the method of manufacturing the semiconductor device according to the embodiment of the present invention. FIG. 28a is a plan view showing a shape of the third insulating layer formed according to the method of manufacturing the semiconductor device according to the embodiment, FIG. 28b is a sectional view taken along line A-A of the semiconductor device according to the embodiment shown in FIG. 28a, and FIG. 28c is a sectional view taken along line B-B of the semiconductor device according to the embodiment shown in FIG. 28a.

According to the embodiment, as shown in FIGS. 28a and 28b, the third insulating layer 2143 exposing the first electrode 2150 disposed between the first plurality of light emitting structures P11, P12, . . . may be formed. The third insulating layer 2143 may comprise a plurality of fourth openings h4 exposing the first electrode 2150. For example, the fourth opening h4 may be provided in a region where the third opening h3 is formed.

In addition, according to the embodiment, as shown in FIGS. 28a and 28c, the third insulating layer 2143 exposing the second electrode 2160 disposed between the second plurality of light emitting structures P21, P22, . . . may be formed. The third insulating layer 2143 may comprise a plurality of fifth openings h5 exposing the second electrode 2160. The third insulating layer 2143 may provide the fifth opening h5 exposing an upper surface of the connection electrode 2160b of the second electrode 2160.

The third insulating layer 2143 may be provided as an insulating material. In addition, the third insulating layer 2143 may be formed of a DBR layer. According to the embodiment, since the third insulating layer 2143 is provided as a DBR layer, light generated in the plurality of light emitting structures P11, P12, P21, P22, . . . can be efficiently reflected and extracted in a downward direction. For example, the third insulating layer 2143 may be provided as a DBR layer formed by stacking $SiO_2$ and $TiO_2$ as a plurality of layers. In addition, the third insulating layer 2143 may be provided as a DBR layer formed by stacking $Ta_2O_3$ and $SiO_2$ as a plurality of layers. The third insulating layer 2143 may be provided as a DBR layer formed by stacking $SiO_2$ and $Si_3N_4$ as a plurality of layers.

In addition, the third insulating layer 2143 may comprise a spin on glass (SOG) layer. If the third insulating layer 2143 comprises an SOG layer, it is possible to solve a problem caused by a step in the peripheral region of the light emitting structure of the semiconductor device 2200.

Then, as shown in FIGS. 29a to 29c, a first bonding pad 2155 and a second bonding pad 2165 may be formed on the third insulating layer 2143.

FIGS. 29a to 29c are views showing an example in which the first bonding pad and the second bonding pad are formed in the method of manufacturing the semiconductor device according to the embodiment of the present invention. FIG. 29a is a plan view showing a shape of the first bonding pad and the second bonding pad formed according to the method of manufacturing the semiconductor device according to the embodiment, FIG. 29b is a sectional view taken along line A-A of the semiconductor device according to the embodiment shown in FIG. 29a, and FIG. 29c is a sectional view taken along line B-B of the semiconductor device according to the embodiment shown in FIG. 29a.

According to the embodiment, as shown in FIGS. 14a to 14c, the first bonding pad 2155 and the second bonding pad 2165 may be formed on the third insulating layer 2143 to be spaced apart from each other.

The first bonding pad 2155 may be disposed on the plurality of fourth openings h4 and may be electrically connected to the first electrode 2150. For example, a lower surface of the first bonding pad 2155 may be disposed in direct contact with an upper surface of the first electrode 2150 through the fourth opening h4.

The second bonding pad 2165 may be disposed on the plurality of fifth openings h5 and may be electrically connected to the second electrode 2160. For example, a lower surface of the second bonding pad 2165 may be disposed in direct contact with an upper surface of the second electrode 2160 through the fifth opening h5.

For example, the first bonding pad 2155 and the second bonding pad 2165 may be formed of selected material from a group including Ag, Ni, Al, Rh, Pd, Ir, Ru, Mg, Zn, Pt, Au, Hf, Ti, W, Cr, Cu, and those alloys including two or more materials above. The semiconductor device according to the embodiment described above can be attached to the submount and supplied in the form of a semiconductor device package. FIG. 30 is a view showing a semiconductor device package according to an embodiment of the present invention. In describing the semiconductor device package according to the embodiment with reference to FIG. 30, description related to the semiconductor device described above may be omitted.

The semiconductor device package 3400 according to the embodiment may comprise a submount 3300 and a semiconductor device 3200 disposed on the submount 3300 as shown in FIG. 30.

The semiconductor device 3200 may comprise a first bonding pad 3155 and a second bonding pad 3165. The first bonding pad 3155 and the second bonding pad 3165 may be disposed on a first surface S1 of the semiconductor device 3200. In addition, the semiconductor device 3200 may comprise a second surface S2 disposed in a direction opposite to the first surface S1.

According to the embodiment, the semiconductor device 3200 may be disposed on the submount 3300 through the first bonding pad 3155 and the second bonding pad 3165.

The first bonding pad 3155 and the second bonding pad 3165 may be electrically connected to the submount 3300. The submount 3300 may comprise a circuit board that provides power to the semiconductor device 3200.

The semiconductor device 3200 according to the embodiment may emit generated light through the second surface S2 as described above. The semiconductor device 3200 may provide a beam to the outside through the second surface S2, which is an opposite surface of the first surface Si on which the first bonding pad 3155 and the second bonding pad 3165 are formed.

According to the semiconductor device package 3400 of the embodiment, power can be supplied to the semiconductor device 3200 through the submount 3300. In addition, the semiconductor device package 3400 can effectively dissipate the heat generated in the semiconductor device 3200 through the submount 3300.

According to the embodiment, the submount 3300 may comprise a circuit electrically connected with the semiconductor device 3200. For example, the submount 3300 may be formed based on a material such as silicon (Si) or aluminum nitride (AlN).

Meanwhile, the semiconductor device and the semiconductor device package described above can be applied to object detection, three-dimensional motion recognition, and IR illumination. Also, the semiconductor device and the semiconductor device package described above can be applied to the fields of Light Detection and Ranging (LiDAR), Blind Spot Detection (BSD), and Advanced Driver Assistance System (ADAS) for autonomous driving. In addition, the semiconductor device and the semiconductor device package described above can also be applied to the Human Machine Interface (HMI) field.

The semiconductor device and the semiconductor device package according to the embodiments can be applied to a proximity sensor, an autofocus device, and the like as an example of an object detection apparatus. For example, the object detecting apparatus according to the embodiment may comprise a light emitting unit that emits light and a light receiving unit that receives light. The semiconductor device package described with reference to FIG. 15 can be applied as an example of the light emitting unit. A photodiode may be applied as an example of the light receiving unit. The light receiving unit may receive light reflected from an object by the light emitted from the light emitting unit.

In addition, the autofocus device can be variously applied to a mobile terminal, a camera, a vehicle sensor, an optical communication device, and the like. The autofocus device can be applied to various fields for multi position detection for detecting the position of a subject.

FIG. 31 is a perspective view of a mobile terminal to which an autofocus device comprising the semiconductor device package according to the embodiment of the present invention is applied.

As shown in FIG. 31, the mobile terminal 4500 of the embodiment may comprise a camera module 4520, a flash module 4530, and an autofocus device 4510 provided on the rear side. Here, the autofocus device 4510 may comprise the semiconductor device package according to the embodiment described with reference to FIG. 30 as a light emitting unit.

The flash module 4530 may comprise a light emitting device that emit light and is disposed inside. The flash module 4530 may be operated by the camera operation of the mobile terminal or the user's control. The camera module 4520 may comprise an image photographing function and an auto focus function. For example, the camera module 4520 may comprise an auto focus function using an image.

The autofocus device 4510 may comprise an autofocusing function using a laser. The autofocus device 4510 may be used mainly in a close, for example, 10 m or less, or dark environment where the auto focus function using the image of the camera module 4520 is degraded. The autofocus device 4510 may comprise a light emitting unit comprising a vertical cavity surface emitting laser (VCSEL) semiconductor device, and a light receiving unit such as a photodiode, that converts light energy into electrical energy.

The features, structures, effects and the like described in the above embodiments are included in at least one embodiment and are not limited to one embodiment only. Further, with respect to the features, structures, effects, and the like described in the embodiments, other embodiments may be carried out with combinations or modifications by those having ordinary skill in the art. Accordingly, the contents relevant to the combinations and modifications should be construed as being included in the scope of the embodiments.

Although preferable embodiments have been proposed and set forth in the aforementioned description, the present invention should not be construed as limited thereto. It will be apparent that various deformations and modifications not illustrated are available within the scope without departing from inherent features of the embodiment of the present invention by any one having ordinary skill in the art. For example, each component specifically shown in the embodiments may be carried out with the modifications. In addition, it is apparent that differences relevant to the modifications and deformations are included in the scope of the embodiments set in the accompanying claims of the present invention.

INDUSTRIAL APPLICABILITY

According to the semiconductor device, the method of manufacturing the semiconductor device, the semiconductor device package, and the object detecting apparatus, there is an advantage that an excellent heat dissipation characteristic can be provided.

According to the semiconductor device, the method of manufacturing the semiconductor device, the semiconductor device package, and the object detecting apparatus, there is an advantage that the light extraction efficiency can be enhanced and light of high output can be provided.

According to the semiconductor device, the method of manufacturing the semiconductor device, the semiconductor device package, and the object detecting apparatus, there is an advantage that the power conversion efficiency can be improved.

According to the semiconductor device, the method of manufacturing the semiconductor device, the semiconductor device package, and the object detecting apparatus, there is an advantage that the manufacturing cost can be reduced and the reliability can be improved.

The invention claimed is:

1. A laser diode, comprising:
   a substrate;
   a first conductivity type reflective layer disposed on the substrate;
   a plurality of light emitting structures, each light emitting structure comprising an active layer and a second conductivity type reflective layer, which are disposed on the first conductivity type reflective layer;

a first electrode electrically connected with the first conductivity type reflective layer;
a second electrode electrically connected with the second conductivity type reflective layer;
a first insulating layer disposed on the first electrode;
a first bonding pad disposed on the plurality of light emitting structures and electrically connected with the first electrode; and
a second bonding pad disposed on the plurality of light emitting structures and spaced apart from the first bonding pad, and electrically connected with the second electrode,
wherein the substrate comprises a length in a first direction and a width in a second direction perpendicular to the first direction,
wherein the first bonding pad comprises a first side surface and a second side surface in the first direction,
wherein the first side surface of the first bonding pad is closer to a first side surface of the substrate in the first direction than the second side surface,
wherein the second bonding pad comprises a third side surface and a fourth side surface in the first direction,
wherein the third side surface of the second bonding pad is closer to the second side surface of the first bonding pad than the fourth side surface,
wherein the first insulating layer comprises a plurality of first openings overlapped with the first bonding pad and a plurality of second openings overlapped with the second bonding pad, in a third direction perpendicular to the first and second directions,
wherein the first openings of the first insulating layer are disposed spaced apart in the first direction, and comprise a first group disposed closer to the second side surface of the first bonding pad, and a second group spaced apart from the first group in the second direction,
wherein the second openings of the first insulating layer are disposed spaced apart in the first direction, and comprise a third group disposed closer to the third side surface of the second bonding pad, and a fourth group spaced apart from the third group in the second direction,
wherein the first group of the first openings and the third group of the second openings are disposed within 15% of the width in the second direction of the substrate with respect to a central axis parallel to the first direction of the substrate, and
wherein a minimum distance between the first openings or the second openings of the first insulating layer is greater than a minimum distance between the light emitting structures.

2. The laser diode according to claim 1, wherein the first electrode is disposed under the first bonding pad and under the second bonding pad, and provides a plurality of openings exposing the active layer and the second conductivity type reflective layer of the plurality of light emitting structures.

3. The laser diode according to claim 1, wherein the second electrode is disposed under the first bonding pad and under the second bonding pad, and provides a plurality of openings exposing the first electrode disposed around the active layer of the plurality of light emitting structures and under the first bonding pad.

4. The laser diode according to claim 1, wherein the second electrode is in contact with an upper surface of the second conductivity type reflective layer of the plurality of light emitting structures.

5. The laser diode according to claim 1, further comprising a second insulating layer disposed between the first electrode and the second electrode.

6. The laser diode according to claim 5, wherein the second insulating layer provides a plurality of first openings and a plurality of second openings disposed under the first bonding pad,
wherein the first bonding pad and the first electrode are electrically connected through the plurality of first openings provided in the second insulating layer, and
wherein the second conductivity type reflective layer of the plurality of light emitting structures and the second electrode are electrically connected through the plurality of second openings provided in the second insulating layer.

7. The laser diode according to claim 5, wherein the second insulating layer provides a plurality of openings disposed under the second bonding pad, and
wherein the second conductivity type reflective layer of the plurality of light emitting structures and the second electrode are electrically connected through the plurality of openings provided in the second insulating layer.

8. The laser diode according to claim 1, wherein the second electrode comprises an upper electrode disposed in contact with an upper surface of the second conductivity type reflective layer of the plurality of light emitting structures, and a connection electrode disposed on the first electrode between the plurality of the light emitting structures.

9. The laser diode according to claim 1, wherein the substrate is an intrinsic semiconductor substrate.

10. The laser diode according to claim 1, wherein a reflectance of the first conductivity type reflective layer is smaller than a reflectance of the second conductivity type reflective layer.

11. A semiconductor device package, comprising:
a submount; and
a semiconductor device disposed on the submount,
wherein the semiconductor device comprises:
a substrate;
a first conductivity type reflective layer disposed on the substrate;
a plurality of light emitting structures, each light emitting structure comprising an active layer and a second conductivity type reflective layer, which are disposed on the first conductivity type reflective layer;
a first electrode electrically connected with the first conductivity type reflective layer;
a second electrode electrically connected with the second conductivity type reflective layer;
a first insulating layer disposed on the first electrode;
a first bonding pad disposed on the plurality of light emitting structures and electrically connected with the first electrode; and
a second bonding pad disposed on the plurality of light emitting structures and spaced apart from the first bonding pad, and electrically connected with the second electrode,
wherein the substrate comprises a length in a first direction and a width in a second direction perpendicular to the first direction,
wherein the first bonding pad comprises a first side surface and a second side surface in the first direction,
wherein the first side surface of the first bonding pad is closer to a first side surface of the substrate in the first direction than the second side surface, wherein the second bonding pad comprises a third side surface and a fourth side surface in the first direction, wherein the third side surface of the second bonding pad is closer to the second side surface of the first bonding pad than the fourth side surface, wherein the first insulating layer comprises a plurality of first openings overlapped with the first bonding pad and a plurality of second openings overlapped with the second bonding pad, in a third direction perpendicular to the first and second directions, wherein the first openings of the first insulating layer are disposed spaced apart in the first direction, and comprise a first group disposed closer to the second side surface of the first bonding pad, and a second group spaced apart from the first group in the second direction, wherein the second openings of the first insulating layer are disposed spaced apart in the first direction, and comprise a third group disposed closer to the third side surface of the second bonding pad, and a fourth group spaced apart from the third group in the second direction, wherein the first group of the first openings and the third group of the second openings are disposed within 15% of the width in the second direction of the substrate with respect to a central axis parallel to the first direction of the substrate, and wherein a minimum distance between the first openings or the second openings of the first insulating layer is greater than a minimum distance between the light emitting structures.

12. The semiconductor device package according to claim 11, wherein the first electrode is disposed under the first bonding pad and under the second bonding pad, and provides a plurality of openings exposing the active layer and the second conductivity type reflective layer of the plurality of light emitting structures.

13. The semiconductor device package according to claim 11, wherein the second electrode is disposed under the first bonding pad and under the second bonding pad, and provides a plurality of openings exposing the first electrode disposed around the active layer of the plurality of light emitting structures and under the first bonding pad.

14. The semiconductor device package according to claim 11, wherein the second electrode is in contact with an upper surface of the second conductivity type reflective layer of the plurality of light emitting structures.

15. The semiconductor device package according to claim 11, further comprising a second insulating layer disposed between the first electrode and the second electrode.

16. The semiconductor device package according to claim 15, wherein the second insulating layer provides a plurality of first openings and a plurality of second openings disposed under the first bonding pad, wherein the first bonding pad and the first electrode are electrically connected through the plurality of first openings provided in the second insulating layer, and wherein the second conductivity type reflective layer of the plurality of light emitting structures and the second electrode are electrically connected through the plurality of second openings provided in the second insulating layer.

17. The semiconductor device package according to claim 15, wherein the second insulating layer provides a plurality of openings disposed under the second bonding pad, and wherein the second conductivity type reflective layer of the plurality of light emitting structures and the second electrode are electrically connected through the plurality of openings provided in the second insulating layer.

18. The semiconductor device package according to claim 11, wherein the second electrode comprises an upper electrode disposed in contact with an upper surface of the second conductivity type reflective layer of the plurality of light emitting structures, and a connection electrode disposed on the first electrode between the plurality of the light emitting structures.

19. The semiconductor device package according to claim 11, wherein the substrate is an intrinsic semiconductor substrate.

20. The semiconductor device package according to claim 11, wherein a reflectance of the first conductivity type reflective layer is smaller than a reflectance of the second conductivity type reflective layer.

* * * * *